(12) United States Patent
Jang et al.

(10) Patent No.: US 12,550,789 B2
(45) Date of Patent: *Feb. 10, 2026

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: Youngin Jang, Paju-si (KR); KyungMin Kim, Paju-si (KR); HyunDong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 133 days.

This patent is subject to a terminal disclaimer.

(21) Appl. No.: 18/123,791

(22) Filed: Mar. 20, 2023

(65) Prior Publication Data

US 2023/0232682 A1 Jul. 20, 2023

Related U.S. Application Data

(63) Continuation of application No. 17/138,357, filed on Dec. 30, 2020, now Pat. No. 11,637,169.

(30) Foreign Application Priority Data

Dec. 31, 2019 (KR) .......................... 10-2019-0180142

(51) Int. Cl.
*H10K 59/131* (2023.01)
*H01L 25/065* (2023.01)
(Continued)

(52) U.S. Cl.
CPC ........ *H01L 25/167* (2013.01); *H01L 25/0655* (2013.01); *H10K 59/122* (2023.02);
(Continued)

(58) Field of Classification Search
CPC ...... H01L 27/1214–1206; H10K 59/18; H10K 59/00–95
See application file for complete search history.

(56) References Cited

U.S. PATENT DOCUMENTS 11,637,169 B2 * 4/2023 Jang ..................... H10K 59/131
257/88
2008/0218062 A1 9/2008 Kim
(Continued)

FOREIGN PATENT DOCUMENTS

CN 109461386 A 3/2019
EP 3 343 273 A2 7/2018
(Continued)

*Primary Examiner* — Bryan R Junge
(74) *Attorney, Agent, or Firm* — Birch, Stewart, Kolasch & Birch, LLP

(57) ABSTRACT

A light emitting display apparatus can include a substrate including a display portion; a plurality of pixels disposed in the display portion; a common electrode disposed in the display portion and electrically connected to each of the plurality of pixels; and a pixel common voltage line disposed in the display portion and electrically connected to the common electrode. Also, the light emitting display apparatus can further include at least one closed loop line disposed at an edge portion of the substrate to surround the display portion; at least one cliff pattern portion overlapping with the at least one closed loop line, and a light emitting device layer including a self-light emitting device, disposed on the display portion and the at least one cliff pattern portion, in which the self-light emitting device is isolated by the at least one cliff pattern portion.

23 Claims, 13 Drawing Sheets

(51) Int. Cl.
  *H01L 25/16* (2023.01)
  *H10K 59/122* (2023.01)
  *H10K 59/18* (2023.01)
  *H10K 59/80* (2023.01)
  *H10K 77/10* (2023.01)
  *H10K 102/00* (2023.01)

(52) U.S. Cl.
  CPC ........... *H10K 59/131* (2023.02); *H10K 59/18* (2023.02); *H10K 59/1315* (2023.02); *H10K 59/8731* (2023.02); *H10K 77/111* (2023.02); *H10K 2102/311* (2023.02)

(56) References Cited

U.S. PATENT DOCUMENTS

| | | |
|---|---|---|
| 2009/0128017 A1 | 5/2009 | Sagawa et al. |
| 2010/0109994 A1 | 5/2010 | Lee et al. |
| 2011/0234957 A1 | 9/2011 | Watanabe et al. |
| 2014/0176409 A1 | 6/2014 | Kim et al. |
| 2014/0184964 A1 | 7/2014 | Byeon et al. |
| 2014/0217397 A1 | 8/2014 | Kwak et al. |
| 2014/0264315 A1 | 9/2014 | Ono et al. |
| 2014/0300849 A1 | 10/2014 | Jung et al. |
| 2015/0108438 A1 | 4/2015 | Kim |
| 2016/0126287 A1 | 5/2016 | Her et al. |
| 2016/0372534 A1 | 12/2016 | Lee |
| 2017/0317114 A1 | 11/2017 | Noh et al. |
| 2018/0151660 A1 | 5/2018 | Kim et al. |
| 2018/0188579 A1 | 7/2018 | Jeong et al. |
| 2018/0190747 A1 | 7/2018 | Son et al. |
| 2019/0036063 A1 | 1/2019 | Lee et al. |
| 2019/0179466 A1 | 6/2019 | Kim et al. |
| 2019/0245015 A1* | 8/2019 | Lee .................. H10K 71/00 |
| 2020/0225793 A1 | 7/2020 | Huang et al. |
| 2020/0321292 A1 | 10/2020 | Park et al. |
| 2021/0366378 A1 | 11/2021 | Zhao et al. |
| 2022/0028955 A1 | 1/2022 | Yoon et al. |

FOREIGN PATENT DOCUMENTS

| | | |
|---|---|---|
| GB | 2464803 A | 5/2010 |
| JP | 60-70875 U | 5/1985 |
| JP | 2009-301013 A | 12/2009 |
| JP | 2014-130321 A | 7/2014 |
| JP | 2019-140097 A | 8/2019 |
| KR | 10-2007-00160880 A | 2/2007 |
| KR | 10-2013-0030598 A | 3/2013 |
| KR | 10-2013-0060476 A | 6/2013 |
| KR | 10-2016-0093179 A | 8/2016 |
| KR | 10-2017-0054654 A | 5/2017 |
| KR | 10-2018-0002099 A | 1/2018 |
| WO | WO 2019/167966 A1 | 9/2019 |

* cited by examiner

LIGHT EMITTING DISPLAY APPARATUS AND MULTI-SCREEN DISPLAY APPARATUS INCLUDING THE SAME

CROSS-REFERENCE TO RELATED APPLICATIONS

This application is a Continuation Application of U.S. patent application Ser. No. 17/138,357, filed on Dec. 30, 2020, which claims priority under 35 U.S.C. § 119(a) to Korean Patent Application No. 10-2019-0180142 filed on Dec. 31, 2019, the entire contents of all these applications are hereby expressly incorporated by reference as if fully set forth herein into the present application.

BACKGROUND

Field of the Invention

The present disclosure relates to a light emitting display apparatus and a multi-screen display apparatus including the same.

Discussion of the Related Art

Light emitting display apparatuses which are self-emitting display apparatuses, do not need a separate light source unlike liquid crystal display (LCD) apparatuses, and thus, they can be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation display apparatuses.

Light emitting display apparatuses display an image on the basis of the light emission of a light emitting device layer including a light emitting device disposed between two electrodes. In this case, light emitted by the light emitting device is discharged to the outside through an electrode and a substrate.

Light emitting display apparatuses include a display panel implemented to display an image. The display panel can include a display area, including a plurality of pixels for displaying an image, and a bezel area surrounding the display area.

A light emitting display apparatus of the related art needs a bezel (or a mechanism) for covering a bezel area disposed at a border (or an edge portion) of a display panel and can increase in bezel width due to a width of the bezel. Also, when the bezel width of the light emitting display apparatus is reduced to a limit, a light emitting device can be degraded by penetration of water, and due to this, the reliability of the light emitting device can be reduced.

Recently, multi-screen display apparatuses have been commercialized where a large screen is implemented by arranging the light emitting display apparatuses as a lattice type.

However, in a multi-screen display apparatus of the related art, a boundary portion such as a seam is formed between adjacent display apparatuses due to a bezel area or a bezel of each of a plurality of display apparatuses. The boundary portion can cause a sense of discontinuity (or discontinuity) of an image when one image is being displayed on a total screen of the multi-screen display apparatus, and due to this, the immersion of a viewer watching the image can be reduced.

SUMMARY OF THE DISCLOSURE

Accordingly, the present disclosure is directed to providing a light emitting display apparatus and a multi-screen display apparatus including the same that substantially obviate one or more problems due to limitations and disadvantages of the related art.

An aspect of the present disclosure is directed to providing a light emitting display apparatus, which has a thin bezel width and prevents the reliability of a light emitting device from being reduced by penetration of water, and a multi-screen display apparatus including the light emitting display apparatus.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a substrate including a display portion, a plurality of pixels disposed in the display portion, a common electrode disposed in the display portion and electrically connected to each of the plurality of pixels, a pixel common voltage line disposed in the display portion and electrically connected to the common electrode, a pad part disposed at one edge portion of the substrate, the pad part including a pixel common voltage pad connected to the pixel common voltage line, and at least one closed loop line disposed at an edge portion of the substrate to surround the display portion, wherein the at least one closed loop line is electrically connected to the pixel common voltage pad.

In another aspect of the present disclosure, there is provided a multi-screen display apparatus including a plurality of display modules arranged in at least one direction of a first direction and a second direction intersecting with the first direction, wherein each of the plurality of display modules includes a substrate including a display portion, a plurality of pixels disposed in the display portion, a common electrode disposed in the display portion and electrically connected to each of the plurality of pixels, a pixel common voltage line disposed in the display portion and electrically connected to the common electrode, a pad part disposed at one edge portion of the substrate, the pad part including a pixel common voltage pad connected to the pixel common voltage line, and at least one closed loop line disposed at an edge portion of the substrate to surround the display portion, wherein the at least one closed loop line is electrically connected to the pixel common voltage pad.

According to some embodiments of the present disclosure, a light emitting display apparatus, which has a thin bezel width and prevents the reliability of a light emitting device from being reduced by penetration of water, and a multi-screen display apparatus including the light emitting display apparatus can be provided.

According to some embodiments of the present disclosure, a display apparatus including no bezel and a multi-screen display apparatus including the display apparatus can be provided.

According to some embodiments of the present disclosure, a multi-screen display apparatus for displaying an image without a sense of discontinuity can be provided.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
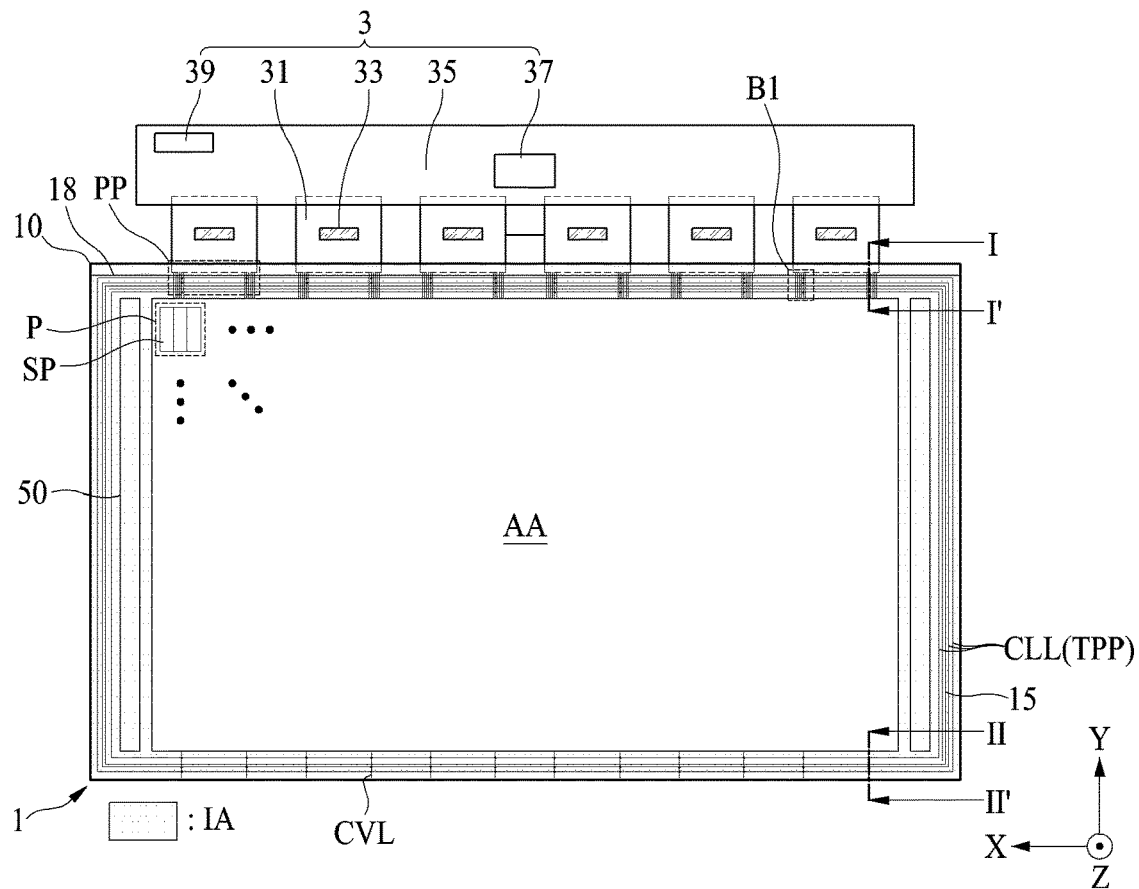
FIG. 1 is a diagram illustrating a light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure w % ill be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or may be brief. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first". "second", etc. can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing the elements of the present disclosure, terms such as first, second, A. B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

Figure 2:
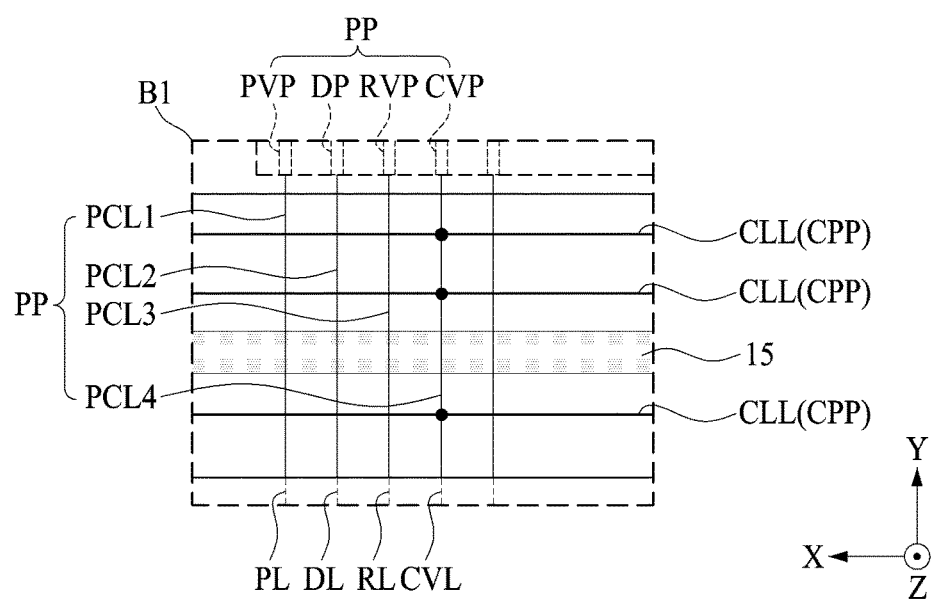
FIG. 2 is an enlarged view of a region 'B1' illustrated in FIG. 1.

FIG. 1 is a diagram illustrating a light emitting display apparatus according to an embodiment of the present disclosure, and FIG. 2 is an enlarged view of a region 'B1' illustrated in FIG. 1. All the components of the light emitting display apparatus according to all embodiments of the present disclosure are operatively coupled and configured.

Referring to FIGS. 1 and 2, the light emitting display apparatus according to the embodiment of the present disclosure can include a light emitting display panel 1 and a driving circuit unit 3.

The light emitting display panel 1 can include a substrate 10, a display portion AA, a plurality of pixels P, a common electrode CE (see FIG. 3), a plurality of gate lines GL (see FIG. 3), a plurality of data lines DL, a plurality of pixel driving power lines PL, a plurality of pixel common voltage lines CVL, a plurality of reference voltage lines RL, a plurality of pad parts PP, and at least one closed loop line CLL.

The substrate 10 can be a glass substrate, or can be a thin glass substrate or a plastic substrate which is bendable or flexible. The substrate 10 can include the display portion AA and a non-display portion IA surrounding the display portion AA.

The display portion AA can be an area for displaying an image and can be referred to as a display area, an active area, or an active portion. For example, the display portion AA can be disposed at a portion, other than an edge portion, of the substrate 10.

The non-display portion IA can be an area which does not display an image and can be referred to as a non-display area, an inactive area, or an inactive portion. For example, the non-display portion IA can be disposed at the edge portion of the substrate 10.

Each of the plurality of pixels P can be individually disposed in a plurality of pixel areas defined in the display portion AA. The plurality of pixel areas can be defined by a plurality of pixel driving lines GL, DL, PL, RL, and CVL (for example, a plurality of gate lines GL and a plurality of data lines DL) disposed in the display portion AA.

Each of the plurality of pixels P can be disposed in a corresponding pixel area of the substrate 10 and can display a color image corresponding to a data voltage supplied through an adjacent data line DL on the basis of a gate signal supplied through an adjacent gate line GL.

Each of the plurality of pixels P can include a plurality of subpixels SP adjacent to one another. A subpixel SP can be defined as a minimum-unit area which actually emits light. For example, three adjacent subpixels can configure one pixel P or a unit pixel P for displaying a color image.

The pixel P according to an embodiment can include first to third subpixels SP which are arranged adjacent to one another in a first direction X. In this case, the first subpixel can be a red subpixel, the second subpixel can be a green subpixel, and the third subpixel can be a blue subpixel. However, the present disclosure is not limited thereto.

According to another embodiment, the pixel P can include first to fourth subpixels SP which are arranged adjacent to one another in at least one direction of the first direction X and a second direction Y. In this case, the first subpixel can be a red subpixel, the second subpixel can be a white subpixel, the third subpixel can be a blue subpixel, and the fourth subpixel can be a green subpixel. However, the present disclosure is not limited thereto.

According to an embodiment, a plurality of light emitting device layers respectively disposed in the first to fourth subpixels SP can individually emit different lights, or can emit white light in common.

In a case where each of the first to fourth subpixels SP emits white light in common, each of the first, third, and fourth subpixels SP can include a color filter (or a wavelength conversion member) which converts white light into other color light. In this case, the second subpixel according to an embodiment may not include a color filter. According to another embodiment, at least one region of the second subpixel can include the same color filter as a color filter of one of the first, third, and fourth subpixels.

Each of the plurality of subpixels SP can include a light emitting device layer, including a self-light emitting device (or a self-light emitting element), and a pixel circuit which controls a current flowing in the self-light emitting device. For example, the pixel circuit can include a driving thin film transistor (TFT) which is implemented to transfer a data current, corresponding to a data voltage supplied through a corresponding data line DL, to the self-light emitting device.

Each of the plurality of gate lines GL can be disposed in the display portion AA of the substrate 10. For example, the plurality of gate lines GL can be apart from one another in the second direction Y transverse to the first direction X to long extend in the first direction X. Each of the plurality of gate lines GL according to an embodiment can include first and second gate lines GLa and GLb which are disposed in parallel in the first direction X.

The plurality of data lines DL can be disposed in the display portion AA of the substrate 10 to intersect with the plurality of gate lines GL. For example, the plurality of data lines DL can be apart from one another in the first direction X to long extend in the second direction Y.

The plurality of pixel driving power lines PL can be disposed in the display portion AA of the substrate 10 in parallel with the plurality of data lines DL.

The common electrode CE can be disposed in the display portion AA of the substrate 10 and can be electrically connected to the plurality of pixels P. For example, the common electrode CE can be connected to the plurality of subpixels SP in common.

The plurality of pixel common voltage lines CVL can be disposed in the display portion AA of the substrate 10 in parallel with the plurality of data lines DL. The plurality of pixel common voltage lines CVL can be electrically connected to the common electrode CE in the display portion AA. One side of each of the plurality of pixel common voltage lines CVL can be electrically connected to the pad part PP. The other side of each of the plurality of pixel common voltage lines CVL can be disposed at the other edge portion of the substrate 10 parallel to one edge portion of the substrate 10 with the display portion AA therebetween.

The plurality of reference voltage lines RL can be disposed in the display portion AA of the substrate 10 in parallel with the plurality of data lines DL. For example, each of the plurality of reference voltage lines RL can be disposed in a corresponding pixel P of the plurality of pixels P arranged in the first direction X. and in this case, one reference voltage line RL can be connected to a plurality of subpixels SP configuring a pixel P in common. Optionally, each of the plurality of reference voltage lines RL can be omitted based on a driving (or operation) manner of the pixel P.

Each of the plurality of pad parts PP can be disposed at one edge portion of the substrate 10 in the first direction X.

Each of the plurality of pad parts PP can include a plurality of pixel driving voltage pads PVP electrically connected to one side of each of the plurality of pixel driving power lines PL, a plurality of data pads DP electrically connected to one side of each of the plurality of data lines DL, a plurality of reference voltage pads RVP electrically connected to one side of each of the plurality of reference voltage lines RL, and a plurality of pixel common voltage pads CVP electrically connected to one side of each of the plurality of pixel common voltage lines CVL.

Each of the plurality of pad parts PP can include a plurality of first pad connection lines PCL1 electrically connected between one side of each of the plurality of pixel driving voltage pads PVP and one side of each of the plurality of pixel driving power lines PL, a plurality of second pad connection lines PCL2 electrically connected between one side of each of the plurality of data pads DP and one side of each of the plurality of data lines DL, a plurality of third pad connection lines PCL3 electrically connected between one side of each of the plurality of reference voltage pads RVP and one side of each of the plurality of reference voltage lines RL, and a plurality of fourth pad connection lines PCL4 electrically connected between one side of each of the plurality of pixel common voltage pads CVP and one side of each of the plurality of pixel common voltage lines CVL. Here, the pad connection lines PCL1 to PCL4 can be referred to as a pad link line.

Each of a first pad part and a last pad part among the plurality of pad parts PP can further include a plurality of gate pads and a plurality of fifth pad connection lines which are respectively and electrically connected to the plurality of gate pads.

The at least one closed loop line CLL can be disposed at an edge portion of the substrate 10 to surround the display portion AA and can be electrically connected to at least one of the plurality of pixel common voltage pads CVP. For example, the at least one closed loop line CLL can be disposed in the non-display portion IA of the substrate 10 to have a closed loop surrounding the display portion AA.

The at least one closed loop line CLL according to an embodiment can be disposed to interest with the pad connection lines PCL1 to PCL4 and can be electrically connected to at least one of the plurality of fourth pad connection lines PCL4 in the pad part PP. The at least one closed loop line CLL can be electrically connected to the pixel common voltage pad CVP, and thus, can be maintained to have the same electric potential as that of each of the plurality of pixel common voltage lines CVL. Accordingly, the at least one closed loop line CLL can discharge static electricity, flowing in from the outside, to the pixel common voltage pad CVP and/or the pixel common voltage line CVL, and thus, can prevent a defect caused by the static electricity.

The at least one closed loop line CLL according to an embodiment can be disposed to intersect with the other side of each of the plurality of pixel common voltage lines CVL disposed at the other edge portion of the substrate 10 and can be electrically connected to at least one of the other sides of the plurality of pixel common voltage lines CVL at the other edge portion of the substrate 10. In this case, one side and the other side of each of the plurality of pixel common voltage lines CVL can be electrically connected to the at least one closed loop line CLL, and thus, a pixel common voltage supplied to the common electrode CE through the plurality of pixel common voltage lines CVL can be more uniformly supplied to each of the plurality of pixels P disposed in the display portion AA.

The light emitting display panel 1 can further include a dam pattern 15 which is disposed at an edge portion of the substrate 10 to surround the display portion AA.

The dam pattern 15 can be disposed along the edge portion of the substrate 10 to have a closed loop shape (or a closed loop line shape) surrounding the display portion AA. The dam pattern 15 can prevent the spread or overflow of an encapsulation layer which is disposed on the substrate 10 to cover the display portion AA.

The dam pattern 15 can be implemented on the substrate 10 to surround the at least one closed loop line CLL or to be surrounded by the at least one closed loop line CLL. For example, the at least one closed loop line CLL can be disposed in at least one region of an inner region and an outer region of the dam pattern 15.

The light emitting display panel 1 can further include at least one cliff pattern portion CPP disposed near the dam pattern 15.

The at least one cliff pattern portion CPP can be disposed near the dam pattern 15 to have a closed loop shape (or a closed loop line shape) surrounding the display portion AA.

The at least one cliff pattern portion CPP according to an embodiment can be disposed in at least one region of the inner region and the outer region of the dam pattern 15.

The cliff pattern portion CPP can include the closed loop line CLL. For example, each of the at least one cliff pattern portion CPP can overlap each of the at least one closed loop line CLL. For example, the closed loop line CLL can be disposed in the one cliff pattern portion CPP. The at least one cliff pattern portion CPP and the at least one closed loop line CLL can overlap each other, thereby preventing an increase in a bezel width caused by the at least one cliff pattern portion CPP or the at least one closed loop line CLL. The at least one cliff pattern portion CPP can isolate (or disconnect) a self-light emitting device of a light emitting device layer disposed in a portion of the non-display portion IA, and thus, can block a lateral water penetration path, thereby preventing lateral water penetration.

The light emitting display panel 1 according to an embodiment can further include a gate driving circuit 50.

The gate driving circuit 50 can supply gate signals to the gate lines on the basis of a gate control signal provided through the plurality of gate pads of the pad part PP from the driving circuit unit 3. The gate driving circuit 50 according to an embodiment can be directly implemented in the non-display area IA of the substrate 10 along with a TFT manufacturing process of implementing the subpixel SP. For example, the gate driving circuit 50 can be disposed in at least one of both non-display areas IA of the substrate 10 facing each other. According to another embodiment, the gate driving circuit 50 can be implemented as an IC, and in this case, the gate driving circuit 50 can be mounted on the substrate 10 and can be connected to the gate lines or can be mounted on the flexible circuit film and can be connected to the gate lines through a gate pad of the substrate 10.

The driving circuit unit 3 can be connected to the pad part PP disposed at one edge portion of the substrate 10 and can allow each subpixel SP to display an image corresponding to video data supplied from a display driving system.

The driving circuit unit 3 according to an embodiment can include a plurality of flexible circuit films 31, a plurality of data driving integrated circuits (ICs) 33, a printed circuit board (PCB) 35, a timing controller 37, and a power circuit unit 39.

Each of the plurality of flexible circuit films 31 can be attached on the PCB 35 and the pad part PP provided on the substrate 10. The flexible circuit film 31 according to an embodiment can be a tape carrier package (TCP) or a chip-on film (COF). For example, one edge portion (or an output bonding portion) of each of the plurality of flexible circuit films 31 can be attached on the pad part PP provided on the substrate 10 by a film attachment process using an anisotropic conductive film. The other edge portion (or an input bonding portion) of each of the plurality of flexible circuit films 31 can be attached on the PCB 35 by a film attachment process using an anisotropic conductive film.

Each of the plurality of data driving ICs 33 can be individually mounted on a corresponding flexible circuit film 31 of the plurality of flexible circuit films 31. Each of the plurality of data driving ICs 33 can receive pixel data and a data control signal provided from the timing controller 37, convert the pixel data into a pixel-based analog data voltage according to a data control signal, and supply the analog data voltage to a corresponding data line DL. For example, each of the plurality of data driving ICs 33 can generate a plurality of grayscale voltages by using a plurality of reference gamma voltages provided from the PCB 35 and can select, as a pixel-based data voltage, a grayscale voltage corresponding to pixel data from among the plurality of grayscale voltages to output the selected data voltage.

Additionally, each of the plurality of data driving ICs 33 can generate a pixel common voltage (or a cathode voltage) and a pixel driving voltage (or an anode voltage) needed for driving (or light emitting) of the subpixels SP by using the plurality of reference gamma voltages. For example, each of the plurality of data driving ICs 33 can select, as a pixel driving voltage and a pixel common voltage, a predetermined reference gamma voltage or a predetermined grayscale voltage from among the plurality of reference gamma voltages or the plurality of grayscale voltages to output the pixel driving voltage and the pixel common voltage.

Moreover, each of the plurality of data driving ICs 33 can additionally generate and output a reference voltage on the basis of a driving (or operating) method of each pixel P. For example, each of the plurality of data driving ICs 33 can select, as a reference voltage, a predetermined reference gamma voltage or a predetermined grayscale voltage from among the plurality of reference gamma voltages or the plurality of grayscale voltages to output the reference voltage. For example, the pixel driving voltage, the pixel common voltage, and the reference voltage can have different voltage levels.

Each of the plurality of data driving ICs 33 can sequentially sense a characteristic value of a driving TFT included in each of the subpixel SP through the plurality of reference voltage lines RL disposed on the substrate 10, generate sensing raw data corresponding to a sensing value, and provide the sensing raw data to the timing controller 37.

The PCB 35 can be connected to the other edge portion of each of the plurality of flexible circuit films 31. The PCB 35 can transfer a signal and a voltage between elements of the driving circuit unit 3.

The timing controller 37 can be mounted on the PCB 35 and can receive image data and a timing synchronization signal provided from the display driving system through a user connector disposed on the PCB 35. Alternatively, the timing controller 37 may not be mounted on the PCB 35 and can be provided in the display driving system or can be mounted on a separate control board connected between the PCB 35 and the display driving system.

The timing controller 37 can align the video data on the basis of the timing synchronization signal so as to match a pixel arrangement structure disposed in the display area AA and can provide the generated pixel data to each of the plurality of data driving ICs 33.

According to an embodiment, when the pixel P includes a white subpixel SP, the timing controller 37 can extract white pixel data on the basis of the digital video data (i.e., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to each of the data driving ICs 33. For example, the timing controller 37 can convert red, green, and blue input data into four-color (for example, red, green, blue, and white) data on the basis of a data conversion method disclosed in Korean Patent Publication No. 10-2013-0060476 or 10-2013-0030598, where all of these references are incorporated by reference into the present application.

The timing controller 37 can generate each of the data control signal and the gate control signal on the basis of the timing synchronization signal, control a driving timing of each of the data driving ICs 33 on the basis of the data control signal, and control a driving timing of the gate driving circuit 50 on the basis of the gate control signal. For example, the timing synchronization signal can include a vertical synchronization signal, a horizontal synchronization signal, a data enable signal, and a main clock (or a dot clock).

The data control signal according to an embodiment can include a source start pulse, a source shift clock, and a source output signal. The gate control signal according to an embodiment can include a start signal (or a gate start pulse) and a plurality of shift clocks.

The timing controller 37 can drive each of the data driving ICs 33 and the gate driving circuit 50 on the basis of an external sensing mode during a predetermined external sensing period, generate compensation data for compensating for a characteristic variation of the driving TFT of each subpixel SP on the basis of the sensing raw data provided from the data driving ICs 33, and modulate pixel data on the basis of the generated compensation data. For example, the timing controller 37 can drive each of the data driving ICs 33 and the gate driving circuit 50 on the basis of the external sensing mode for each external sensing period corresponding to a blank period (or a vertical blank period) of the vertical synchronization signal. For example, the external sensing mode can be performed in a process of powering on the display apparatus, a process of powering off the display apparatus, a process of powering off the display apparatus after being driven for a long time, or a blank period of a frame which is set in real time or periodically.

The timing controller 37 according to an embodiment can store the sensing raw data of each subpixel, provided from the data driving ICs 33, in a storage circuit on the basis of the external sensing mode. Also, in a display mode, the timing controller 37 can correct pixel data which is to be supplied to each subpixel, based on the sensing raw data stored in the storage circuit and can provide corrected pixel data to the data driving ICs 33. Here, sensing raw data of each subpixel can include sequential variation information about each of a driving TFT and a self-light emitting device, which are disposed in a corresponding subpixel. Therefore, in the external sensing mode, the timing controller 37 can sense a characteristic value (for example, a threshold voltage or mobility) of a driving TFT disposed in each subpixel SP and based thereon, can correct pixel data which is to be supplied to each subpixel SP, thereby minimizing or preventing the degradation in image quality caused by a characteristic value deviation of driving TFTs of a plurality of subpixels SP. The external sensing mode of a light emitting display apparatus can be technology known to those skilled in the art, and thus, its detailed description is omitted or may be brief. For example, the light emitting display apparatus according to the present disclosure can sense a characteristic value of the driving TFT disposed in each subpixel SP on the basis of a sensing mode disclosed in Korean Patent Publication No. 10-2016-0093179, 10-2017-0054654, or 10-2018-0002099, where all of these references are incorporated by reference into the present application.

The power circuit unit 39 can be mounted on the PCB 35 and can generate various source voltages needed for displaying an image on the pixels P by using an input power supplied from the outside to provide the generated source voltage to a corresponding circuit. For example, the power circuit unit 39 can generate and output a logic source voltage needed for driving of each of the timing controller 37 and the data driving ICs 33, the plurality of reference gamma voltages provided to the data driving ICs 33, and at least one gate driving voltages and at least one gate common voltages needed for driving of the gate driving circuit 50. The gate driving voltages and the gate common voltages can have different voltage levels.

Figure 3:
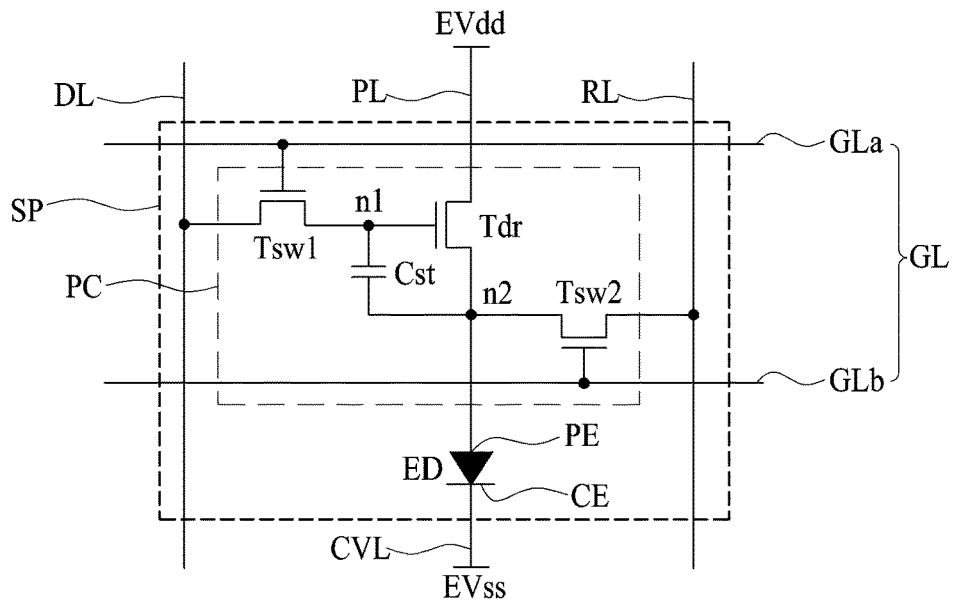
FIG. 3 is an equivalent circuit diagram illustrating an example of one subpixel illustrated in FIG. 1.

FIG. 3 is an equivalent circuit diagram illustrating an example of one subpixel illustrated in FIG. 1.

Referring to FIG. 3, each of a plurality of subpixels SP according to an embodiment of the present disclosure can emit light to display an image on the basis of a data current which corresponds to a difference voltage between a data voltage supplied through an adjacent data line DL and a reference voltage supplied through an adjacent reference voltage line RL, in response to a scan signal supplied through an adjacent gate line GL.

Each of the plurality of subpixels SP according to an embodiment can include a self-light emitting device ED and a pixel circuit PC.

The self-light emitting device (or self-emitting device) ED can be implemented between a common electrode (or a cathode electrode) CE and a pixel electrode (or an anode electrode) PE electrically connected to a pixel circuit PC. The self-light emitting device ED can emit light having luminance corresponding to a data current supplied from the pixel circuit PC on the basis of the data current.

The pixel circuit PC can provide the self-light emitting device ED with the data current which corresponds to the difference voltage between the data voltage supplied through the adjacent data line DL and the reference voltage supplied through the adjacent reference voltage line RL, in response to the scan signal supplied through the adjacent gate line GL.

The pixel circuit PC according to an embodiment can include a first switching TFT Tsw1, a second switching TFT Tsw2, a driving TFT Tdr, and a storage capacitor Cst. In the following description, a thin film transistor can be referred to as a TFT.

At least one of the first switching TFT Tsw1, the second switching TFT Tsw2, and the driving TFT Tdr can be an amorphous-silicon (a-Si) TFT, a polysilicon (poly-Si) TFT, an oxide TFT, or an organic TFT. For example, in the pixel circuit PC, some of the first switching TFT Tsw1, the second switching TFT Tsw2, and the driving TFT Tdr can be a TFT including a semiconductor layer (or an active layer) including low temperature poly-Si (LTPS) having a good response characteristic, and the other TFT of the first switching TFT Tsw1, the second switching TFT Tsw2, and the driving TFT Tdr can be a TFT including a semiconductor layer (or an active layer) including oxide having a good off-current characteristic.

The first switching TFT Tsw1 can include a gate electrode connected to a first gate line GLa of the gate line GL, a first source/drain electrode connected to the adjacent data line DL, and a second source/drain electrode connected to a gate node n1 of the driving TFT Tdr. The first switching TFT Tsw1 can transfer the data voltage, supplied through the adjacent data line DL, to the gate node n1 of the driving TFT Tdr on the basis of a first scan signal supplied to the first gate line GLa.

The second switching TFT Tsw2 can include a gate electrode connected to a second gate line GLb of the gate line GL, a first source/drain electrode connected to a source node n2 of the driving TFT Tdr, and a second source/drain electrode connected to the adjacent reference voltage line RL. The second switching TFT Tsw2 can transfer the reference voltage, supplied through the adjacent reference voltage line RL, to the source node n2 of the driving TFT Tdr on the basis of a second scan signal supplied to the second gate line GLb.

The storage capacitor Cst can be formed between the gate node n1 and the source node n2 of the driving TFT Tdr. The storage capacitor Cst according to an embodiment can include a first capacitor electrode connected to the gate node n1 of the driving TFT Tdr, a second capacitor electrode connected to the source node n2 of the driving TFT Tdr, and a dielectric layer formed in an overlap region between the first capacitor electrode and the second capacitor electrode. The storage capacitor Cst can be charged with a difference voltage between the gate node n1 and the source node n2 of the driving TFT Tdr, and then, can turn on or off the driving TFT Tdr on the basis of a charged voltage thereof.

The driving TFT Tdr can include a gate electrode (or a gate node n1) connected to the second source/drain electrode of the first switching TFT Tsw1 and the first capacitor electrode of the storage capacitor Cst in common, a first source/drain electrode (or a source node n2) connected to the first source/drain electrode of the second switching TFT Tsw2, the second capacitor electrode of the storage capacitor Cst, and a pixel electrode PE of the self-light emitting device ED in common, and a second source/drain electrode (or a drain node) connected to a pixel driving power line PL. The driving TFT Tdr can be turned on based on a voltage of the storage capacitor Cst and can control the amount of current flowing to the self-light emitting device ED through the pixel driving power line PL to which a pixel driving voltage EVdd is supplied. The common voltage (or cathode electrode) CE of the self-light emitting device ED is connected with a pixel common voltage EVss through the pixel common voltage line CVL.

Figure 4:
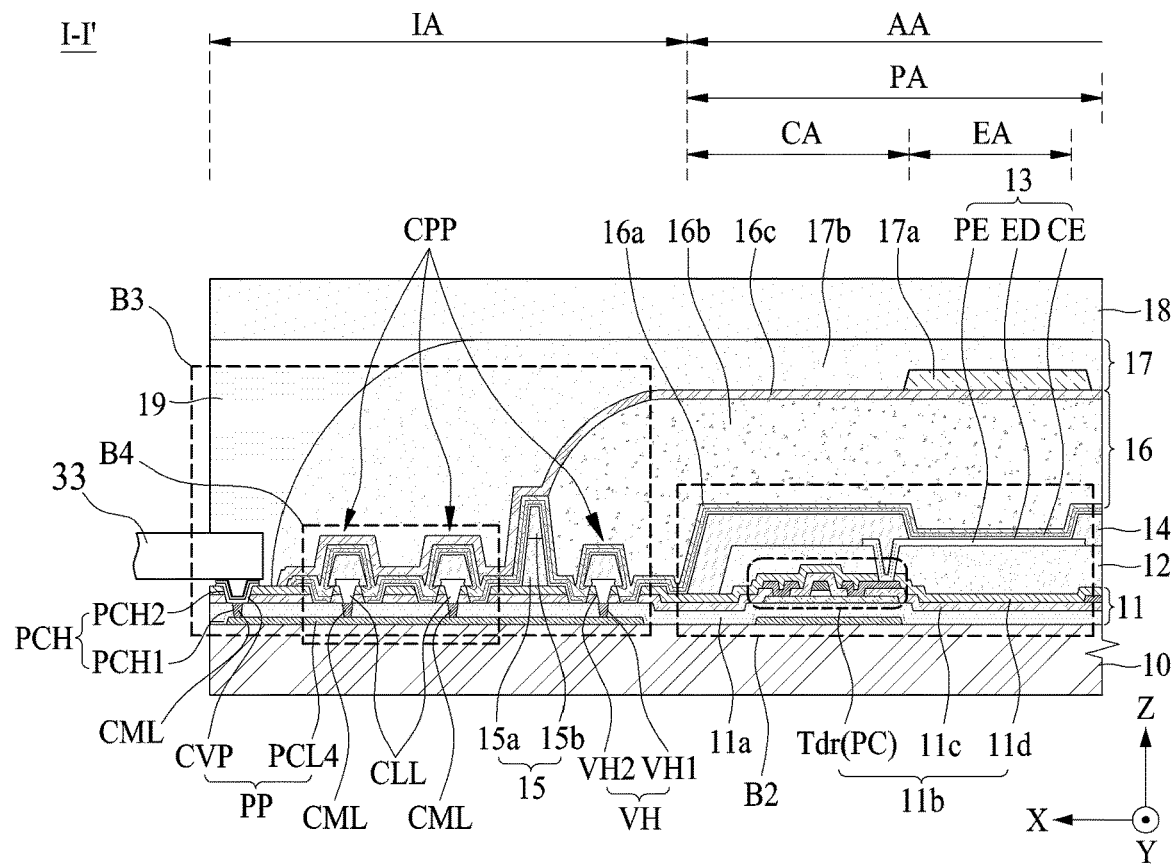
FIG. 4 is a cross-sectional view taken along line I-I' illustrated in FIG. 1.
Figure 5:
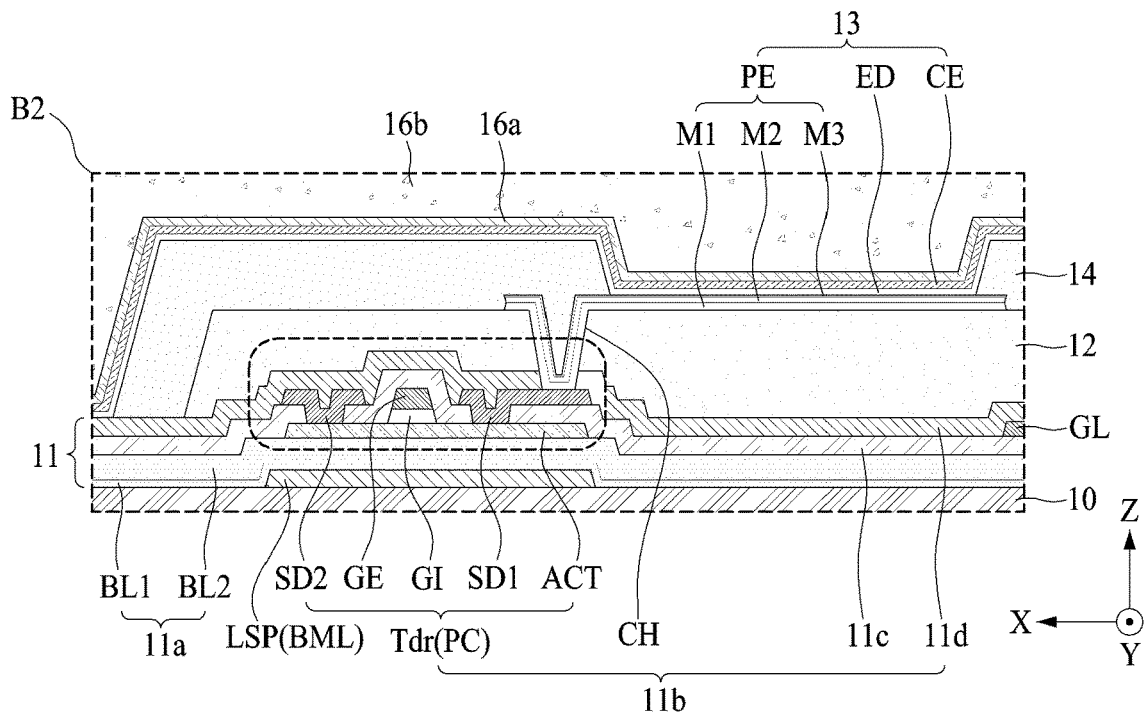
FIG. 5 is an enlarged view of a region 'B2' illustrated in FIG. 4.
Figure 6:
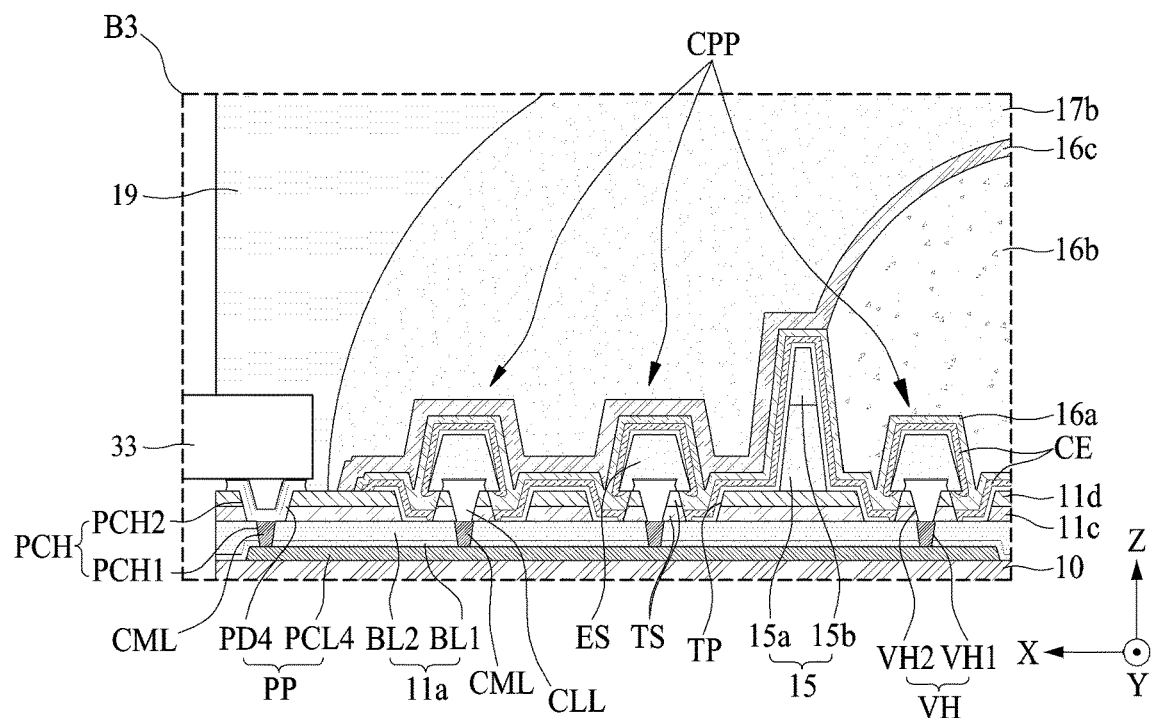
FIG. 6 is an enlarged view of a region 'B3' illustrated in FIG. 4.
Figure 7:
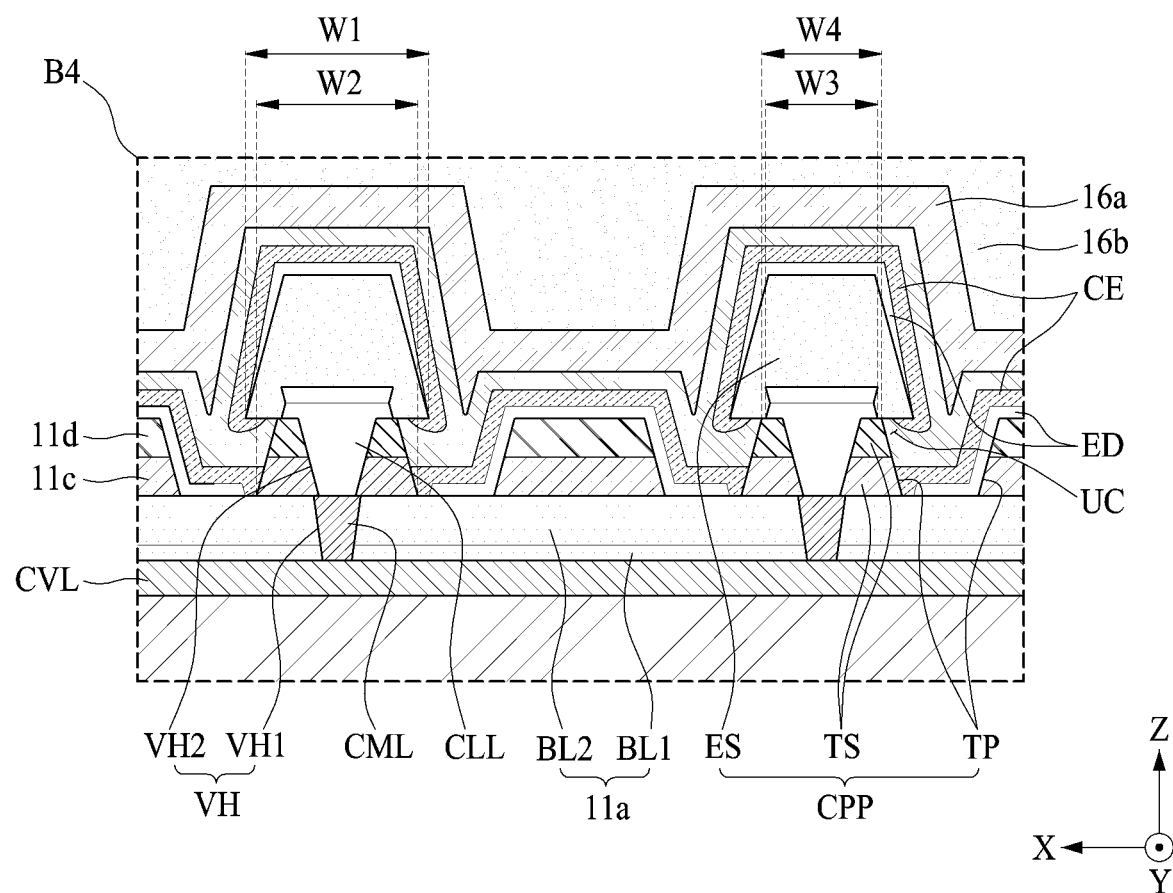
FIG. 7 is an enlarged view of a region 'B4' illustrated in FIG. 4.

FIG. 4 is a cross-sectional view taken along line I-I' illustrated in FIG. 1, FIG. 5 is an enlarged view of a region 'B2' illustrated in FIG. 4, FIG. 6 is an enlarged view of a region 'B3' illustrated in FIG. 4, and FIG. 7 is an enlarged view of a region 'B4' illustrated in FIG. 4.

Referring to FIGS. 1, and 4 to 7, a display apparatus according to an embodiment of the present disclosure can include a circuit layer 11, a planarization layer 12, a light emitting device layer 13, a bank 14, a dam pattern 15, and an encapsulation layer 16 on the substrate 10.

The circuit layer 11 can be disposed on the substrate 10. The circuit layer 11 can be referred to as a pixel array layer or a TFT array layer.

The circuit layer 11 according to an embodiment can include a buffer layer 11a and a circuit array layer 11b.

The buffer layer 11a can prevent materials, such as hydrogen included in the substrate 10, from being diffused to the circuit array layer 11b in a high temperature process of a process of manufacturing a TFT. Also, the buffer layer 11a can prevent external water or moisture from penetrating into the light emitting device layer 13. For example, the buffer layer 11a can include a first buffer layer BL1 which includes SiNx and is disposed on the substrate 10 and a second buffer layer BL2 which includes SiOx and is disposed on the first buffer layer BL1.

The circuit array layer 11b can include a pixel circuit PC which includes a driving TFT Tdr disposed in each of a plurality of pixel areas PA on the buffer layer 11a.

The driving TFT Tdr disposed in each pixel area PA can include an active layer ACT, a gate insulation layer GI, a gate electrode GE, an interlayer insulation layer 11c, a first source/drain electrode SD1, a second source/drain electrode SD2, and a passivation layer 11d.

The active layer ACT can be disposed on the buffer layer 11a in each pixel area PA. The active layer ACT can include a channel area, overlapping the gate electrode GE, and a first source/drain area and a second source/drain area parallel to each other between adjacent channel areas. The active layer ACT can have conductivity in a conductivity process, and thus, can be used as a bridge line of a jumping structure which directly connects lines in the display area AA or electrically connects lines disposed on different layers.

The gate insulation layer GI can be disposed in the channel area of the active layer ACT. The gate insulation layer GI can insulate the active layer ACT from the gate electrode GE.

The gate electrode GE can be disposed on the gate insulation layer GI. The gate electrode GE can overlap the channel area of the active layer ACT with the gate insulation layer GI therebetween. The gate electrode GE according to an embodiment can have a single-layer structure or a multi-layer structure including at least one of molybdenum (Mo), titanium (Ti), a Mo—Ti alloy (MoTi), and copper (Cu).

The interlayer insulation layer 11c can be disposed on the substrate 10 to cover the gate electrode GE and the active layer ACT. The interlayer insulation layer 11c can electrically insulate (or isolate) the gate electrode GE and the source/drain electrodes SD1 and SD2.

The interlayer insulation layer 11c according to an embodiment can be disposed at only a portion, other than an edge portion, of the substrate 10, but is not limited thereto.

The first source/drain electrode SD1 can be disposed on the interlayer insulation layer 11c overlapping the first source/drain area of the active layer ACT and can be electrically connected to the first source/drain area of the active layer ACT through a first source/drain contact hole disposed in the interlayer insulation layer 11c. For example, the first source/drain electrode SD1 can be a source electrode of the driving TFT Tdr, and the first source/drain area of the active layer ACT can be a source area.

The second source/drain electrode SD2 can be disposed on the interlayer insulation layer 11c overlapping the second source/drain area of the active layer ACT and can be electrically connected to the second source/drain area of the active layer ACT through a second source/drain contact hole disposed in the interlayer insulation layer 11c. For example, the second source/drain electrode SD2 can be a drain electrode of the driving TFT Tdr, and the second source/drain area of the active layer ACT can be a drain area.

The source/drain electrodes SD1 and SD2 according to an embodiment can be implemented along with the gate line GL.

The passivation layer 11d can be disposed on the substrate 10 to cover the pixel circuit PC including the driving TFT Tdr. For example, when the interlayer insulation layer 11c is not disposed at the edge portion of the substrate 10, the passivation layer 11d disposed at the edge portion of the substrate 10 can directly contact the buffer layer 11a. The passivation layer 11d according to an embodiment can include silicon oxide (SiOx), silicon nitride (SiNx), silicon oxynitride (SiON), or a multilayer thereof, but is not limited thereto.

Each of first and second switching TFT Tsw1 and Tsw2 configuring the pixel circuit PC can be formed along with the driving TFT Tdr, and thus, their detailed descriptions are omitted or may be brief.

The circuit layer 11 according to an embodiment can further include a lower metal layer BML which is disposed between the substrate 10 and the buffer layer 11a. The lower metal layer BML can further include a light blocking pattern (or a light blocking layer) LSP which is disposed under the active layer ACT of each of the TFTs Tdr, Tsw1, and Tsw2 configuring the pixel circuit PC.

The light blocking pattern LSP can be disposed in an island shape between the substrate 100 and the active layer ACT. The light blocking pattern LSP can block light which is incident on the active layer ACT through the substrate 100, thereby preventing or minimizing a threshold voltage variation of each TFT caused by external light. Optionally, the light blocking pattern LSP can be electrically connected to the first source/drain electrode SD1 of a corresponding TFT and thus can act as a lower gate electrode of the corresponding TFT, and in this case, a characteristic variation of each TFT caused by light and a threshold voltage variation of each TFT caused by a bias voltage can be minimized or prevented.

The lower metal layer BML can be used as a plurality of data lines DL, a plurality of pixel driving power lines PL, a plurality of pixel common voltage lines CVL, and a plurality of reference voltage lines RL. Also, the lower metal layer BML can be used as a metal layer which implements a plurality of pad connection lines PCL1 to PCL4 electrically connected to a plurality of pads PVP, DP, RVP, and CVP disposed in the pad part PP. Therefore, the lower metal layer BML can be deposited on the substrate 10, and then, can be patterned as the plurality of data lines DL, the plurality of pixel driving power lines PL, the plurality of pixel common voltage lines CVL, the plurality of reference voltage lines RL, a light blocking pattern LSP, and the pad connection lines PCL1 to PCL4 by using a patterning process.

The planarization layer 12 can be disposed on the substrate 10 and can provide a flat surface on the circuit layer 11. The planarization layer 12 can cover the circuit layer 11 including the driving TFT Tdr disposed in each of the plurality of pixel areas PA. The planarization layer 12 according to an embodiment can include acryl resin, epoxy resin, phenolic resin, polyamides resin, or polyimides resin, but is not limited thereto.

The planarization layer 12 according to an embodiment can be formed to cover the circuit layer 11 except an edge portion of the substrate 10. Therefore, the passivation layer 11d of the circuit layer 11 disposed at the edge portion of the substrate 10 can be exposed without being covered by the planarization layer 12.

The light emitting device layer 13 can be disposed on the planarization layer 12. The light emitting device layer 13 according to an embodiment can include a pixel electrode PE, a self-light emitting device ED, and a common electrode CE.

The pixel electrode PE can be referred to as an anode electrode, a reflective electrode, a lower electrode, or a first electrode of the self-light emitting device ED.

The pixel electrode PE can be disposed on the planarization layer 12 overlapping an emission area EA of each of the plurality of pixel areas PA. The pixel electrode PE can be patterned and disposed in an island shape in each pixel area PA and can be electrically connected to the first source/drain electrode SD1 of the driving TFT Tdr of a corresponding pixel circuit PC. One side of the pixel electrode PE can extend from the first source/drain electrode SD1 of the driving TFT Tdr and can be electrically connected to the first source/drain electrode SD1 of the driving TFT Tdr through an electrode contact hole CH provided in the planarization layer 12.

The pixel electrode PE according to an embodiment can include a metal material which is low in work function and is good in reflective efficiency.

For example, the pixel electrode PE can have a three-layer structure including first to third pixel electrode layer M1, M2, and M3. The first pixel electrode layer M1 can act as an adhesive layer corresponding to the planarization layer 12 and can act as a secondary electrode of the self-light emitting device ED, and moreover, can include indium tin oxide (ITO) or indium zinc oxide (IZO). The second pixel electrode layer M2 can act as a reflector and can perform a function of decreasing a resistance of the pixel electrode PE, and moreover, can include one material of aluminum (Al), silver (Ag), Mo, Ti, and MoTi. The third pixel electrode layer M3 can act as an electrode of the self-light emitting device ED and can include ITO or IZO. For example, the pixel electrode PE according to an embodiment can be formed in a three-layer structure of IZO/MoTi/ITO or ITO/MoTi/ITO.

As another example, the pixel electrode PE can have a four-layer structure including first to fourth pixel electrode layer. The first pixel electrode layer can act as the adhesive layer corresponding to the planarization layer 12 and can act as the secondary electrode of the self-light emitting device ED, and moreover, can include one material of ITO, Mo, and MoTi. The second pixel electrode layer can perform a function of decreasing a resistance of the pixel electrode PE and can include Cu. The third pixel electrode layer can act as a reflector and can include one material of Al, Ag, Mo, Ti, and MoTi. The fourth pixel electrode layer can act as an electrode of the self-light emitting device ED and can include ITO or IZO. For example, the pixel electrode PE according to another embodiment can be formed in a four-layer structure of ITO/Cu/MoTi/ITO.

The pixel electrode PE can be used as a metal layer which implements the plurality of pads PVP, DP, RVP, and CVP disposed in each of the plurality of pad parts PP. For example, a plurality of pixel driving voltage pads PVP, a plurality of data pads DP, a plurality of reference voltage pads RVP, a plurality of pixel common voltage pads CVP, and a plurality of gate pads can be formed of the same material along with the pixel electrode PE.

Each of the plurality of pads PVP, DP, RVP, and CVP can be individually connected to the pad connection lines PCL1 to PCL4 through a pad contact hole PCH disposed in a middle insulation layer including the passivation layer 11d, the interlayer insulation layer 11c, and the buffer layer 11a. For example, the pixel common voltage pad CVP disposed in each of the plurality of pad parts PP can be electrically connected to a fourth pad connection line PCL4 through the pad contact hole PCH, and thus, can be electrically connected to the pixel common voltage line CVL through the pad contact hole PCH and the fourth pad connection line PCL4. Likewise, the data pad DP disposed in each of the plurality of pad parts PP can be electrically connected to a second pad connection line PCL2 through the pad contact hole PCH, and thus, can be electrically connected to the data line DL through the second pad connection line PCL2 via the pad contact hole PCH.

The pad contact hole PCH can be implemented to pass through the middle insulation layer disposed at intersection portions between the plurality of pads PVP, DP, RVP, and CVP and the pad connection lines PCL1 to PCL4. Here, the middle insulation layer can include the buffer layer 11a, the interlayer insulation layer 11c, and the passivation layer 11d.

The pad contact hole PCH according to an embodiment can include a first pad contact hole PCH1 passing through the buffer layer 11a disposed on the pad connection lines PCL1 to PCL4, and a second pad contact hole PCH2 passing through the interlayer insulation layer 11c and the passivation layer 11d disposed on the first pad contact hole PCH1. When the interlayer insulation layer 11c is not disposed at the edge portion of the substrate 10, the second pad contact hole PCH2 can be implemented to pass through the passivation layer 11d disposed on the first pad contact hole PCH1. The second pad contact hole PCH2 can be formed along with the electrode contact hole CH disposed in the pixel area PA without an additional patterning process.

The pixel electrode PE can be used as a metal layer which implements at least one closed loop line CLL disposed at the edge portion of the substrate 10 to surround the display portion AA. For example, the at least one closed loop line CLL can be formed of the same material along with the pixel electrode PE.

The at least one closed loop line CLL can be disposed on the passivation layer 11d to surround the display portion AA and can intersect with the pad connection lines PCL1 to PCL4 at the pad part PP.

The at least one closed loop line CLL can be electrically connected to at least one of a plurality of fourth pad connection lines PCL4 disposed in each of the plurality of pad parts PP through a via hole VH passing through the passivation layer 11d, the interlayer insulation layer 11c, and the buffer layer 11a.

The via hole VH can be implemented to pass through the middle insulation layer disposed at intersection portions between the at least one closed loop line CLL and the fourth pad connection lines PCL4. The via hole VH according to an embodiment can include a first via hole VH1, passing through the buffer layer 11a disposed on the fourth pad connection lines PCL4, and a second via hole VH2 passing through the interlayer insulation layer 11c and the passivation layer 11d disposed on the first via hole VH1. When the interlayer insulation layer 11c is not disposed at the edge portion of the substrate 10, the second via hole VH2 can be implemented to pass through the passivation layer 11d disposed on the first via hole VH. The second via hole VH2 can be formed along with the electrode contact hole CH disposed in the pixel area PA and the pad contact hole PCH disposed in the pad part PP without an additional patterning process.

The at least one closed loop line CLL can be electrically connected to the fourth pad connection line PCL4 through the via hole VH, and thus, can be electrically connected to at least one of the pixel common voltage pads CVP disposed in the plurality of pad parts PP through the via hole VH and the fourth pad connection line PCL4 and can also be electrically connected to at least one of the plurality of pixel common voltage lines CVL. Therefore, the at least one closed loop line CLL can be maintained at the same level as that of a pixel common voltage supplied to the pixel common voltage pads CVP, and thus, can discharge static electricity, flowing in from the outside, to the pixel common voltage pad CVP and/or the pixel common voltage line CVL, and thus, can prevent a defect caused by the static electricity.

The self-light emitting device ED can be formed on the pixel electrode PE and can directly contact the pixel electrode PE. The self-light emitting device ED can be a common layer which is formed in common in each of a plurality of subpixels SP so as not to be distinguished by subpixel SP units. The self-light emitting device ED can react on a current flowing between the pixel electrode PE and the common electrode CE to emit white light. The self-light emitting device ED according to an embodiment can include an organic light emitting device or an inorganic light emitting device, or can include a stacked or combination structure of an organic light emitting device (or an inorganic light emitting device) and a quantum dot light emitting device.

An organic light emitting device according to an embodiment can include two or more light emitting material layers (or alight emitting portion) for emitting white light. For example, the organic light emitting device can include a first light emitting material layer and a second light emitting material layer, for emitting white light on the basis of a combination of first light and second light. Here, the first light emitting material layer can include at least one of a blue light emitting material, a green light emitting material, a red light emitting material, a yellow light emitting material, and a yellow-green light emitting material. The second light emitting material layer can include at least one of a blue light emitting material, a green light emitting material, a red light emitting material, a yellow light emitting material, and a yellow-green light emitting material, for emitting second light which is combined with first light to generate white light.

The organic light emitting device according to an embodiment can further include one or more function layers for enhancing emission efficiency and/or lifetime. For example, the function layer can be disposed upper and/or under a light emitting material layer.

An inorganic light emitting device according to an embodiment can include a semiconductor light emitting diode, a micro light emitting diode, or a quantum dot light emitting diode. For example, when the self-light emitting device ED is the inorganic light emitting device, the self-light emitting device ED can have a scale of 1 µm or 100 µm, but is not limited thereto.

The common electrode CE can be referred to as a cathode electrode, a transparent electrode, an upper electrode, or a second electrode of the self-light emitting device ED. The common electrode CE can be formed on the self-light emitting device ED and can directly contact the self-light emitting device ED or can electrically and directly contact the self-light emitting device ED. The common electrode CE can include a transparent conductive material which transmits light emitted from the self-light emitting device ED.

The common electrode CE according to an embodiment can be formed in a single-layer structure or a multi-layer structure, which includes at least one material of graphene and a transparent conductive material which is relatively high in work function. For example, the common electrode CE can include metal oxide such as ITO or IZO, or can include a combination of oxide and metal such as ZnO:Al or $SnO_2$:Sb.

Additionally, by adjusting a refractive index of light emitted from the self-light emitting device ED, a capping layer for enhancing the emission efficiency of light can be further disposed on the common electrode CE.

The bank 14 can be disposed on the planarization layer 12 to cover an edge portion of the pixel electrode PE. The bank 14 can define an emission area EA (or an opening portion) of each of the plurality of subpixels SP and can electrically isolate pixel electrodes PE disposed in adjacent subpixels SP. The bank 14 can be formed to cover the electrode contact hole CH disposed in each of the plurality of pixel areas PA. The bank 14 can be covered by the self-light emitting device ED. For example, the bank 14 according to an embodiment can include a transparent material or an opaque material including a black pigment.

The dam pattern 15 can be disposed on the circuit layer 11 at an edge portion of the substrate 10 to have a closed loop shape or a closed loop line shape. For example, the dam pattern 15 can be disposed on a passivation layer 11d of the circuit layer 11. The dam pattern 15 can prevent the spread or overflow of the encapsulation layer 16.

The dam pattern 15 according to an embodiment can include the same material along with the planarization layer 12. The dam pattern 15 can have the same height (or thickness) as that of the planarization layer 12, or can have a height which is higher than the planarization layer 12. For example, a height (or thickness) of the dam pattern 15 can be twice a height (or thickness) of the planarization layer 12.

According to another embodiment, the dam pattern 15 can include a lower dam pattern 15a, which is formed of the same material along with the planarization layer 12, and an upper dam pattern 15b which is stacked on the lower dam pattern 15a and includes the same material as that of the bank 14. The lower dam pattern 15a can have the same height (or thickness) as that of the planarization layer 12, or can have a height which is higher than the planarization layer 12. For example, a height (or thickness) of the lower dam pattern 15a can be twice a height (or thickness) of the planarization layer 12.

The encapsulation layer 16 can be disposed on a portion other than an outermost edge portion of the substrate 10 including the plurality of pad parts PP to cover the light emitting device layer 13. For example, the encapsulation layer 16 can be implemented to surround all of a front surface and lateral surfaces of the light emitting device layer 13.

The encapsulation layer 16 according to an embodiment can include first to third encapsulation layer 16a, 16b, and 16c.

The first encapsulation layer 16a can be implemented to prevent oxygen or water from penetrating into the light emitting device layer 13. The first encapsulation layer 16a can be disposed on the common electrode CE to surround the light emitting device layer 13. Therefore, all of the front surface and lateral surfaces of the light emitting device layer 13 can be surrounded by the first encapsulation layer 16a. For example, the first encapsulation layer 16a can directly contact a top surface of the passivation layer 11d at an outer periphery of the dam pattern 15 and can cover a boundary portion (or an interface) between the common electrode CE and the passivation layer 11d, thereby preventing or minimizing lateral water penetration. The first encapsulation layer 16a according to an embodiment can include an inorganic material.

The second encapsulation layer 16b can be implemented on the first encapsulation layer 16a to have a thickness which is relatively thicker than that of the first encapsulation layer 16a. The second encapsulation layer 16b can have a thickness for sufficiently covering particles (or an undesired material or an undesired structure) which can be or not on the first encapsulation layer 16a. The second encapsulation layer 16b can spread to an edge portion of the substrate 10 due to a relatively thick thickness, but the spread of the second encapsulation layer 16b can be blocked by the dam pattern 15. For example, an end of the second encapsulation layer 16b can directly contact the first encapsulation layer 16a on the dam pattern 15. Accordingly, the second encapsulation layer 16b can be disposed on only the first encapsulation layer 16a in an internal region (or an inner region) surrounded by the dam pattern 15. The second encapsulation layer 16b can be referred to as a particle cover layer. The second encapsulation layer 16b according to an embodiment can include an organic material such as SiOCz acryl or epoxy-based resin.

The third encapsulation layer 16c can be implemented to primarily prevent oxygen or water from penetrating into the light emitting device layer 13. The third encapsulation layer 16c can be implemented to surround all of the second encapsulation layer 16b and the first encapsulation layer 16a uncovered by the second encapsulation layer 16b. For example, the third encapsulation layer 16c can directly contact a top surface of the passivation layer 11d and can cover a boundary portion (or an interface) between the first encapsulation layer 16a and the passivation layer 11d, thereby additionally preventing or minimizing lateral water penetration. The third encapsulation layer 16c according to an embodiment can include an inorganic material.

The light emitting display apparatus according to an embodiment of the present disclosure can further include a wavelength conversion layer 17 disposed on the substrate 10.

The wavelength conversion layer 17 can convert a wavelength of light which is incident thereon from an emission area of each pixel area PA. For example, the wavelength conversion layer 17 can convert white light, which is incident thereon from the emission area, into color light corresponding to the subpixel SP or can transmit only color light corresponding to the subpixel SP.

The wavelength conversion layer 17 according to an embodiment can include a plurality of wavelength conversion patterns 17a and a protection layer 17b.

The plurality of wavelength conversion patterns 17a can be disposed on the encapsulation layer 16 disposed in the emission area EA of each of the plurality of pixel areas PA. The plurality of wavelength conversion patterns 17a can be divided (or classified) into a red light filter (or a first light filter) which converts white light into red light, a green light filter (or a second light filter) which converts white light into green light, and a blue light filter (or a third light filter) which converts white light into blue light.

The protection layer 17b can be implemented to cover the wavelength conversion patterns 17a and to provide a flat surface on the wavelength conversion patterns 17a. The protection layer 17b can be disposed to cover the wavelength conversion patterns 17a and the encapsulation layer 16 where the wavelength conversion patterns 17a are not disposed. The protection layer 17b according to an embodiment can include an organic material. Optionally, the protection layer 17b can further include a getter material for adsorbing water and/or oxygen.

Alternatively, the wavelength conversion layer 17 can be changed to a wavelength conversion sheet having a sheet form and can be disposed on the encapsulation layer 16. In this case, the wavelength conversion sheet (or a quantum dot sheet) can include the wavelength conversion patterns 17a disposed between a pair of films. For example, when the wavelength conversion layer 17 includes a quantum dot which re-emits colored light set in a subpixel, the light emitting device layer 13 of a subpixel can be implemented to emit white light or blue light.

The light emitting display apparatus according to an embodiment of the present disclosure can further include a functional film 18.

The functional film 18 can be disposed on the wavelength conversion layer 17. For example, the functional film 18 can be coupled to the wavelength conversion layer 17 by a transparent adhesive member.

The functional film 18 according to an embodiment can include an anti-reflection layer (or an anti-reflection film) for preventing reflection of external light to enhance outdoor visibility and a contrast ratio with respect to an image displayed by the display panel. For example, the anti-reflection layer can include a circular polarization layer (or a circular polarization film) which prevents external light, reflected by TFTs and/or the pixel driving lines disposed on the substrate 10, from traveling to the outside.

The functional film 18 according to an embodiment can further include a barrier layer (or a barrier film) for primarily preventing the penetration of water or oxygen, and the barrier layer can include a material (for example, a polymer material) which is low in water transmission rate.

The functional film 18 according to an embodiment can further include a light path control layer (or a light path control film) for controlling a path of light output from each pixel P to the outside. The light path control layer can include a stacked structure where a high refraction layer and a low refraction layer are alternately stacked and can change a path of light incident from each pixel P to minimize a color shift based on a viewing angle.

The light emitting display apparatus according to an embodiment of the present disclosure can further include a side sealing member 19 disposed on the substrate 10.

The side sealing member 19 can be formed between the substrate 10 and the functional film 18 and can cover all of side surfaces of the circuit layer 11, the planarization layer 12, and the wavelength conversion layer 17. For example, the side sealing member 19 can cover all of side surfaces of the circuit layer 11, the planarization layer 12, and the wavelength conversion layer 17 exposed at the outside of the light emitting display apparatus, between the functional film 18 and the substrate 10. Also, the side sealing member 19 can cover a portion of the flexible circuit film 31 attached on each of the plurality of pad parts PP, on one edge portion of the substrate 10. The side sealing member 19 can prevent lateral light leakage by using light, traveling to an outer surface in the wavelength conversion layer 17, of light emitted from the self-light emitting device ED of each subpixel SP. Particularly, the side sealing member 19 overlapping the pad part PP of the substrate 1 can prevent or minimize the reflection of light by the pads PVP, DP, RVP, and CVP disposed in the pad part PP.

Optionally, the side sealing member 19 can further include a getter material for adsorbing water and/or oxygen.

The light emitting display apparatus according to an embodiment of the present disclosure can further include a conductive metal line CML disposed between the at least one closed loop line CLL and the pad connection lines PCL1 to PCL4.

The conductive metal line CML can act as a middle layer (or a middle conductive layer) which electrically connects the at least one closed loop line CLL to the pad connection lines PCL1 to PCL4. For example, when a shortest distance between the at least one closed loop line CLL and each of the pad connection lines PCL1 to PCL4 is relatively long, a contact defect can occur where the at least one closed loop line CLL is not connected to the pad connection lines PCL1 to PCL4. Accordingly, the conductive metal line CML can be disposed between the at least one closed loop line CLL and the pad connection lines PCL1 to PCL4, and thus, can prevent a contact defect caused by a distance between the at least one closed loop line CLL and the pad connection lines PCL1 to PCL4.

The conductive metal line CML according to an embodiment can be electrically connected between the at least one closed loop line CLL and the pad connection lines PCL1 to PCL4, in the via hole VH disposed in the middle insulation layer disposed at an intersection portion between the at least one closed loop line CLL and each of the pad connection lines PCL1 to PCL4.

The conductive metal line CML according to an embodiment can be disposed in the first via hole VH disposed in the buffer layer 11a and can be electrically connected to the pad connection lines PCL1 to PCL4. Accordingly, the at least one closed loop line CLL can be electrically connected to the pad connection lines PCL1 to PCL4 through the second via hole VH2 and the conductive metal line CML.

Likewise, the conductive metal line CML can be additionally disposed in the pad contact hole PCH and can electrically connect the pads PVP, DP, RVP, and CVP, disposed in the plurality of pad parts PP, to corresponding pad connection lines PCL1 to PCL4. In this case, each of the pads PVP, DP, RVP, and CVP disposed in the plurality of pad parts PP can be individually connected to corresponding pad connection lines PCL1 to PCL4 through the conductive metal line CML disposed in the first pad contact hole PCH1.

The conductive metal line CML according to an embodiment can be implemented along with the source/drain electrodes SD1 and SD2 of the TFTs Tsw1, Tsw2, and Tdr disposed in the pixel area PA.

The light emitting display apparatus according to an embodiment of the present disclosure can further include at least one cliff pattern portion CPP disposed on the substrate 10.

The at least one cliff pattern portion CPP can be implemented to prevent the penetration of water in a lateral direction of the substrate 1 to prevent the self-light emitting device ED from being degraded by lateral water penetration. For example, the self-light emitting device ED of the light emitting device layer 13 can be disposed on the bank 14 and the pixel electrode PE of each pixel area PA, and moreover, can be disposed on the passivation layer 11d exposed at the edge portion of the substrate 10. Therefore, the self-light emitting device ED can be degraded or reduced in reliability due to the penetration of water through a side surface of the substrate 10, and in order to solve such a problem, the cliff pattern portion CPP can be implemented to isolate (or disconnect) the self-light emitting device ED of the light emitting device layer 13 at a periphery of the dam pattern 15, thereby preventing or minimizing a reduction in reliability of the self-light emitting device ED caused by lateral water penetration. The at least one cliff pattern portion CPP can be referred to as an isolation region, a disconnection line, or a disconnection pattern portion.

The at least one cliff pattern portion CPP can be implemented near the dam pattern 15 to include an isolation structure (or a disconnection structure or a cutting structure) for isolating (or disconnecting) the self-light emitting device ED disposed near the dam pattern 15 or isolating (or disconnecting) all of the self-light emitting device ED and the common electrode CE. The isolation structure according to an embodiment can include at least one of an eaves structure (or a cliff structure) and an undercut structure.

The at least one cliff pattern portion CPP can be implemented in the passivation layer 11d disposed near the dam pattern 15. For example, the cliff pattern portion CPP can include an isolation structure which is implemented by patterning the passivation layer 11d disposed near the dam pattern 15. For example, the light emitting display apparatus according to an embodiment of the present disclosure can include at least one dam inner cliff pattern portion disposed at an inner periphery of the dam pattern 15 and at least one dam outer cliff pattern portion disposed at an outer periphery of the dam pattern 15.

The at least one cliff pattern portion CPP according to an embodiment can include a tapered structure TS and an eaves structure ES.

The tapered structure TS can be implemented by a patterning process of forming a trench pattern TP in the interlayer insulation layer 11c and the passivation layer 11d disposed near the dam pattern 15.

The trench pattern TP can be implemented by removing, by a certain width, the interlayer insulation layer 11c and the passivation layer 11d disposed near the dam pattern 15 by using an etching process of forming the electrode contact hole CH, the pad contact hole PCH, and the via hole VH in the interlayer insulation layer 11c and the passivation layer 11d. The trench pattern TP can expose the buffer layer 11a.

The tapered structure TS can be implemented by a region, where the trench pattern TP is not disposed, among each of the interlayer insulation layer 11c and the passivation layer 11d disposed at the edge portion of the substrate 10. For example, the tapered structure TS can be implemented by a portion, which is not removed by an etching process and remains, of each of the interlayer insulation layer 11c and the passivation layer 11d disposed at the edge portion of the substrate 10.

The tapered structure TS according to an embodiment can include a tapered cross-sectional structure or a ladder-shaped cross-sectional structure where a top surface of the buffer layer 11a is a bottom side thereof. For example, the tapered structure TS can include a bottom surface (or a rear surface) supported by the top surface of the buffer layer 11a and a top surface (or a front surface) supporting the eaves structure ES.

The eaves structure ES can be disposed on the tapered structure TS to have an eaves structure with respect to the tapered structure TS.

The eaves structure ES according to an embodiment can have a width which is wider than that of the tapered structure TS, so as to have an eaves structure with respect to the tapered structure TS. According to an embodiment, with respect to a first direction X, a maximum width W1 of the eaves structure ES can be greater than a maximum width W2 of the tapered structure TS. According to another embodiment, with respect to the first direction X, a bottom width W1 of the eaves structure ES can be greater than a top width W2 of the tapered structure TS.

The eaves structure ES can include the same material as that of the bank 14. For example, the eaves structure ES can be formed of a bank material which is not patterned (or removed) and remains on the tapered structure TS, in a process of patterning the bank 14. Accordingly, the eaves structure ES can be implemented to have the same height (or thickness) as that of the bank 14.

In the at least one cliff pattern portion CPP, a side surface of the tapered structure TS can have an undercut structure UC (or an undercut area) with respect to the eaves structure ES. For example, a boundary portion between the eaves structure ES and the tapered structure TS or an upper side surface of the tapered structure TS can have an undercut structure UC with respect to the eaves structure ES. The eaves structure ES can protrude toward a center portion of the trench pattern TP on the basis of the undercut structure UC of the tapered structure TS unlike a side surface of the tapered structure TS. Accordingly, the eaves structure ES can have an eaves structure with respect to the tapered structure TS.

According to an embodiment, the tapered structure TS can be formed by an etching process which is performed on the interlayer insulation layer 11c and the passivation layer 11d by using the eaves structure ES as a mask. In this case, in the etching process, a side surface of each of the interlayer insulation layer 11c and the passivation layer 11d close to a bottom surface of the eaves structure ES can be etched at a higher speed, and thus, the boundary portion between the eaves structure ES and the tapered structure TS or the upper side surface of the tapered structure TS can be undercut with respect to the eaves structure ES. Accordingly, the eaves structure ES can have an eaves structure with respect to the tapered structure TS.

The at least one cliff pattern portion CPP can be implemented to overlap the at least one closed loop line CLL. For example, the at least one closed loop line CLL can be disposed in the at least one cliff pattern portion CPP and can be surrounded by the eaves structure ES. In other words, the at least one closed loop line CLL can be embedded into the eaves structure ES supported by at least one tapered structure TS, and thus, a top surface (or an upper surface) and both side surfaces of the at least one closed loop line CLL can be completely surrounded by the eaves structure ES, and thus, may not be exposed at the trench pattern TP.

A width W4 of the at least one closed loop line CLL can be narrower than a top width W3 of the tapered structure TS. According to an embodiment, with respect to the first direction X, a top width W3 of the tapered structure TS can be greater than a width W4 of the at least one closed loop line CLL.

The at least one closed loop line CLL according to an embodiment can pass through at least one tapered structure TS of the at least one cliff pattern portion CPP and can be electrically connected to the fourth pad connection line PCL4. To this end, the at least one cliff pattern portion CPP according to an embodiment can include a second via hole VH2 of the via hole VH. For example, the second via hole VH2 of the via hole VH can pass through the at least one cliff pattern portion CPP. In this case, the at least one closed loop line CLL can be disposed on the at least one cliff pattern portion CPP and can be electrically connected to the fourth pad connection line PCL4 through the second via hole VH2 disposed in the at least one cliff pattern portion CPP and the first via hole VH1 disposed in the first buffer layer 11a.

According to another embodiment, the at least one cliff pattern portion CPP can be disposed to cover the conductive metal line CML disposed in the buffer layer 11a overlapping the at least one closed loop line CLL and can support the at least one closed loop line CLL. The at least one cliff pattern portion CPP can include a second via hole VH2 of the via hole VH overlapping the conductive metal line CML. For example, the second via hole VH2 of the via hole VH can pass through the at least one cliff pattern portion CPP. In this case, the at least one closed loop line CLL can be disposed on the at least one cliff pattern portion CPP and can be electrically connected to the fourth pad connection line PCL4 through the conductive metal line CML and the second via hole VH2 disposed in the at least one cliff pattern portion CPP.

The at least one cliff pattern portion CPP can isolate (or disconnect) the common electrode CE and the self-light emitting device ED disposed near the dam pattern 15 corresponding to the edge portion of the substrate 10. For example, the self-light emitting device ED of the light emitting device layer 13 formed (or deposited) on the at least one cliff pattern portion CPP can be automatically isolated (or disconnected) by an isolation structure of the cliff pattern portion CPP in a deposition process, without a separate isolation process.

According to an embodiment, a depositing material of the self-light emitting device ED including an organic light emitting device can have linearity, and thus, may not be deposited on a side surface of the tapered structure TS uncovered by an eaves structure implemented in the cliff pattern portion CPP. Therefore, the self-light emitting device ED formed (or deposited) on the cliff pattern portion CPP can be isolated (or disconnected) between the eaves structure ES and the tapered structure TS. Accordingly, the self-light emitting device ED disposed near the dam pattern 15 can be automatically isolated (or disconnected) by the cliff pattern portion CPP in the deposition process, and thus, a separate patterning process of isolating (or disconnecting) the self-light emitting device ED can be omitted.

The at least one cliff pattern portion CPP can be covered by the encapsulation layer 16. A first encapsulation layer 16a of the encapsulation layer 16 can surround a side surface (or an isolation surface) of each of the self-light emitting device ED and the common electrode CE isolated by the cliff pattern portion CPP. For example, the first encapsulation layer 16a can be filled into an isolation space formed by the isolation structure of the cliff pattern portion CPP and can seal or completely surround the cliff pattern portion CPP, and thus, can completely surround or cover the lateral surface (or the isolation surface) of each of the isolated self-light emitting device ED and common electrode CE, thereby fundamentally (or completely) preventing lateral water penetration.

Figure 8:
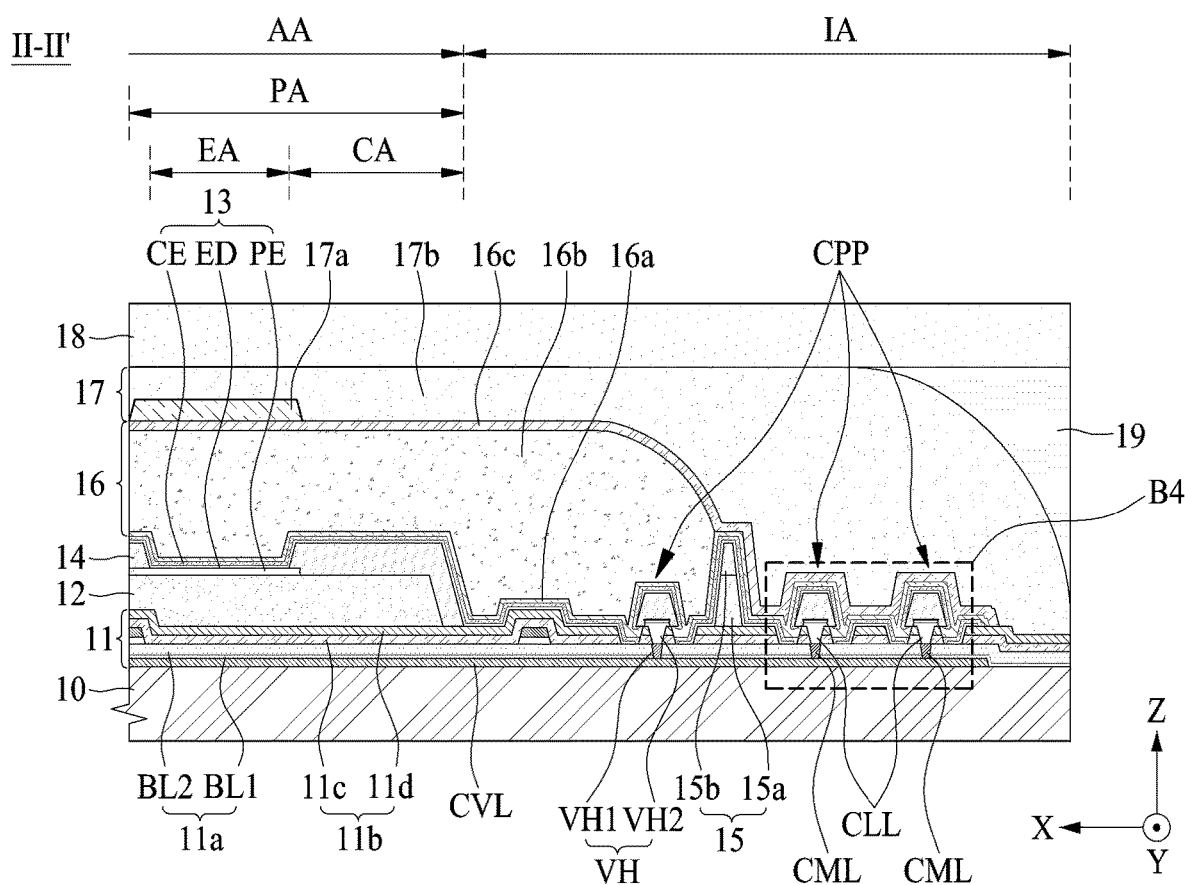
FIG. 8 is a cross-sectional view taken along line II-II' illustrated in FIG. 1.

FIG. 8 is a cross-sectional view taken along line II-II' illustrated in FIG. 1 and illustrates an embodiment which is implemented by additionally connecting at least one closed loop line to the other side of a pixel common voltage line.

Except for an additional connection structure between at least one closed loop line and a pixel common voltage line, the other elements are substantially the same as the elements of FIGS. 1 to 7. In the following description, therefore, like reference numerals refer to like elements, and their repetitive descriptions are omitted or will be briefly given. A region 'B4' illustrated in FIG. 8 is illustrated in FIG. 7.

Referring to FIGS. 1, 2, and 8, in a light emitting display apparatus according to an embodiment of the present disclosure, the other side of a pixel common voltage line CVL can be disposed at the other edge portion of a substrate 10 parallel to one edge portion of the substrate 10 with a display portion AA therebetween, and at least one closed loop line CLL can be electrically connected to the other side of the pixel common voltage line CVL at the other edge portion of the substrate 10.

In the other edge portion of the substrate 10, the at least one closed loop line CLL can be electrically connected to at least one of the other sides of a plurality of pixel common voltage lines CVL through a via hole VH passing through a passivation layer 11d, an interlayer insulation layer 11c, and a buffer layer 11a. This can be substantially the same as a structure where the at least one closed loop line CLL is electrically connected to a fourth pad connection line PCL4, at one edge portion of the substrate 10, and thus, its repetitive description is omitted or may be brief.

In the other edge portion of the substrate 10, the at least one closed loop line CLL can be electrically connected to at least one of the other sides of the plurality of pixel common voltage lines CVL through a conductive metal line CML disposed in a via hole VH. This can be substantially the same as a structure where the at least one closed loop line CLL is electrically connected to the conductive metal line CML disposed in the via hole VH, at one edge portion of the substrate 10, and thus, its repetitive description is omitted or may be brief.

Additionally, the at least one closed loop line CLL disposed at the other edge portion of the substrate 10 can be disposed in the at least one cliff pattern portion CPP. This can be substantially the same as an arrangement structure between the at least one closed loop line CLL and the at least one cliff pattern portion CPP illustrated in FIGS. 6 and 7, and thus, its repetitive description is omitted or may be brief.

The at least one closed loop line CLL according to the present disclosure can be electrically connected to each of one side and the other side of the pixel common voltage line CVL at each of the one edge portion and the other edge portion of the substrate 10, and thus, can more stably maintain an electric equipotential corresponding to the pixel common voltage line CVL. Particularly, according to the present embodiment, a pixel common voltage supplied to the plurality of pixel common voltage pads CVP disposed in a pad part PP of the substrate 10 can be supplied to the one side and the other side of each of the plurality of pixel common voltage lines CVL through the at least one closed loop line CLL, and thus, the pixel common voltage applied to the common electrode CE through the plurality of pixel common voltage lines CVL can be more uniform.

Figure 9A:
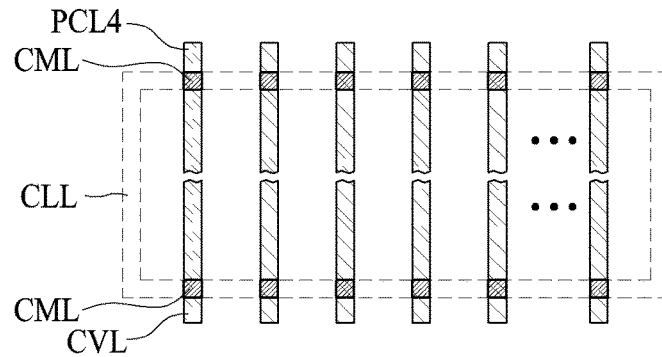
FIGS. 9A to 9C are diagrams illustrating various examples of a conductive metal line illustrated in FIGS. 7 and 8.
Figure 9B:
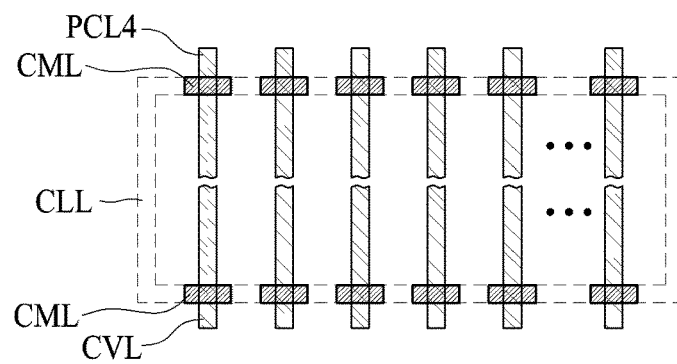
Figure 9C:
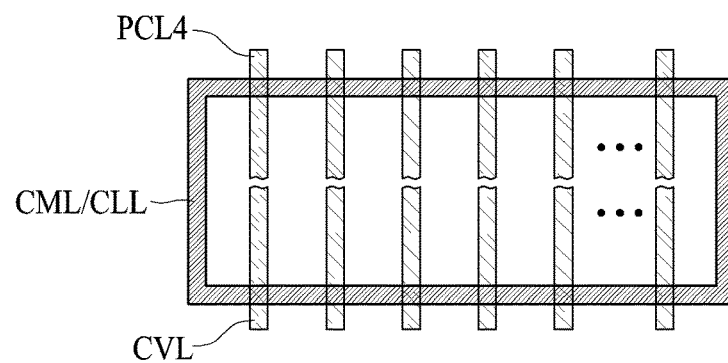

FIGS. 9A to 9C are diagrams illustrating various examples of a conductive metal line illustrated in FIGS. 7 and 8.

Referring to FIGS. 1 and 9A, a conductive metal line CML according to an embodiment can be implemented in a dot shape corresponding to an intersection portion between at least one closed loop line CLL and a fourth pad connection line PCL4, at one edge portion of a substrate 10 and can be implemented in a dot shape corresponding to an intersection portion between the at least one closed loop line CLL and the other side of each of a plurality of common voltage lines CVL, at the other edge portion of the substrate 10.

Referring to FIGS. 1 and 9B, a conductive metal line CML according to another embodiment can be implemented in a dotted-line shape where the conductive metal line CML overlaps at least one closed loop line CLL and intersects with a fourth pad connection line PCL4, at one edge portion of a substrate 10 and can be implemented in a dotted-line shape where the conductive metal line CML overlaps the at least one closed loop line CLL and intersects with the other side of each of a plurality of common voltage lines CVL, at the other edge portion of the substrate 10. In this case, as a size of the conductive metal line CML increases, a water penetration blocking path can increase, and thus, the self-light emitting device ED can be prevented from being degraded by water penetration, and thus, the reliability of the self-light emitting device ED can be enhanced.

Referring to FIGS. 1 and 9C, a conductive metal line CML according to another embodiment can be implemented in a closed loop shape (or a closed loop line shape) which overlaps all of at least one closed loop line CLL. In this case, as the conductive metal line CML has a closed loop shape, a water penetration blocking path can more increase, and thus, the self-light emitting device ED can be prevented from being degraded by water penetration, and thus, the reliability of the self-light emitting device ED can be enhanced.

In the light emitting display apparatus according to an embodiment of the present disclosure, the at least one closed loop line CLL surrounding the display portion AA can be electrically connected to at least one of the plurality of pixel common voltage lines CVL, and thus, a defect caused by static electricity flowing in from the outside can be prevented. Also, because the light emitting device layer 13 is isolated by the at least one cliff pattern portion CPP overlapping the at least one closed loop line CLL, the self-light emitting device ED can be prevented from being degraded by water penetration, and thus, the reliability of the self-light emitting device ED can be enhanced.

Figure 10:
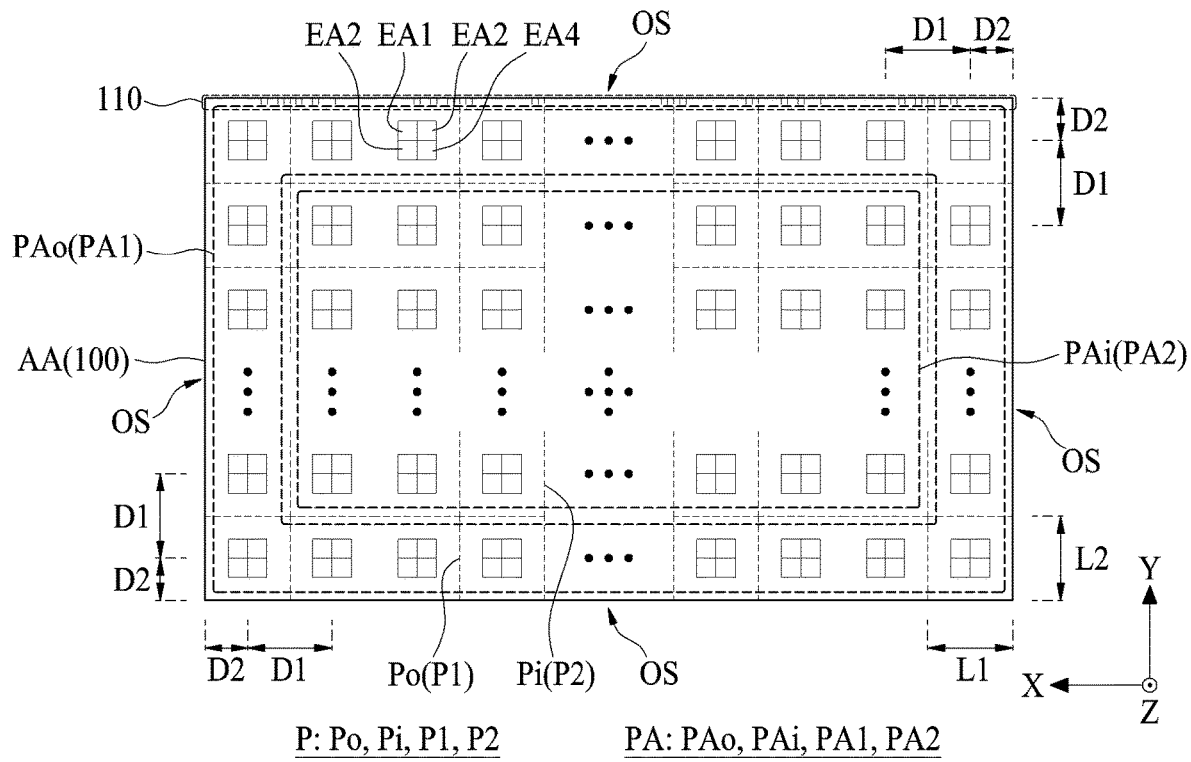
FIG. 10 is a plan view illustrating a light emitting display apparatus according to another embodiment of the present disclosure.
Figure 11:
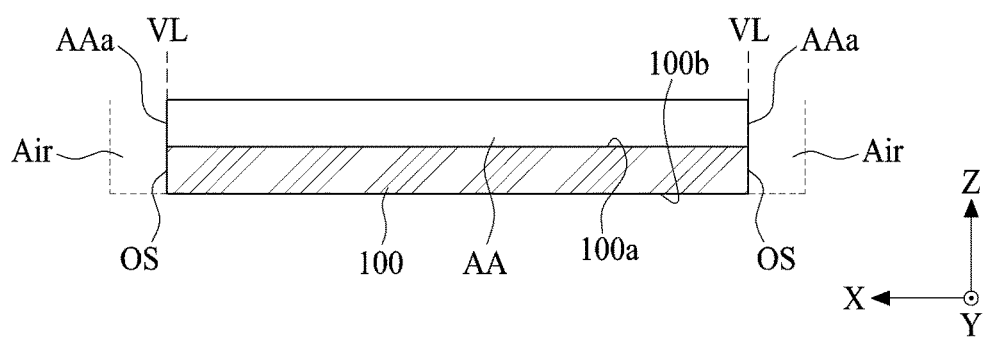
FIG. 11 is a side view schematically illustrating a light emitting display apparatus according to another embodiment of the present disclosure.

FIG. 10 is a plan view illustrating a light emitting display apparatus according to another embodiment of the present disclosure, and FIG. 11 is a side view schematically illustrating a light emitting display apparatus according to another embodiment of the present disclosure.

Referring to FIGS. 10 and 11, a light emitting display apparatus according to another embodiment of the present disclosure can include a first substrate 100 including a display area AA, and a plurality of pixels P which are arranged at a first interval D1 in the display area AA of the first substrate 100.

The first substrate 10 can include a first surface 100a, a second surface 100b, and an outer surface OS. The first surface 100a of the first substrate 100 can be defined as a front surface, a top surface, or an upper surface facing a front surface (or a forward direction) of the light emitting display apparatus. The second surface 100b of the first substrate 100 can be defined as a back surface, a rear surface, a bottom surface, or a lower surface facing a back surface (or a rearward direction) of the light emitting display apparatus. The outer surface OS of the first substrate 100 can be defined as a side surface, a lateral surface, or a sidewall, which extends along an outer periphery between the first surface 100a and the second surface 100b, faces the lateral surface (or the lateral direction) of the light emitting display apparatus, and is exposed to air. For example, when the first substrate 100 has a hexahedral structure, the outer surface OS of the first substrate 100 can include side surfaces of the hexahedral structure.

The outer surface OS of the first substrate 100 can be formed in parallel with a thickness direction Z of the light emitting display apparatus. For example, the outer surface OS of the first substrate 100 can include a first outer surface which is parallel to a first direction X, a second outer surface which is parallel to the first outer surface, a third outer surface which is parallel to a second direction Y transverse (or crossing) to the first direction X and is connected between one end of the first outer surface and one end of the second outer surface, and a fourth outer surface which is parallel to the third outer surface and is connected between the other end of the first outer surface and the other end of the second outer surface. The first direction X can be a first lengthwise direction (for example, a widthwise direction) of the first substrate 100 or the light emitting display apparatus, and the second direction Y can be a second lengthwise direction (for example, a lengthwise direction) of the first substrate 100 or the light emitting display apparatus.

The display area AA of the first substrate 100 can be an area which displays an image and can be referred to as a display portion or an active portion. A size of the display area AA can be the same as or substantially the same as the first substrate 100 (or the light emitting display apparatus). For example, a size of the display area AA can be the same as a total size of the first surface 100a of the first substrate 100. Therefore, the display area AA can be implemented (or disposed) on the whole front surface of the first substrate 100, and thus, the first substrate 100 may not include an opaque non-display area which is provided along an edge portion of the first surface 100a to surround all of the display area AA. Accordingly, a whole front surface of the light emitting display apparatus can implement the display area AA.

An end (or an outermost portion) AAa of the display area AA can overlap or can be substantially aligned with the outer surface OS of the first substrate 100. For example, a lateral surface AAa of the display portion AA can be substantially coplanar with the outer surface OS of the first substrate 100. In other words, the lateral surface of the display portion AA and the outer surface OS of the first substrate 100 can be aligned at substantially the same position. The lateral surface AAa of the display portion AA may not be surrounded by a separate mechanism and can be surrounded by only air. As another example, the lateral surface of the display portion AA can overlap or can be substantially aligned with the outer surface OS of the first substrate 100. For example, all lateral surfaces of the display portion AA can be provided in a structure which directly contacts air without being surrounded by a separate mechanism.

With respect to a thickness direction Z of the first substrate 100, an end AAa of the display area AA and a vertical extension line VL vertically extending from the outer surface OS of the first substrate 100 can overlap each other or can be aligned on substantially the same plane. For example, a first end (or an upper end) of the display area AA can be a first outer surface (or an upper sidewall) of the first substrate 100, a second end (or a lower end) of the display area AA can be a second outer surface (or a lower sidewall) of the first substrate 100, a third end (or a left end) of the display area AA can be a third outer surface (or a left sidewall) of the first substrate 100, and a fourth end (or a right end) of the display area AA can be a fourth outer surface (or a right sidewall) of the first substrate 100. Therefore, the outer surface OS of the first substrate 100 corresponding to the end AAa of the display area AA can be surrounded by air, and thus, the light emitting display apparatus according to the present disclosure can have an air-bezel structure or a non-bezel structure where the end AAa of the display area AA (or the lateral surface of the display portion AA) is surrounded by air instead of an opaque non-display area.

The display area (or the display portion) AA according to an embodiment can include a plurality of pixel areas PA.

The plurality of pixel areas PA according to an embodiment can be arranged (or disposed) at the first interval D1 in the display area AA of the first substrate 100. Two pixel areas PA adjacent to each other in the first direction X and the second direction Y of the first substrate 100 can have the same first interval D1 without an error range of a manufacturing process. The first interval D1 can be a pitch (or a pixel pitch) between two adjacent pixel areas PA. For example, the first interval D1 can be a shortest distance (or a shortest length) between center portions of two adjacent pixel areas PA. Optionally, the pixel pitch can be a size between one end and the other end of a pixel area PA parallel to the first direction X. Also, as another example, the pixel pitch can be referred to as a size between one end and the other end of a pixel area PA parallel to the second direction Y.

Each of the plurality of pixel areas PA can have a first length L1 parallel to the first direction X and a second length L2 parallel to the second direction Y. Each of the first length L1 and the second length L2 can be the same as the first interval D1. For example, the first length L1 can be referred to as a first width, a widthwise length, or a widthwise width. The second length L2 can be referred to as a second width, a lengthwise length, or a lengthwise width. The first length L1 or the second length L2 of the pixel area PA can be referred to as a pixel pitch.

A second interval D2 between each of outermost pixel areas PAo of the plurality of pixel areas PA and the outer surface OS of the first substrate 100 can be half or less of the first interval D1 so that the whole front surface of the first substrate 100 (or the whole front surface of the light emitting display apparatus) is referred to as a display area AA. For example, the second interval D2 can be a shortest distance (or a shortest length) between a center portion of the outermost pixel area PAo and the outer surface OS of the first substrate 100.

When the second interval D2 is greater than half of the first interval D1, the first substrate 100 can have a greater size than that of the display area AA by an area between an end of the outermost pixel area PAo (or the end AAa of the display area AA) and the outer surface OS of the first substrate 100, and thus, an area between the end of the outermost pixel area PAo and the outer surface OS of the first substrate 100 can be provided as a non-display area surrounding all of the display area AA. Therefore, the first substrate 100 can necessarily include a bezel area based on a non-display area surrounding all of the display area AA. On the other hand, when the second interval D2 is half or less of the first interval D1, the end of the outermost pixel area PAo (or the end AAa of the display area AA) can overlap the outer surface OS of the first substrate 100 or can be disposed in a space outside the outer surface OS of the first substrate 100, and thus, the display area AA can be implemented (or disposed) on the whole front surface of the first substrate 100.

The display area (or the display portion) AA according to an embodiment can include the outermost pixel area PAo and an internal pixel area (or an inner pixel area) PAi.

The outermost pixel area PAo can be disposed along an edge portion (or a periphery portion) of the first substrate 100 among the plurality of pixel areas PA. For example, the outermost pixel area PAo can be referred to as a first pixel area PA1.

The internal pixel area PAi can be a pixel area other than the outermost pixel area PAo among the plurality of pixel areas PA, or can be surrounded by the outermost pixel area PAo. The internal pixel area PAi can be referred to as a second pixel area PA2.

Each of a plurality of pixels P can be disposed in a corresponding pixel area PA of the plurality of pixel areas PA defined on the first surface 100a of the first substrate 100. For example, the display area AA can be a pixel array which includes the plurality of pixels P arranged on the first substrate 100. The pixels P of the pixel array can be immediately adjacent to one another in the first direction X and the second direction Y. For example, the pixels P of the pixel array can be immediately adjacent to one another in the first direction X and the second direction Y without a separation space (or a spaced apart space). As another example, a plurality of outermost pixels Po of the pixel array can match to overlap one another on the outer surface of the first substrate 100, or can be aligned on the same plane. For example, each pixel P of the pixel array can be arranged on the first substrate 100 to have a pixel pitch D1 in the first direction X and the second direction Y, and an interval D2 between a center portion of each of the outermost pixels Po and the outer surface OS of the first substrate 100 can be half or less of the pixel pitch D1.

The display area (or the display portion) AA according to an embodiment can include an outermost pixel Po and an internal pixel (or an inner pixel) Pi.

The outermost pixel Po can be disposed at the edge portion (or a periphery portion) of the first substrate 100 among the plurality of pixel areas PA. For example, the outermost pixel Po can be referred to as a first pixel P1 disposed in the outermost pixel area PAo.

The internal pixel Pi can be a pixel other than the outermost pixel Po among the plurality of pixels P, or can be disposed to be surrounded by the outermost pixel Po. For example, the internal pixel Pi can be referred to as a second pixel P2. The internal pixel Pi (or the second pixel P2) can be implemented to have a configuration or a structure, which differs from the outermost pixel Po (or the first pixel P1).

The second interval D2 between each of the outermost pixels Po of the plurality of pixels P and the outermost surface OS of the first substrate 100 can be half or less of the first interval D1 so that the whole front surface of the first substrate 100 (or the whole front surface of the light emitting display apparatus) is referred to as the display area AA. The first interval D1 can be a shortest distance (or a shortest length) between center portions of two adjacent pixels P. The second interval D2 can be a shortest distance (or a shortest length) between a center portion of the outermost pixel Po and the outer surface OS of the first substrate 100.

Each of the plurality of pixels P according to an embodiment can include first to fourth emission areas EA1 to EA4 which are disposed with respect to the central portion of the pixel P. For example, the first to fourth emission areas EA1 to EA4 can be immediately adjacent to one another in the first direction X and the second direction Y. For example, the first to fourth emission areas EA1 to EA4 can be directly contact to one another in the first direction X and the second direction Y without a separation space (or a spaced apart space).

The first to fourth emission areas EA1 to EA4 can each have a square shape and can be disposed in a 2×2 form or a quad form. According to another embodiment, the first to fourth emission areas EA1 to EA4 can each have a rectangular shape which includes a short side parallel to the first direction X and a long side parallel to the second direction Y, and for example, can be disposed a ¼ form or a ¼ stripe form.

The first emission area EA1 can be implemented to emit light of a first color, the second emission area EA2 can be implemented to emit light of a second color, the third emission area EA3 can be implemented to emit light of a third color, and the fourth emission area EA4 can be implemented to emit light of a fourth color. For example, each of the first to fourth colors can be different. For example, the first color can be red, the second color can be blue, the third color can be white, and the fourth color can be green. As another example, some of the first to fourth colors can be the same. For example, the first color can be red, the second color can be first green, the third color can be second green, and the fourth color can be blue.

Each of the first to fourth emission areas EA1 to EA4 according to an embodiment can be disposed close to a center portion of the pixel P to have a size which is less than that of each of four equal division regions of the pixel P. Each of the first to fourth emission areas EA1 to EA4 according to an embodiment can be disposed in all of four equal division regions having the same size as that of each of the four equal division regions of the pixel P.

Each of the plurality of pixels P according to another embodiment can include first to third emission areas EA1 to EA3. In this case, the first to third emission areas EA1 to EA3 can each have a rectangular shape which includes a short side parallel to the first direction X and a long side parallel to the second direction Y, and for example, can be disposed a 1×3 form or a 1×3 stripe form. For example, the first color can be red, the second color can be blue, and the third color can be green.

The light emitting display apparatus according to another embodiment of the present disclosure can further include a pad part 110 including a plurality of pads which are disposed in the display area AA of the substrate 100 and are selectively connected to the plurality of pixels P. For example, the pad part 110 can be a first pad part or a front pad part.

The pad part 110 can be included in the outmost pixels Po disposed at a first edge portion of the first surface 100a of the first substrate 100 parallel to the first direction X. For example, the outermost pixels Po disposed at the first edge portion of the first substrate 100 can include at least one of the plurality of pads. Therefore, the plurality of pads can be disposed or included within the display area AA, and thus, a non-display area (or a bezel area) based on the pad part 110 may not be formed or may not be on the first substrate 100. Therefore, the outermost pixel Po (or the first pixel P1) can include the pad part 110, and thus, can be implemented to have a configuration or a structure, which differs from the internal pixel Pi (or the second pixel P2) including no pad part 110.

For example, when the pad part 110 is not provided within the outermost pixels Po and is disposed between the outermost pixels Po and the outer surface OS of the first substrate 100, the first substrate 100 can include a non-display area (or a non-display portion) corresponding to an area where the pad part 110 is provided, and due to the non-display area, the second interval D2 between the outermost pixels Po and the outer surface OS of the first substrate 100 can be greater than half of the first interval D1, all of the first substrate 100 cannot be implemented as the display area AA, and a separate bezel (or a separate structure) for covering the non-display area can be needed. On the other hand, the pad part 110 according to the present disclosure can be disposed between the emission areas EA1 to EA4 of the outermost pixels Po and the outer surface OS of the first substrate 100 and can be included within the outermost pixels Po, and thus, a non-display area (or a bezel area) based on the pad part 110 may not be formed or may not be between the outermost pixels Po and the outer surface OS of the first substrate 100.

Therefore, the light emitting display apparatus according to another embodiment of the present disclosure can have an air-bezel structure where a whole first substrate 100 including the pad part 110 is implemented as the display area AA, and thus, all outer surfaces (or outer surfaces of the light emitting display panel) OS of the first substrate 100 aligned with an end of the display area AA are surrounded by air.

Figure 12:
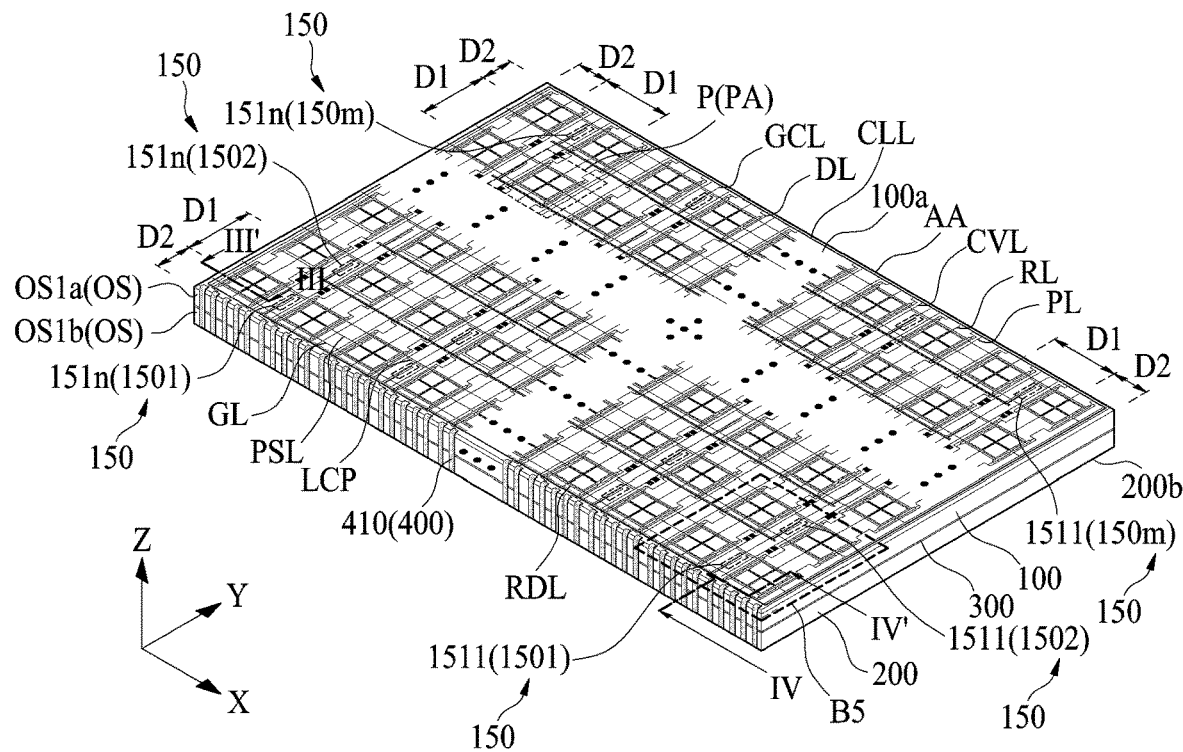
FIG. 12 is a perspective view illustrating the light emitting display apparatus illustrated in FIG. 10.
Figure 13:
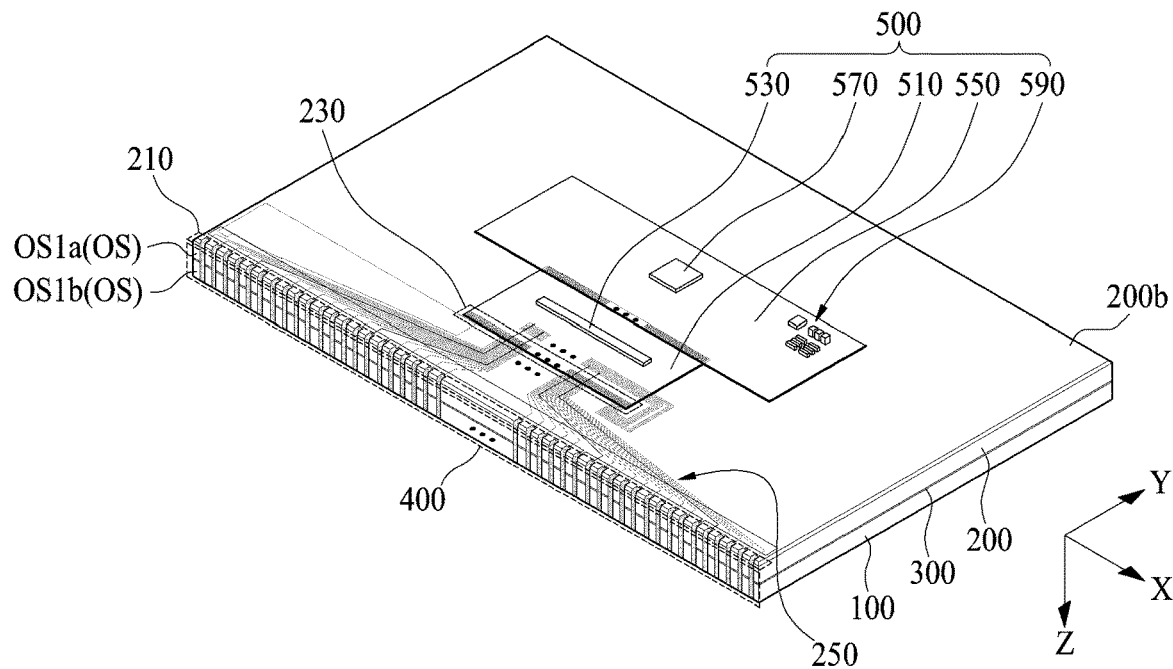
FIG. 13 is a diagram illustrating a rear surface of the light emitting display apparatus illustrated in FIG. 10.

FIG. 12 is a perspective view illustrating the light emitting display apparatus illustrated in FIG. 10, and FIG. 13 is a diagram illustrating a rear surface of the light emitting display apparatus illustrated in FIG. 10.

Referring to FIGS. 12 and 13, the light emitting display apparatus according to another embodiment of the present disclosure can include a first substrate 100, a second substrate 200, a coupling member 300, and a routing portion 400.

The first substrate 100 can be referred to as a display substrate, a pixel array substrate, an upper substrate, a front substrate, or a base substrate. The first substrate 100 can be a glass substrate, or can be a thin glass substrate or a plastic substrate, which is bendable or flexible.

The display apparatus 10 according to an embodiment can include pixel driving lines and a plurality of pixels P.

The pixel driving lines can be provided on a first surface 100a of the first substrate 100 and can transfer a signal needed for driving (emitting light) of each of the plurality of pixels P. For example, the pixel driving lines can be divided (or classified) into a plurality of data lines DL, a plurality of gate lines GL, a plurality of pixel driving power lines (or first power lines) PL, a plurality of pixel common voltage lines (or second power lines) CVL, and a plurality of reference voltage lines (or sensing lines) RL.

According to an embodiment, the plurality of data lines DL, the plurality of pixel driving power lines PL, the plurality of pixel common voltage lines CVL, and the plurality of reference voltage lines (or sensing lines) RL can be electrically connected to pads of the first pad part 110 disposed at a first edge portion among the first surface 100a of the first substrate 100 or can be electrically connected to pads of the first pad part 110 through the pad connection lines (or pad link lines).

The first pad part 110 can be included in a plurality of outermost pixels Po disposed at the first edge portion of the first substrate 100 parallel to a first direction X. Here, the first edge portion of the first surface 100a of the first substrate 100 can include a first outer surface (or one side surface) OS1a of an outer surface OS of the first substrate 100.

The first pad part 110 can include a plurality of first pads which are disposed in parallel with one another in the first direction X on a passivation layer 11d exposed at the first edge portion of the first surface 100a of the first substrate 100. The first pad part 110 is substantially the same as the pad part PP illustrated in FIGS. 1 and 2, and thus, its detailed description is omitted or may be brief.

The plurality of pixels P can be respectively disposed in a plurality of pixel areas PA which are arranged at a first interval (or a first pitch) D1 in the first direction X and a second direction Y. Each of the plurality of pixels P can include a self-light emitting device (or a self-light emitting element), which emits light on the basis of a top emission type based on a signal supplied through corresponding pixel driving line adjacent thereto and irradiates the light onto a portion above the first surface 100a of the first substrate 100, and a pixel circuit which is connected to pixel driving lines adjacent thereto to allow the self-light emitting device to emit light. For example, the pixel circuit can include a driving thin film transistor (TFT) which provides the self-light emitting device with a data current corresponding to a data signal supplied through the data line DL.

A distance between an outermost pixel of the plurality of pixels P and the outer surface OS of the first substrate 100 can be half or less of the first interval D1. A second interval D2 between a center portion of the outermost pixel and the outer surface OS of the first substrate 100 can be half or less of the first interval D1, and thus, a whole front surface of the first substrate 100 (or a w % bole front surface of the light emitting display apparatus) can be implemented as the display area AA. Accordingly, the light emitting display apparatus according to another embodiment of the present disclosure can have an air-bezel structure where the display area AA is surrounded by air.

The first substrate 100 according to an embodiment can further include a gate driving circuit 150 which is disposed in the display area AA.

The gate driving circuit 150 according to an embodiment can be implemented with a shift register including a plurality of stage circuit units 1501 to 150m, where m is an integer of 2 or more. For example, the light emitting display apparatus according to the present disclosure can include a shift register which is disposed in the display area AA of the first substrate to supply the scan signal to the pixel P.

Each of the plurality of stage circuit units 1501 to 150m can include a plurality of branch circuits 1511 to 151n which are disposed apart from one another in each horizontal line of the first substrate 100 in the first direction X, where m is an integer of 2 or more. The plurality of branch circuits 1511 to 151n can include at least one TFT (or a branch TFT) and can be disposed between two adjacent pixels P (or pixel areas PA) within one horizontal line along the first direction X. For example, the branch circuits 1511 to 151n can be disposed one by one between two adjacent pixels P (or pixel areas PA) within one horizontal line along the first direction X. Each of the plurality of stage circuit units 1501 to 150m can generate the scan signal in a predetermined order in response to a gate control signal supplied through the first pad part 110 and can supply the scan signal to the gate line GL. For example, the gate control signal can include a start signal, a plurality of shift clocks, at least one gate driving voltage, and at least one gate common voltage.

The first substrate 100 can further include a plurality of gate control line groups GCL connected to the gate driving circuit 150. Each of the gate control line groups GCL can be selectively connected to the plurality of branch circuits 1511 to 15n respectively disposed in the plurality of stage circuit units 1501 to 150m.

The gate control line group GCL according to an embodiment can include a start signal line, a plurality of shift clock lines, at least one gate driving voltage line, and at least one gate common voltage line. The plurality of shift clock lines according to an embodiment can be divided (or classified)

into a plurality of scan clock lines and a plurality of carry clock lines. Here, the plurality of carry clock lines can be omitted.

The first pad part 110 can further include a first gate pad part including a plurality of first gate pads connected to the gate control line group GCL.

The first substrate 100 according to an embodiment can include at least one closed loop line CLL disposed along an edge portion of a display area AA.

The at least one closed loop line CLL can be disposed to have a closed loop shape along an outer portion of an outermost pixel Po of a plurality of pixels P disposed in the display area AA. The at least one closed loop line CLL can be electrically connected to at least one of a plurality of pixel common voltage pads respectively connected to a plurality of pixel common voltage lines CVL among a plurality of first pads disposed in a first pad part 110, or can be electrically connected to at least one of the plurality of pixel common voltage lines CVL.

The second substrate 200 can be referred to as a wiring substrate, a link substrate, a lower substrate, a rear substrate, or link glass. The second substrate 200 can be a glass substrate, or can be a thin glass substrate or a plastic substrate, which is bendable or flexible. The second substrate 200 according to an embodiment can include the same material as that of the first substrate 100. For example, a size of the second substrate 200 can be the same as or substantially the same as that of the first substrate 100.

The second substrate 200 can be coupled (or connected) to a second surface 100b of the first substrate 100 by using the coupling member 300. The second substrate 200 can include a front surface which faces the second surface 100b of the first substrate 100 or is coupled to the coupling member 300, a rear surface (or a back surface) 200b opposite to the front surface, and an outer surface OS between the front surface and the rear surface 200b. The second substrate 200 can transfer a signal to the pixel driving lines and can increase the stiffness of the first substrate 100.

The light emitting display apparatus according to another embodiment of the present disclosure can further include a second pad part 210 disposed on the second substrate 200.

The second pad part 210 can be disposed at a first edge portion of a rear surface 200b of the second substrate 200 overlapping the first pad part 110 disposed on the first substrate 100. The first edge portion of the rear surface 200b of the second substrate 200 can include a first outer surface (or one surface) OS1b of the outer surface OS of the second substrate 200.

The second pad part 210 can include a plurality of second pads which are arranged at a certain interval in the first direction X to respectively overlap the pads of the first pad part 110.

The light emitting display apparatus according to another embodiment of the present disclosure can further include a third pad part (or an input pad part) 230 and a link line portion 250 which are disposed on the second substrate 200.

The third pad part 230 can be disposed on the rear surface 200b of the second substrate 200. For example, the third pad part 230 can be disposed at a middle portion adjacent to the first edge portion among the rear surface 200b of the second substrate 200. The third pad part 230 according to an embodiment can include a plurality of third pads (or input pads) which are apart from one another by a certain interval.

The link line portion 250 can be disposed between the second pad part 210 and the third pad part 230 on the rear surface 200b of the second substrate 200. For example, the link line portion 250 can include a plurality of link lines which individually (or respectively) connect the second pads of the second pad part 210 to the third pads of the third pad part 230.

The coupling member 300 can be disposed between the first substrate 100 and the second substrate 200. The first substrate 100 and the second substrate 200 can be opposite-bonded to each other by the coupling member 300. For example, the second surface 100b of the first substrate 100 can be coupled to one surface of the coupling member 300, and the front surface of the second substrate 200 can be coupled to the other surface of coupling member 300. Accordingly, the first substrate 100 and the second substrate 200 opposite-bonded (or coupled) to each other by the coupling member 300 can be referred to as a light emitting display panel.

The routing portion 400 can be disposed to surround the outer surface OS of the first substrate 100 and the outer surface OS of the second substrate 200. The routing portion 400 according to an embodiment can include a plurality of routing lines which are disposed on each of the first outer surface (or one surface) OS1a of the outer surface OS of the first substrate 100 and the first outer surface (or one surface) OS1b of the outer surface OS of the second substrate 200. Each of the plurality of routing lines can be formed to surround each of the first outer surface OS1a of the first substrate 100 and the first outer surface OS1b of the second substrate 200. For example, the plurality of routing lines can be respectively (or individually) connected between the pads of the first pad part 110 and the pads of the second pad part 210.

The light emitting display apparatus according to another embodiment of the present disclosure can further include a driving circuit unit 500.

The driving circuit unit 500 can drive (or emit light) the pixels P disposed on the first substrate 100 on the basis of digital video data and a timing synchronization signal supplied from a display driving system to allow the display area AA to display an image corresponding to image data. The driving circuit unit 500 can be connected to the third pad part 230 disposed on the rear surface 200b of the second substrate 200 and can output, to the third pad part 230, a data signal, a gate control signal, and a driving power for driving (or emitting light) the pixels P disposed on the first substrate 100. For example, the driving circuit unit 500 can have a size which is less than that of the second substrate 200, and thus, can be covered by the second substrate 200 and may not be exposed at the outer surface of the second substrate 200 or the outer surface of the first substrate 100.

The driving circuit unit 500 according to an embodiment can include a flexible circuit film 510, a driving integrated circuit (IC) 530, a printed circuit board (PCB) 550, a timing controller 570, and a power circuit unit 590. The driving circuit unit 500 having such a configuration can be substantially the same as the driving circuit unit 3 illustrated in FIG. 1, and thus, its repetitive description is omitted or will be briefly given below.

The flexible circuit film 510 can be connected to the third pad part 230 disposed on the rear surface 200b of the second substrate 200.

The driving IC 530 can be mounted on the flexible circuit film 510. The driving IC 530 can be connected to the plurality of data lines DL, the plurality of pixel driving power lines PL, the plurality of pixel common voltage lines CVL, and a plurality of reference voltage lines RL via the flexible circuit film 510, the third pad part 230, the link line portion 250, the second pad part 210, the routing portion 400, and the first pad part 110. The driving IC 530 can receive subpixel data and a data control signal provided from the timing controller 570, and convert the subpixel data into an analog data signal on the basis of the data control signal to supply the analog data signal to a corresponding data line DL. Also, the driving IC 530 can generate a reference voltage, a pixel driving voltage, and a pixel common voltage and can supply the reference voltage, the pixel driving voltage, and the pixel common voltage to corresponding voltage line RL, power line PL, and common voltage line CVL.

The driving IC 530 can sense a characteristic value of a driving TFT disposed in the pixel P through the plurality of reference voltage lines RL disposed on the first substrate 100, generate sensing raw data corresponding to a sensing value, and provide the sensing raw data to the timing controller 570.

The PCB 550 can be connected to the other edge portion of the flexible circuit film 510. The PCB 550 can transfer a signal and power between elements of the driving circuit unit 500.

The timing controller 570 can be mounted on the PCB 550 and can receive the digital video data and the timing synchronization signal provided from the display driving system through a user connector disposed on the PCB 550.

The timing controller 570 can align the digital video data on the basis of the timing synchronization signal to generate pixel data matching a pixel arrangement structure disposed in the display area AA and can provide the generated pixel data to the driving IC 530.

The timing controller 570 can generate each of the data control signal and the gate control signal on the basis of the timing synchronization signal, control a driving timing of the driving IC 530 on the basis of the data control signal, and control a driving timing of the gate driving circuit 150 on the basis of the gate control signal. For example, the timing synchronization signal can include a vertical synchronization signal, a horizontal synchronization signal, a data enable signal, and a main clock (or a dot clock).

The timing controller 570 can drive each of the driving IC 530 and the gate driving circuit 150 on the basis of an external sensing mode during a predetermined external sensing period, generate compensation data for compensating for a characteristic variation of the driving TFT of each pixel P on the basis of the sensing raw data provided from the driving IC 530, and modulate pixel data on the basis of the generated compensation data. For example, the timing controller 570 can drive each of the driving IC 530 and the gate driving circuit 150 on the basis of the external sensing mode for each external sensing period corresponding to a blank period (or a vertical blank period) of the vertical synchronization signal.

The power circuit unit 590 can be mounted on the PCB 550 and can generate various source voltages needed for displaying an image on the pixels P by using an input power supplied from the outside to provide the generated source voltage to a corresponding circuit.

Figure 14:
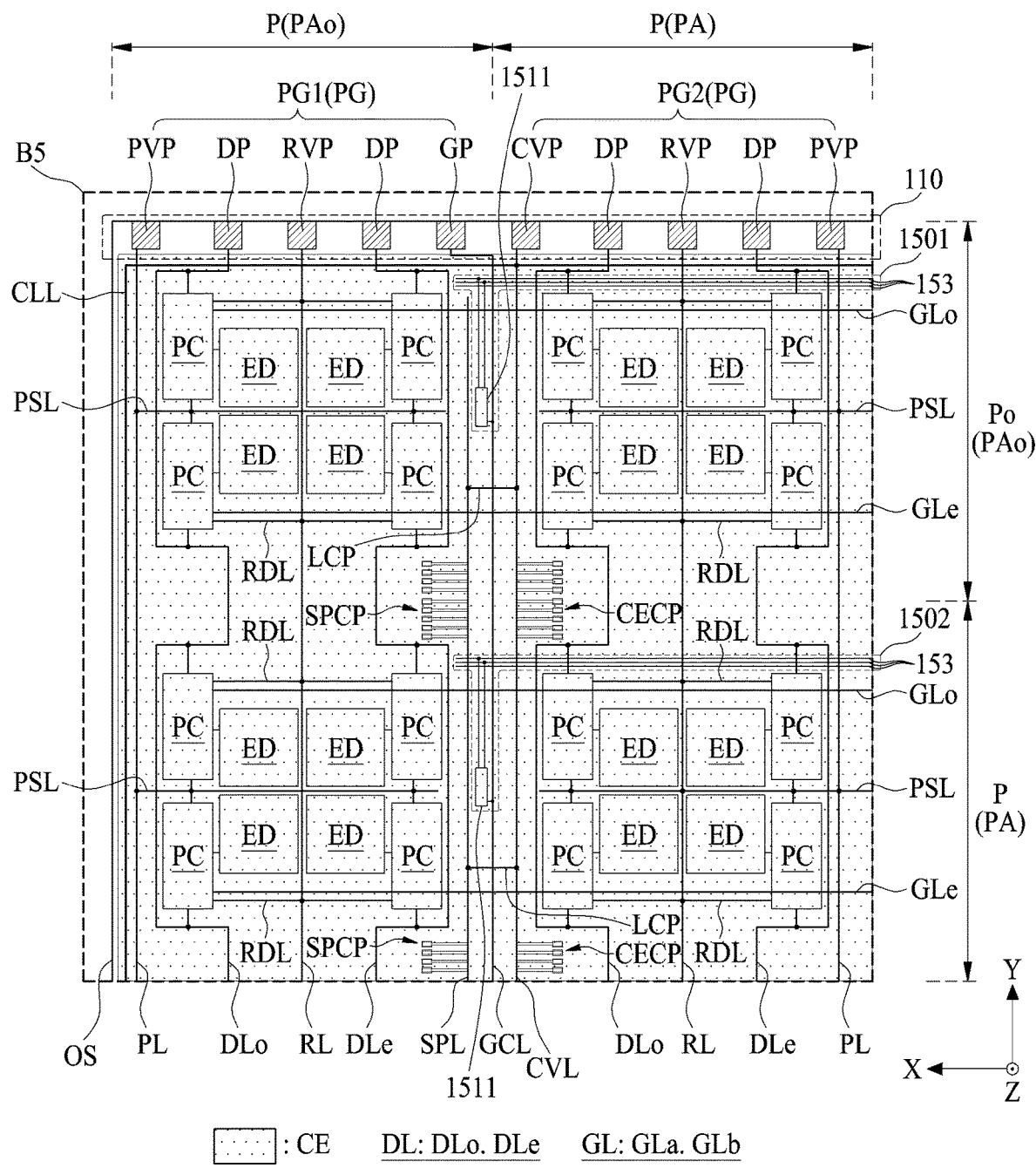
FIG. 14 is an enlarged view of a region 'B5' illustrated in FIG. 12.
Figure 15:
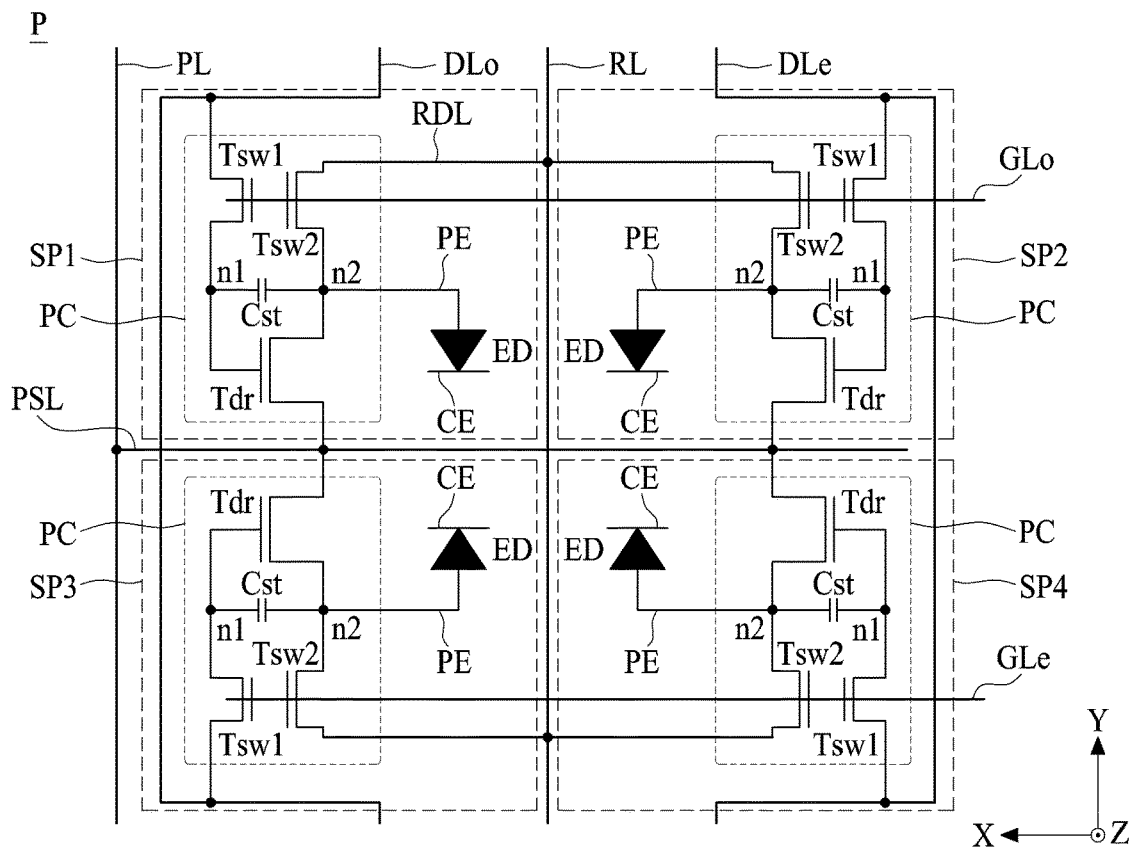
FIG. 15 is a circuit diagram illustrating one pixel illustrated in FIGS. 12 and 14.

FIG. 14 is an enlarged view of a region 'B5' illustrated in FIG. 12, and FIG. 15 is a circuit diagram illustrating one pixel illustrated in FIGS. 12 and 14. FIGS. 14 and 15 are diagrams for describing a plurality of pixels disposed on a first substrate.

Referring to FIGS. 12, 14, and 15, a first substrate 100 according to an embodiment of the present disclosure can include a plurality of data lines DL, a plurality of gate lines GL, a plurality of pixel driving power lines PL, a plurality of pixel common voltage lines CVL, a plurality of pixels P, a common electrode CE, a plurality of common electrode contact portions CECP, a first pad part 110, and at least one closed loop line CLL.

The plurality of data lines DL can extend long in a second direction Y and can be disposed apart from one another by a predetermined interval in a display area AA of the first substrate 100 along the first direction X. For example, in the plurality of data lines DL, an odd-numbered data line DLo can be disposed at a first edge portion of each of a plurality of pixel areas PA arranged on the first substrate 100 along the second direction Y, and an even-numbered data line DLe can be disposed at a second edge portion of each of the plurality of pixel areas PA arranged on the first substrate 100 along the second direction Y.

The plurality of gate lines GL can extend long in the first direction X and can be disposed apart from one another by a predetermined interval in the display area AA of the first substrate 100 along the second direction Y. For example, an odd-numbered gate line GLo among the plurality of gate lines GL can be disposed at a third edge portion of each of the plurality of pixel areas PA arranged on the first substrate 100 along the first direction X. An even-numbered gate line GLe among the plurality of gate lines GL can be disposed at a fourth edge portion of each of the plurality of pixel areas PA arranged on the first substrate 100 along the first direction X.

The plurality of pixel driving power lines PL can extend long in the second direction Y and can be disposed apart from one another by a predetermined interval in the display area AA of the first substrate 100 along the first direction X. For example, in the plurality of pixel driving power lines PL, an odd-numbered pixel driving power line PL can be disposed at a first edge portion of an odd-numbered pixel area PA with respect to the first direction X, and an even-numbered pixel driving power line PL can be disposed at a second edge portion of an even-numbered pixel area PA with respect to the first direction X.

Two adjacent pixel driving power lines PL among the plurality of pixel driving power lines PL can be connected to a plurality of power sharing lines PSL disposed in each of pixel areas PA arranged in the second direction Y. For example, the plurality of pixel driving power lines PL can be electrically connected to one another by the plurality of power sharing lines PSL, and thus, can have a ladder structure or a mesh structure. The plurality of pixel driving power lines PL can have a ladder structure or a mesh structure, and thus, the voltage drop (IR drop) of the pixel driving power caused by a line resistance of each of the plurality of pixel driving power lines PL can be prevented or minimized. Accordingly, the light emitting display apparatus according to the present disclosure can prevent or minimize the degradation in image quality caused by a deviation of the pixel driving power supplied to each of the pixels P.

Each of the plurality of power sharing lines PSL can branch from an adjacent pixel driving power line PL in parallel with the first direction X and can be disposed in a middle region of each pixel area PA.

The plurality of pixel common voltage lines CVL can extend long in the second direction Y and can be disposed apart from one another by a predetermined interval in the display area AA of the first substrate 100 along the first direction X. For example, each of the plurality of pixel common voltage lines CVL can be disposed at a first edge portion of an even-numbered pixel area PA with respect to the first direction X.

The plurality of reference voltage lines RL can extend long in the second direction Y and can be disposed apart from one another by a predetermined interval in the display area AA of the first substrate 100 in the first direction X. Each of the plurality of reference voltage lines RL can be disposed in a center region of each of the pixel areas PA arranged in the second direction Y.

Each of the plurality of reference voltage lines RL can be shared by two adjacent subpixels ((SP1, SP2) (SP3, SP4)) in the first direction X in each pixel area PA. To this end, each of the plurality of reference voltage lines RL can include a reference branch line RDL. The reference branch line RDL can branch (or protrude) to the two adjacent subpixels ((SP1, SP2) (SP3, SP4)) in the first direction X in each pixel area PA and can be electrically connected to the two adjacent subpixels ((SP1, SP2) (SP3, SP4)).

The plurality of pixels P can be respectively disposed in the plurality of pixel areas PA which is defined to have an equal size in the display area AA of the substrate 100. Each of the plurality of pixels P can include at least three subpixels. For example, each of the plurality of pixels P can include first to fourth subpixels SP1 to SP4.

Each of the first to fourth subpixels SP1 to SP4 can respectively include a plurality of emission areas EA1 to EA4 and a circuit area.

The pixel circuit PC according to an embodiment can be disposed in a circuit area of the pixel area PA and can be connected to gate lines GLo and GLe adjacent thereto, data lines DLo and DLe adjacent thereto, and the pixel driving power line PL. For example, a pixel circuit PC disposed in a first subpixel SP1 can be connected to an odd-numbered data line DLo and an odd-numbered gate line GLo, a pixel circuit PC disposed in a second subpixel SP2 can be connected to an even-numbered data line DLe and an odd-numbered gate line GLo, a pixel circuit PC disposed in a third subpixel SP3 can be connected to an odd-numbered data line DLo and an even-numbered gate line GLe, and a pixel circuit PC disposed in a fourth subpixel SP4 can be connected to an even-numbered data line DLe and an even-numbered gate line GLe.

The pixel circuit PC of each of the first to fourth subpixels SP1 to SP4 can sample a data signal supplied from corresponding data lines DLo and DLe in response to a scan signal supplied from corresponding gate lines GLo and GLe and can control a current flowing from the pixel driving power line PL to the self-light emitting device ED on the basis of a sampled data signal.

The pixel circuit PC according to an embodiment can sample a data signal by using three TFTs Tsw1, Tsw2, and Tdr and one capacitor Cst illustrated in FIG. 3, and can control a current flowing in the self-light emitting device ED on the basis of a sampled data signal. The pixel circuit PC is substantially the same as the pixel circuit PC illustrated in FIG. 3, and thus, its repetitive description is omitted or may be brief.

The pixel circuit PC of each of the first to fourth subpixels SP1 to SP4 according to another embodiment can be implemented as a pixel driving chip through a semiconductor manufacturing process, disposed in a circuit area of a corresponding pixel area PA, and connected to gate lines GLo and GLe adjacent thereto, data lines DLo and DLe adjacent thereto, and the pixel driving power line PL. For example, the pixel driving chip can be a minimum-unit microchip or one chipset and can be a semiconductor packaging device which includes two or more transistors and one or more capacitors and has a fine size. Such a pixel driving chip can sample a data signal supplied from corresponding data lines DLo and DLe in response to a scan signal supplied from corresponding gate lines GLo and GLe and can control a current flowing from the pixel driving power line PL to the self-light emitting device ED on the basis of a sampled data signal.

The self-light emitting device ED can be disposed in an emission area EA of the pixel area PA, electrically connected to the pixel circuit PC, and electrically connected to the common electrode CE. The self-light emitting device ED can emit light with a current flowing from the pixel circuit PC to the common electrode CE. The self-light emitting device ED is substantially the same as the self-light emitting device ED illustrated in FIG. 3, and thus, its repetitive description is omitted or may be brief.

The common electrode CE can be disposed in a display area AA of the first substrate 100 and can be electrically connected to the self-light emitting device ED of each of the plurality of pixels P. For example, the common electrode CE can be disposed in a region, other than a first pad part 110 disposed in the first substrate 10, of the display area AA of the first substrate 100.

Each of the plurality of common electrode contact portions CECP can be disposed between two adjacent pixels P of the plurality of pixels P respectively overlapping the plurality of pixel common voltage lines CVL and can electrically connect the common electrode CE to a corresponding pixel common voltage line CVL of the plurality of pixel common voltage lines CVL. With respect to the second direction Y, each of the plurality of common electrode contact portions CECP according to an embodiment can be electrically connected to a corresponding pixel common voltage line CVL of the plurality of pixel common voltage lines CVL at a portion between the plurality of pixels P or at a boundary portion between the plurality of pixels P and can be electrically connected to a portion of the common electrode CE, and thus, can electrically connect the common electrode CE to a corresponding pixel common voltage line CVL of the plurality of pixel common voltage lines CVL.

Each of the plurality of common electrode contact portions CECP can be disposed between two adjacent pixels P of the plurality of pixels P to electrically connect the common electrode CE to each of the plurality of pixel common voltage lines CVL, and thus, can prevent or minimize the voltage drop (JR drop) of the pixel common power caused by a surface resistance of the common electrode CE. Accordingly, the light emitting display apparatus according to the present disclosure can prevent or minimize the degradation in image quality caused by a deviation of the pixel driving power supplied to each of the pixels P arranged in the display area AA.

According to an embodiment, each of the plurality of common electrode contact portions CECP can be formed along with a pixel electrode PE having a three-layer structure so as to be electrically connected to each of the plurality of pixel common voltage lines CVL. Each of the plurality of common electrode contact portions CECP can be connected to the common electrode CE through a side contact structure having a "("-shaped cross-sectional structure or a "<"-shaped cross-sectional structure. For example, when each of the plurality of common electrode contact portions CECP is formed of first to third metal layers, each of the plurality of common electrode contact portions CECP can include a side contact structure corresponding to an undercut structure or a tapered structure formed on the lateral surface of the first metal layer and the second metal layer by an etching speed difference between the first metal layer and the second metal layer. For example, when each of the plurality of common electrode contact portions CECP is formed of first to fourth metal layers, each of the plurality of common electrode contact portions CECP can include a side contact structure corresponding to an undercut structure or a tapered structure formed on the lateral surface of the second metal layer and the third metal layer by an etching speed difference between the second metal layer and the third metal layer.

The first pad part 110 can be disposed at a first edge portion among the first surface of the first substrate 100 parallel to the first direction X. The first pad part 110 can be disposed at a third edge portion of each of outermost pixel areas PAo disposed at the first edge portion of the first substrate 100. With respect to the second direction Y, an end of the first pad part 110 can overlap or can be aligned with an end of each of the outermost pixel areas PAo. Therefore, the first pad part 110 can be included (or disposed) in each of the outermost pixel areas PAo disposed at the first edge portion of the first substrate 100, and thus, a non-display area (or a bezel area) based on the first pad part 110 may not be formed or may not be on in the first substrate 100.

The first pad part 110 can include a plurality of first pads which are disposed in parallel with one another in the first direction X on the first edge portion of the first substrate 100.

The first pad part 110 according to an embodiment can include a plurality of pad groups PG which are arranged in the order of a pixel driving voltage pad PVP, a data pad DP, a reference voltage pad RVP, a data pad DP, a gate pad GP, a pixel common voltage pad CVP, a data pad DP, a reference voltage pad RVP, a data pad DP, and a pixel driving voltage pad PVP along the first direction X.

Each of the plurality of pad groups PG can be connected to two adjacent pixels P disposed along the first direction X. For example, the plurality of pad groups PG can include a first pad group PG1 including a pixel driving voltage pad PVP, a data pad DP, a reference voltage pad RVP, a data pad DP, and a gate pad GP continuously disposed in an odd-numbered pixel area PA along the first direction X, and a second pad group PG2 including a pixel common voltage pad CVP, a data pad DP, a reference voltage pad RVP, a data pad DP, and a pixel driving voltage pad PVP continuously disposed in an even-numbered pixel area PA along the first direction X.

The first substrate 100 according to the present disclosure can further include a plurality of secondary power lines SPL and a plurality of secondary power contact portions SPCP.

Each of the plurality of secondary power lines SPL can extend long in the second direction Y and can be disposed adjacent to a corresponding pixel common voltage line CVL of the plurality of pixel common voltage lines CVL. Each of the plurality of secondary power lines SPL can be electrically connected to an adjacent pixel common voltage line CVL without being electrically connected to the pixel common voltage pad CVP and can be supplied with a pixel common power through the adjacent pixel common voltage line CVL. To this end, the first substrate 100 according to the present disclosure can further include a plurality of line connection patterns LCP which electrically connect a pixel common power line CPL and a secondary power line SPL adjacent to each other.

Each of the plurality of line connection patterns LCP can be disposed on the first substrate 100 so that the line connection pattern LCP and a pixel common voltage line CVL and a secondary power line SPL adjacent to each other intersect with each other and can electrically connect a pixel common voltage line CVL and a secondary power line SPL adjacent to each other by using a line jumping structure. For example, one side of each of the plurality of line connection patterns LCP can be electrically connected to a portion of the secondary power line SPL through a first line contact hole formed in an insulation layer on the secondary power line SPL, and the other side of each of the plurality of line connection patterns LCP can be electrically connected to a portion of the pixel common voltage line CVL through a second line contact hole formed in an insulation layer on the pixel common voltage line CVL.

Each of the plurality of secondary power contact portions SPCP can be disposed between the plurality of pixels P respectively overlapping the plurality of secondary power lines SPL and can electrically connect the common electrode CE to each of the plurality of secondary power lines SPL. With respect to the second direction Y, each of the plurality of secondary power contact portions SPCP according to an embodiment can be electrically connected to each of the plurality of secondary power lines SPL at a portion between the plurality of pixels P or a boundary portion between the plurality of pixels P and can be electrically connected to a portion of the common electrode CE, and thus, can electrically connect the common electrode CE to each of the plurality of secondary power lines SPL. Therefore, the common electrode CE can be additionally connected to each of the plurality of secondary power lines SPL through the secondary power contact portions SPCP. Accordingly, the light emitting display apparatus according to the present disclosure can prevent or minimize the degradation in image quality caused by a deviation of the pixel common power supplied to each of the pixels P arranged in the display area AA. Also, in the light emitting display apparatus according to the present disclosure, although the pixel common voltage pad CVP connected to each of the plurality of secondary power lines SPL is not additionally disposed (or formed), the pixel common power can be supplied to the common electrode CE in each of the plurality of pixel areas PA. Each of the plurality of secondary power contact portions SPCP can electrically connect a corresponding secondary power line of the plurality of secondary power lines SPL to the common electrode CE through a side contact structure having a side contact structure having a ")"-shaped cross-sectional structure or a "("-shaped cross-sectional structure, like each of the plurality of common electrode contact portions CECP.

The at least one closed loop line CLL can be disposed to have a closed loop shape along an outer portion of an outermost pixel P of the plurality of pixels Po disposed in the display area AA. The at least one closed loop line CLL can be electrically connected to at least one of the plurality of pixel common voltage pads, or can be electrically connected to at least one of the plurality of pixel common voltage lines CVL. Accordingly, the at least one closed loop line CLL can discharge static electricity, flowing in from the outside, to the pixel common voltage pad CVP and/or the pixel common voltage line CVL, and thus, can prevent a defect caused by the static electricity.

Figure 16:
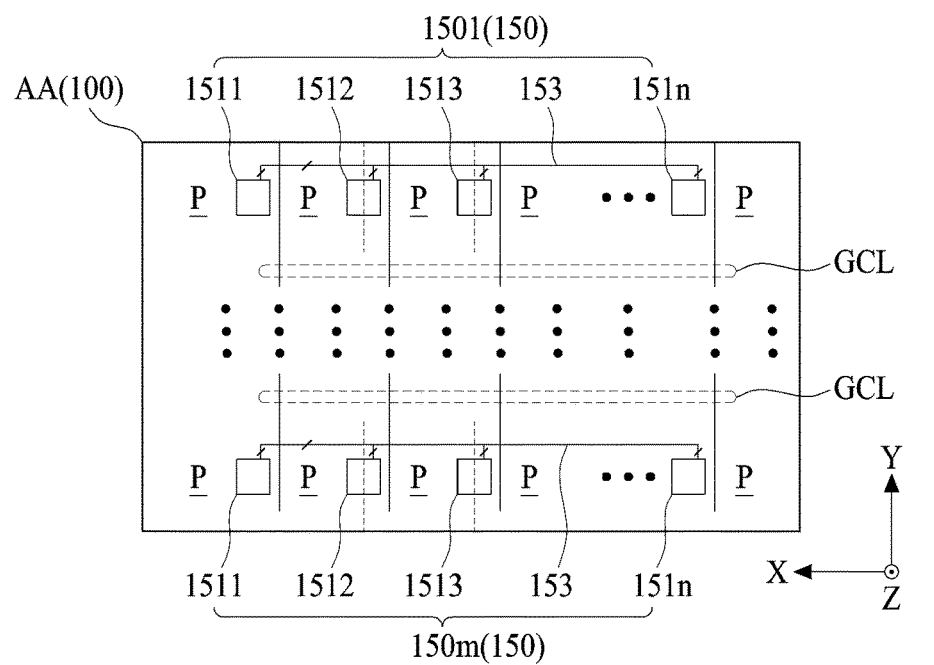
FIG. 16 is a diagram illustrating a gate driving circuit disposed in a display area illustrated in FIGS. 12 and 14.

FIG. 16 is a diagram illustrating a gate driving circuit disposed in a display area illustrated in FIGS. 12 and 14.

Referring to FIGS. 12, 14, and 16, a gate driving circuit 150 according to another embodiment of the present disclosure can be disposed in a display area AA of a first substrate 100 and can be connected to a gate control line group GCL disposed in the display area AA of the first substrate 100.

First, the gate control line group GCL can include the gate driving circuit 150 and a plurality of gate control lines in the display area AA of the first substrate 100.

The gate control line group GCL according to an embodiment can include a start signal line, a plurality of shift clock lines, at least one gate driving voltage line, and at least one gate common voltage line. The lines of the gate control line group GCL can extend long in the second direction Y and can be disposed apart from one another by a predetermined interval in the display area AA of the first substrate 100 in the first direction X. For example, each of the lines of the gate control line group GCL can be disposed between one or more pixels P in the first direction X.

A gate driving circuit 150 according to an embodiment can be implemented with a shift register including a plurality of stage circuit units 1501 to 150m.

Each of the plurality of stage circuit units 1501 to 150m can be disposed apart from one another in each horizontal line of a first surface 100a of the first substrate 100 in the first direction X and can be dependently connected to one another in the second direction Y. Each of the plurality of stage circuit units 1501 to 150m can generate a scan signal in a predetermined order in response to a gate control signal supplied through the first pad part 110 and the gate control line group GCL and can supply the scan signal to a corresponding gate line GL.

Each of the plurality of stage circuit units 1501 to 150m according to an embodiment can include a plurality of branch circuits 1511 to 151n and a branch network 153.

The plurality of branch circuits 1511 to 151n can be selectively connected to the lines of the gate control line group GCL through the branch network 153 and can be electrically connected to one another through the branch network 153. Each of the plurality of branch circuits 1511 to 151n can generate the scan signal on the basis of a gate control signal supplied through each of lines of the gate control line group GCL, and can supply the scan signal to a corresponding gate line GL.

Each of the plurality of branch circuits 1511 to 151n can include at least one of a plurality of TFTs configuring one of the stage circuit units 1501 to 150m. Each of the plurality of branch circuits 1511 to 151n can be disposed in a circuit area between two adjacent pixels P or in a circuit area between two pixels P, in each horizontal line of the first substrate 100, but is not limited thereto and can be disposed in a circuit area between one or more pixels P on the basis of the number of TFTs configuring each of the stage circuit units 1501 to 150m and the number of pixels P disposed one horizontal line.

The branch network 153 can be disposed in each horizontal line of the first substrate 100 and can electrically connect the plurality of branch circuits 1511 to 151n. The branch network 153 according to an embodiment can include a plurality of control nodes and a network line.

The plurality of control nodes can be disposed in each horizontal line of the first substrate 100 and can be selectively connected to the plurality of branch circuits 1511 to 151n in one horizontal line. For example, the plurality of control nodes can be disposed in an upper edge region (or a lower edge region) among pixel areas arranged in each horizontal line of the first substrate 100.

The network line can be selectively connected to the lines of the gate control line group GCL disposed in the first substrate 100 and can be selectively connected to the plurality of branch circuits 1511 to 151n. For example, the network line can transfer the gate control signal, supplied through the lines of the gate control line group GCL, to corresponding branch circuits 1511 to 151n and can transfer a signal between the plurality of branch circuits 1511 to 151n.

As described above, according to the present embodiment, because the gate driving circuit 150 is disposed in the display area AA of the first substrate 100, a second interval D2 between a center portion of the outermost pixel area PAo and each of the outer surfaces OS of the first substrate can be equal to or less than half of a first interval (or a pixel pitch) D1 between adjacent pixel areas PA. For example, when the gate driving circuit 150 is not disposed in the display area AA of the substrate 10 and is disposed at an edge portion of the first substrate 100 as illustrated in FIG. 1, the second interval D2 may not be equal to or less than half of the first interval D1. Accordingly, in the light emitting display apparatus according to another embodiment of the present disclosure, the gate driving circuit 150 can be distributed and disposed in the display area AA of the first substrate 100, and thus, the second interval D2 can be implemented to be equal to or less than half of the first interval D1.

Figure 17:
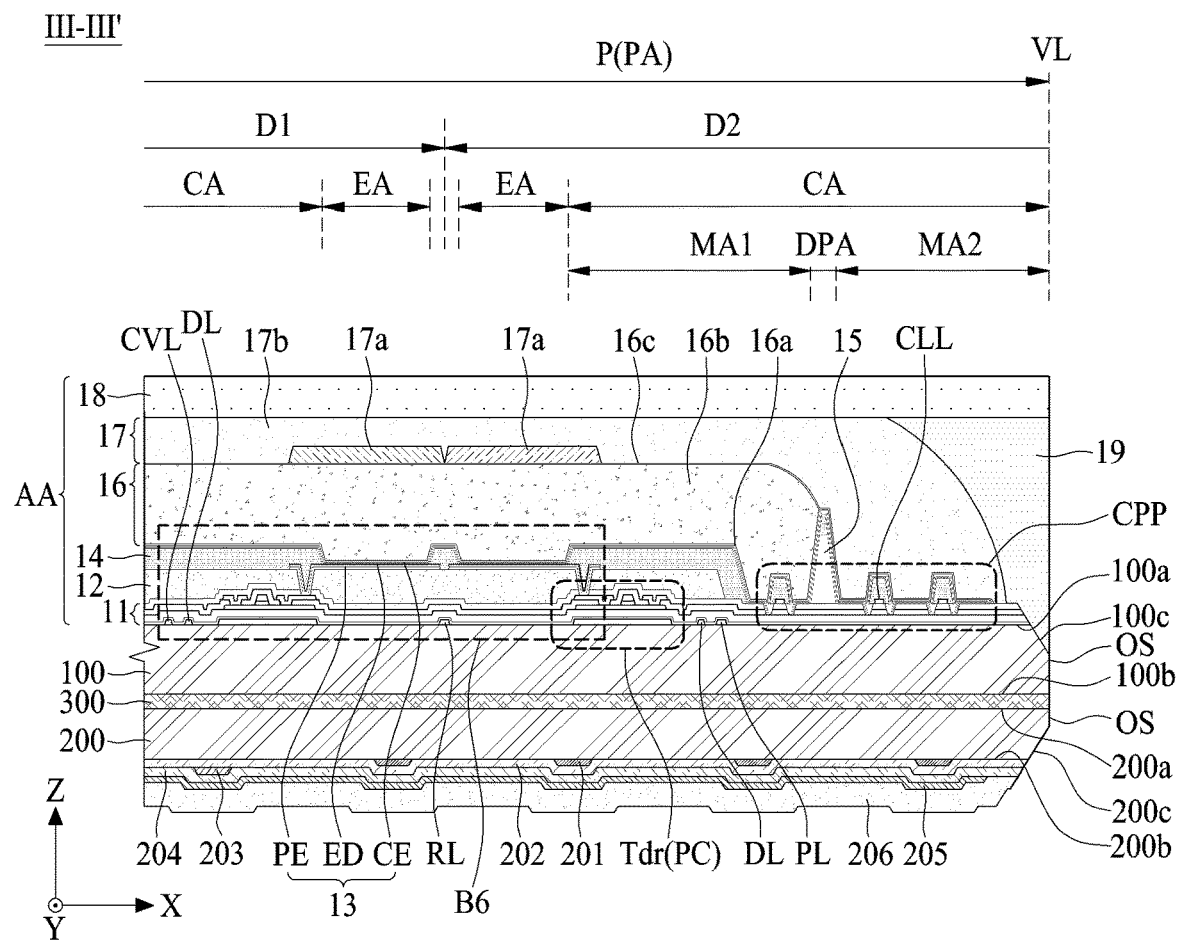
FIG. 17 is a cross-sectional view taken along line III-III' illustrated in FIG. 12.
Figure 18:
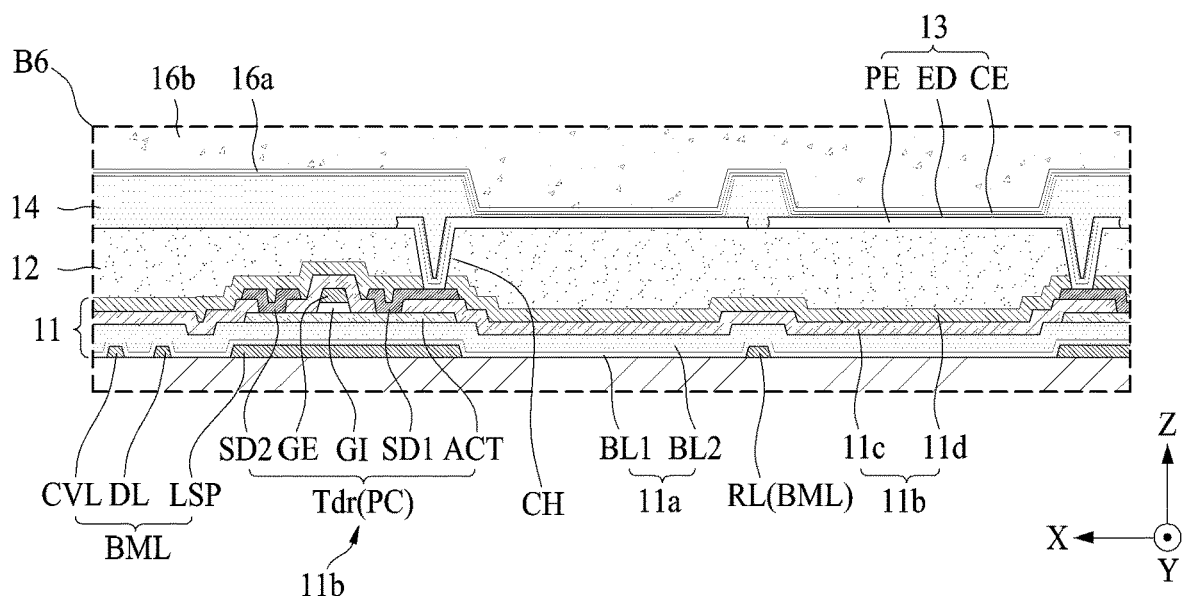
FIG. 18 is an enlarged view of a region 'B6' illustrated in FIG. 17.

FIG. 17 is a cross-sectional view taken along line III-III' illustrated in FIG. 12, and FIG. 18 is an enlarged view of a region 'B6' illustrated in FIG. 17. In the following description, elements which are the same as or correspond to the elements of FIG. 12 are referred to by like reference numerals, and their repetitive descriptions are omitted or will be briefly given.

Referring to FIGS. 12, 17, and 18, a light emitting display apparatus according to another embodiment of the present disclosure can include a first substrate 100 and a second substrate 200 which are coupled (or bonded) to each other by a coupling member 300. In describing the first substrate 100 and the second substrate 200, elements which are the same as or correspond to the elements of FIG. 12 are referred to by like reference numerals, and their repetitive descriptions are omitted or will be briefly given below.

The first substrate 100 according to an embodiment can include a display portion AA.

The display portion AA can include a circuit layer 11, a planarization layer 12, a light emitting device layer 13, a bank 14, a dam pattern 15, at least one closed loop line CLL, an encapsulation layer 16, a wavelength conversion layer 17, a functional film 18, a side sealing member 19, and at least one cliff pattern portion CPP. Except for an arrangement structure of a pixel circuit PC and a self-light emitting device ED of a pixel P, the elements disposed in the display portion AA are substantially the same as the elements disposed in the display portion AA disposed on the substrate 10 illustrated in FIGS. 4 to 7. In the following description, therefore, like reference numerals refer to like elements, and their repetitive descriptions are omitted or will be briefly given.

The circuit layer 11 can be disposed on a first surface 100a of the first substrate 100. The circuit layer 11 can be referred to as a pixel array layer or a TFT array layer. The circuit layer 11 according to an embodiment can include a lower metal layer BML, a buffer layer 11a, and a circuit array layer 11b.

The lower metal layer BML can be used as a pixel driving line which is disposed in a second direction Y on the first surface 100a of the first substrate 100. For example, the lower metal layer BML can be formed on the first surface 10a of the first substrate 100, and then, can be patterned as a plurality of data lines DL, a plurality of pixel driving power lines PL, a plurality of pixel common voltage lines CVL, a plurality of reference voltage lines RL, a light blocking pattern LSP, and the gate control line group GCL by using a patterning process.

The buffer layer 11a can be disposed on the first surface 100a of the first substrate 100 to cover the lower metal layer BML. The buffer layer 11a can include a first buffer layer BL1 covering the lower metal layer BML and a second buffer layer BL2 covering the first buffer layer BL1.

The pixel array layer 11b can include a pixel circuit PC including a driving TFT Tdr disposed in each of a plurality of pixel areas PA on the buffer layer 11a.

The driving TFT Tdr disposed in each of the plurality of pixel areas PA can include an active layer ACT, a gate insulation layer GI, a gate electrode GE, an interlayer insulation layer 11c, a first source/drain electrode SD1, a second source/drain electrode SD2, and a passivation layer 11d. Each of first and second switching TFTs Tsw1 and Tsw2 configuring the pixel circuit PC can be formed along with the driving TFT Tdr, and thus, their detailed descriptions are omitted or may be brief.

A source/drain metal layer implementing the source/drain electrodes SD1 and SD2 can be used as a pixel driving line which is disposed in a first direction X. For example, the source/drain metal layer can be formed on the first surface 100a of the first substrate 100, and then, can be patterned as a gate line GL, a network line and a plurality of control nodes of a branch network 153, a plurality of power sharing lines PSL, a plurality of line connection patterns LCP, and a reference branch line RDL through a patterning process.

The light emitting device layer 13 can be disposed on the planarization layer 12 and can emit light toward the first surface 100a of the first substrate 100 on the basis of a top emission type.

The light emitting device layer 13 according to an embodiment can include a pixel electrode PE, a self-light emitting device ED, and a common electrode CE.

The pixel electrode PE can be disposed on the planarization layer 12 overlapping an emission area EA of each of the plurality of pixel areas PA. The pixel electrode PE can be patterned and disposed in an island shape in each pixel area PA and can be electrically connected to the first source/drain electrode SD1 of the driving TFT Tdr of a corresponding pixel circuit PC. One side of the pixel electrode PE can extend from the emission area EA of the pixel area PA to the first source/drain electrode SD1 of the driving TFT Tdr disposed in a circuit area CA and can be electrically connected to the first source/drain electrode SD1 of the driving TFT Tdr through an electrode contact hole CH provided in the planarization layer 12.

A metal layer implementing the pixel electrode PE can be used as at least one closed loop line CLL and pads PVP, DP, RVP, DP, GP, and CVP of a first pad part 110. For example, the metal layer implementing the pixel electrode PE can be formed on the first surface 100a of the first substrate 100, and then, can be patterned as the at least one closed loop line CLL and the pads PVP, DP, RVP, DP, GP, and CVP of the first pad part 110 through a patterning process.

The self-light emitting device ED can be formed on the pixel electrode PE and can directly contact the pixel electrode PE. The self-light emitting device ED can be a common layer which is formed in common in each of a plurality of subpixels SP so as not to be distinguished by subpixel SP units. The self-light emitting device ED can react on a current flowing between the pixel electrode PE and the common electrode CE to emit white light.

The common electrode CE can be formed on the self-light emitting device ED and can directly contact the self-light emitting device ED or can electrically and directly contact the self-light emitting device ED. The common electrode CE can include a transparent conductive material which transmits light emitted from the self-light emitting device ED.

The bank 14 can be disposed on the planarization layer 12 to cover an edge portion of the pixel electrode PE. The bank 14 can define an emission area EA (or an opening portion) of each of the plurality of subpixels SP and can electrically isolate pixel electrodes PE disposed in adjacent subpixels SP. The bank 14 can be formed to cover an electrode contact hole CH disposed in each of the plurality of pixel areas PA. The bank 104 can be covered by the self-light emitting device ED.

The dam pattern 15 can be disposed on the circuit layer 11 at an edge portion of the first substrate 100 to have a closed loop shape or a closed loop line shape. For example, the dam pattern 15 can be disposed on a passivation layer 11d of the circuit layer 11. The dam pattern 15 can prevent the spread or overflow of the encapsulation layer 16. The dam pattern 15 can be included within outermost pixels Po (or outermost pixel areas PAo) disposed at an edge portion of the first substrate 100 among a plurality of pixels P (or a plurality of pixel area PA). In this case, a portion of the dam pattern 105 can be disposed (or implemented) between the first pad part 110 disposed in the first substrate 100 and an emission area EA of each of the outermost pixels Po (or the outermost pixel area PAo).

The first substrate 100 according to an embodiment can further include a first margin area MA1, a second margin area MA2, and a dam pattern area DPA.

The first margin area MA1 can be disposed between an emission area EA of the outermost pixel Po and the dam pattern 15. The first margin area MA1 can have a first width between an end of the emission area EA (or the bank 104) of the outermost pixel Po and the dam pattern 15 on the basis of a shadow area (or a tail portion of the self-light emitting device) of the self-light emitting device ED inevitably occurring in a process of forming the self-light emitting device ED. Accordingly, the dam pattern 15 can be implemented to be apart from the end of the emission area EA by the first width of the first margin area MA1 with respect to the first direction X.

The second margin area MA2 can be disposed between the outer surface OS of the first substrate 100 and the dam pattern 15. The second margin area MA2 can have a second width between the outer surface OS of the first substrate 100 and the dam pattern 15 on the basis of the reliability margin of the self-light emitting device ED against water. Accordingly, the dam pattern 15 can be implemented to be apart from the outer surface OS of the first substrate 100 by the second width of the second margin area MA2 with respect to the first direction X.

The second margin area MA2 according to an embodiment can include a pad margin area overlapping the first pad part 110 disposed at a first edge portion of the first surface 100a of the first substrate 100.

The dam pattern area DPA can be disposed between the first margin area MA1 and the second margin area MA2. The dam pattern area DPA can have a third width corresponding to a width of a lowermost bottom surface (or a bottom surface) of the dam pattern 15.

A width of each of the first margin area MA1, the second margin area MA2, and the dam pattern area DPA can be implemented so that a second interval D2 between a center portion of the outermost pixel and the outer surface OS of the first substrate 100 is half or less of a first interval (or a pixel pitch) D1 between two adjacent pixel areas PA, with respect to the first direction X.

The encapsulation layer 16 can be disposed on a portion other than an outermost edge portion of the first surface 100a of the first substrate 100 to cover the light emitting device layer 13. For example, the encapsulation layer 16 can be implemented to surround all of a front surface and lateral surfaces of the light emitting device layer 13. The encapsulation layer 16 according to an embodiment can include first to third encapsulation layer 16a, 16b, and 16c.

The wavelength conversion layer 17 can convert a wavelength of light incident from the emission area EA of each of the plurality of pixel areas PA. For example, the wavelength conversion layer 17 can convert white light, which is incident from the emission area EA, into colored light corresponding to a corresponding pixel P.

The wavelength conversion layer 17 according to an embodiment can include a plurality of wavelength conversion patterns 17a and a protection layer 17b.

The plurality of wavelength conversion patterns 17a can be disposed on the encapsulation layer 16 disposed in the emission area EA of each of the plurality of pixel areas PA. The plurality of wavelength conversion patterns 17a can be divided (or classified) into a red light filter which converts white light into red light, a green light filter which converts white light into green light, and a blue light filter which converts white light into blue light.

The protection layer 17b can be implemented to cover the wavelength conversion patterns 17a and to provide a flat surface on the wavelength conversion patterns 17a.

Alternatively, the wavelength conversion layer 17 can be changed to a wavelength conversion sheet having a sheet form and can be disposed on the encapsulation layer 16. In this case, the wavelength conversion sheet (or a quantum dot sheet) can include the wavelength conversion patterns 17a disposed between a pair of films. For example, when the wavelength conversion layer 17 includes a quantum dot which re-emits colored light set in a subpixel, the light emitting device layer 13 of a subpixel can be implemented to emit white light or blue light.

The functional film 18 can be disposed on the wavelength conversion layer 17. For example, the functional film 18 can be coupled to the wavelength conversion layer 17 by a transparent adhesive member. The functional film 18 according to an embodiment can further include at least one of an anti-reflection layer (or an anti-reflection film), a barrier layer (or a barrier film), and a light path control layer (or a light path control film).

The side sealing member 19 can be formed between the first substrate 100 and the functional film 18 and can cover all of side (or lateral) surfaces of each of the circuit layer 11, the planarization layer 12, and the wavelength conversion layer 17. For example, the side sealing member 19 can cover all of side surfaces of each of the circuit layer 11, the planarization layer 12, and the wavelength conversion layer 17 which are exposed at the outside of the light emitting display apparatus, between the functional film 18 and the first substrate 100. Also, the side sealing member 19 can cover a first chamfer 100c which is formed (or disposed) at a corner portion between the first surface 100a and the outer surface OS of the first substrate 100 through a chamber process. For example, each of the outermost outer surface of the first substrate 100, an outer surface of the side sealing member 19, and an outer surface of the functional film 18 can be disposed (or aligned) on the same vertical line VL.

The at least one cliff pattern portion CPP can be disposed near the dam pattern 15 to have a closed loop shape surrounding the display portion AA. The at least one cliff pattern portion CPP according to an embodiment can be disposed in at least one of an inner region and an outer region of the dam pattern 15. The at least one cliff pattern portion CPP can isolate (or disconnect) the self-light emitting device ED of the light emitting device layer 13 disposed at a portion of the outermost pixel Po to block a lateral water penetration path, thereby preventing lateral water penetration. The at least one cliff pattern portion CPP can include a tapered structure, which is implemented by a patterning process of forming a trench pattern in the interlayer insulation layer 11c and the passivation layer 11d disposed near the dam pattern 15, and an eaves structure disposed on the tapered structure. The at least one cliff pattern portion CPP is substantially the same as the cliff pattern portion CPP illustrated in FIGS. 4 to 7, and thus, its detailed description is omitted or may be brief.

The at least one closed loop line CLL can be implemented to overlap the at least one cliff pattern portion CPP. In this case, the at least one closed loop line CLL can be electrically connected to at least one of the plurality of pixel common voltage pads CVP disposed in the first pad part 110 or can be electrically connected to at least one of the plurality of pixel common voltage lines CVL, at one edge portion and the other edge portion of the first substrate 100. The at least one closed loop line CLL can be disposed on the at least one cliff pattern portion CPP at a portion, other than the one edge portion and the other edge portion, of the first substrate 100.

The second substrate 200 according to an embodiment can include a metal pattern layer connected to the routing portion 400 and an insulation layer which insulates the metal pattern layer.

The metal pattern layer (or a conductive pattern layer) can include a plurality of metal layers. The metal pattern layer according to an embodiment can include a first metal layer 201, a second metal layer 203, and a third metal layer 205. The insulation layer can include a plurality of insulation layers. For example, the insulation layer can include a first insulation layer 202, a second insulation layer 204, and a third insulation layer 206. The insulation layer can be referred to as a rear insulation layer or a pattern insulation layer.

The first metal layer 201, the second metal layer 203, and the third metal layer 205 can be used as pads of the second pad part 210, pads of the third pad part 230, and link lines of the link line portion 250, which are disposed on the rear surface 200b of the second substrate 200. For example, the first metal layer 201 can be used as some link lines of the plurality of link lines, and the third metal layer 205 can be used as pads and the other link lines of the plurality of link lines. The second metal layer 203 can be used as a jumping line (or a bridge line) for electrically connecting link lines disposed on different layers.

The first insulation layer 202 can be implemented on the rear surface 200b of the second substrate 200 to cover the first metal layer 201. The second insulation layer 204 can be implemented on the rear surface 200b of the second substrate 200 to cover the second metal layer 203. The third insulation layer 206 can be implemented on the rear surface 200b of the second substrate 200 to cover the third metal layer 205.

The coupling member 300 can be disposed between the first substrate 100 and the second substrate 200. Therefore, the first substrate 100 and the second substrate 200 can be opposite-bonded to each other by a coupling member 300. The coupling member 300 according to an embodiment can be a transparent adhesive member or a double-sided tape including an OCA or an OCR. According to another embodiment, the coupling member 300 can include a glass fiber The coupling member 300 according to an embodiment can be disposed in a whole space between the first substrate 100 and the second substrate 200. For example, all of the second surface 100b of the first substrate 100 can be coupled to all of one surface of the coupling member 300, and all of a front surface 200a of the second substrate 200 can be coupled to all of the other surface of the coupling member 300.

The coupling member 300 according to another embodiment can be disposed in a pattern structure between the first substrate 100 and the second substrate 200. For example, the coupling member 300 can have a line pattern structure or a mesh pattern structure. The mesh pattern structure can further include a bent portion which discharges an air bubble, occurring between the first substrate 100 and the second substrate 200 in a process of bonding the first substrate 100 to the second substrate 200, to the outside.

Figure 19:
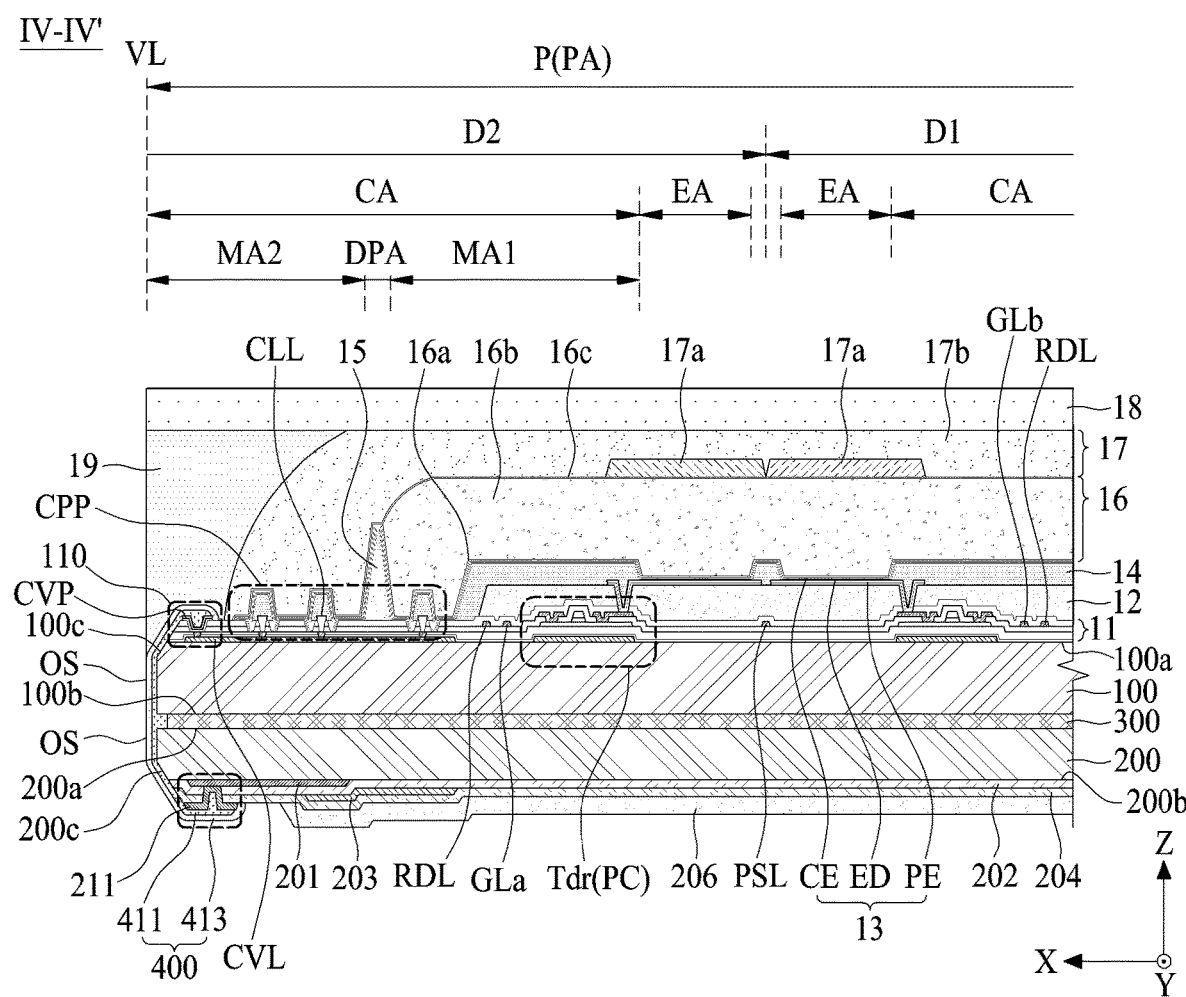
FIG. 19 is a cross-sectional view taken along line IV-IV' illustrated in FIG. 12.

FIG. 19 is a cross-sectional view taken along line IV-IV' illustrated in FIG. 12 and is a diagram for describing a cross-sectional structure of a first pad part, a second pad part, and a routing portion of a light emitting display apparatus according to another embodiment of the present disclosure. In describing FIG. 19, elements which are the same or correspond to the elements of FIG. 12 are referred to by like reference numerals, and their repetitive descriptions are omitted or will be briefly described below.

Referring to FIGS. 12, 13, 14, and 19, in a light emitting display apparatus according to another embodiment of the present disclosure, a first pad part 110 can include a plurality of pads PVP, DP, RVP, GP, and CVP disposed at a first edge portion of a first surface 10a of a first substrate 100. For example, each of the pads PVP, DP, RVP, GP, and CVP of the first pad part 110 can be electrically connected to a corresponding line through a pad contact hole. For example, each of a plurality of pixel common voltage pads CVP disposed in the first pad part 110 can be individually connected to a corresponding pixel common voltage line CVL of a plurality of pixel common voltage lines CVL through a pad contact hole.

The plurality of pixel common voltage pads CVP or a pad connection line connected between each of the plurality of pixel common voltage pads CVP and one side of a corresponding pixel common voltage line of the plurality of pixel common voltage lines CVL can be electrically connected to at least one closed loop line CLL. For example, at one edge portion of the first substrate 100 including the first pad part 110, the at least one closed loop line CLL can be electrically connected to at least one of one sides of the plurality of pixel common voltage lines CVL through a via hole passing through a passivation layer 11d, an interlayer insulation layer 11c, and a buffer layer 11a. This can be substantially the same as the at least one closed loop line CLL illustrated in FIG. 6, and thus, its repetitive description is omitted or may be brief. Also, at the other edge portion of the first substrate 100 opposite to one edge portion of the first substrate 100, the at least one closed loop line CLL can be electrically connected to at least one of the other sides of the plurality of pixel common voltage lines CVL through a via hole passing through the passivation layer 11d, the interlayer insulation layer 11c, and the buffer layer 11a. This can be substantially the same as the at least one closed loop line CLL illustrated in FIG. 8, and thus, its repetitive description is omitted or may be brief.

The at least one closed loop line CLL can be disposed in the at least one cliff pattern portion CPP and can be electrically connected to at least one of the other sides of the plurality of pixel common voltage lines CVL through a via hole disposed in the at least one cliff pattern portion CPP. Also, the at least one closed loop line CLL can be electrically connected to at least one of the other sides of the plurality of pixel common voltage lines CVL through a conductive metal layer disposed in a via hole of the buffer layer 11a overlapping the at least one cliff pattern portion CPP. An arrangement structure (or a connection structure) between the closed loop line CLL, the cliff pattern portion CPP, and the pixel common voltage line CVL can be substantially the same as an arrangement structure (or a connection structure) between the closed loop line CLL, the cliff pattern portion CPP, and the pixel common voltage line CVL illustrated in FIGS. 6 and 7, and thus, its repetitive description is omitted or may be brief.

In the light emitting display apparatus according to another embodiment of the present disclosure, a second pad part 210 can include a plurality of second pads 211 which are disposed at a first edge portion, overlapping the first pad part 110, of a rear surface 200b of the second substrate 200.

Each of the plurality of second pads 211 can be electrically connected to a corresponding link line through a pad contact hole disposed in a first insulation layer 202 and/or a second insulation layer 204 disposed on the rear surface 200b of the second substrate 200. Also, the plurality of second pads 211 can be respectively and individually connected to the pads PVP, DP, RVP, GP, and CVP of the first pad part 110 through a routing portion 400.

The routing portion 400 can be disposed to surround an outer surface OS of the first substrate 100 and an outer surface OS of the second substrate 200. For example, the routing portion 400 can be disposed on each of a first outer surface (or one surface) OS1a of the outer surface OS of the first substrate 100 and a first outer surface (or one surface) OS1b of the outer surface OS of the second substrate 200.

The routing portion 400 according to an embodiment can include a plurality of routing lines 411 which are disposed on each of the first outer surface (or one surface) OS1a of the outer surface OS of the first substrate 100 and the first outer surface (or one surface) OS1b of the outer surface OS of the second substrate 200.

Each of the plurality of routing lines 411 can be formed to surround each of the first outer surface OS1a of the first substrate 100 and the first outer surface OS1b of the second substrate 200. For example, each of the plurality of routing lines 411 can be formed through a printing process using a conductive paste. For example, each of the plurality of routing lines 411 can be formed through a printing process using an Ag paste, but is not limited thereto.

In each of the plurality of routing lines 411, one end portion thereof can surround a first chamfer 100c and each of the pads PVP, DP, RVP, GP, and CVP of the first pad part 110 disposed at a first edge portion of the first substrate 100, the other end portion thereof can surround a second chamfer 200c and the second pad 211 of the second pad part 210 disposed at a first edge portion of the second substrate 200, and a center portion thereof between the one end portion and the other end portion can surround each of the first outer surface OS1a of the first substrate 100 and the first outer surface OS1b of the second substrate 200.

The routing portion 400 according to an embodiment of the present disclosure can further include an edge coating layer 413.

The edge coating layer 413 can be implemented to cover the plurality of routing lines 411. The edge coating layer 413 according to an embodiment can be implemented to cover all of the first edge portion and the first outer surface OS1a of the first substrate 100 and the first edge portion and the first outer surface OS1b of the second substrate 200, in addition to the plurality of routing lines 411. The edge coating layer 413 can prevent the corrosion of each of the plurality of routing lines 411 including a metal material or electrical short circuit between the plurality of routing lines

411. Also, the edge coating layer 413 can prevent or minimize the reflection of external light caused by the plurality of routing lines 411 and the pads of the first pad part 110. The edge coating layer 413 according to an embodiment can include a light blocking material including black ink.

A top surface of the edge coating layer 413 covering the first chamfer 100c of the first substrate 100 can be covered by the side sealing member 19.

An outer surface of the edge coating layer 413 can be an outermost outer surface of the first substrate 100, and thus, each of the outermost outer surface of the first substrate 100, an outer surface of the side sealing member 19, and an outer surface of the functional film 18 can be disposed on the same vertical line VL.

The light emitting display apparatus according to another embodiment of the present disclosure can have the same effect as that of the light emitting display apparatus illustrated in FIGS. 1 to 9C and can have an air-bezel structure or a non-bezel structure where the display area AA is surrounded by air instead of an opaque non-display area.

Figure 20:
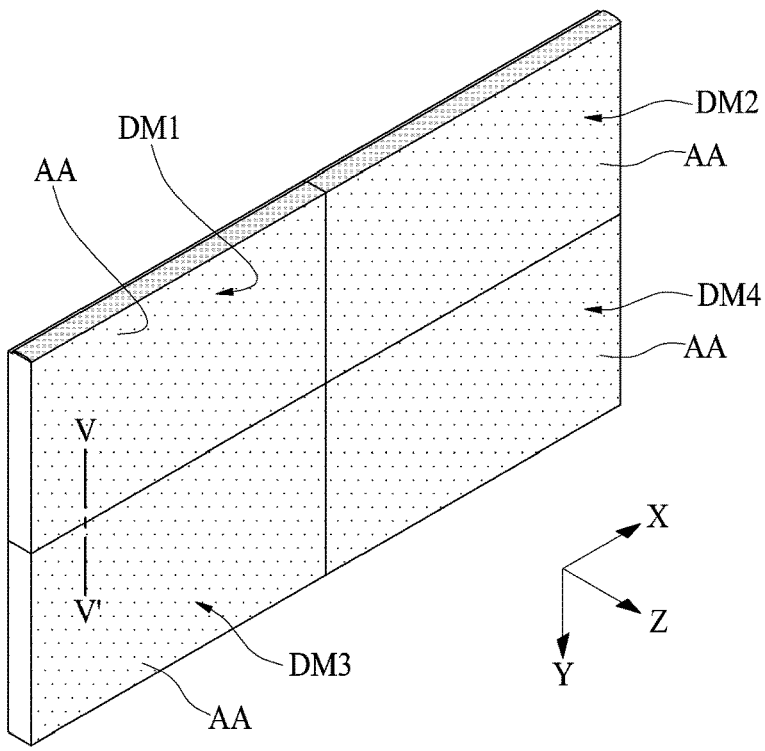
FIG. 20 is a diagram illustrating a multi-screen display apparatus according to an embodiment of the present disclosure.
Figure 21:
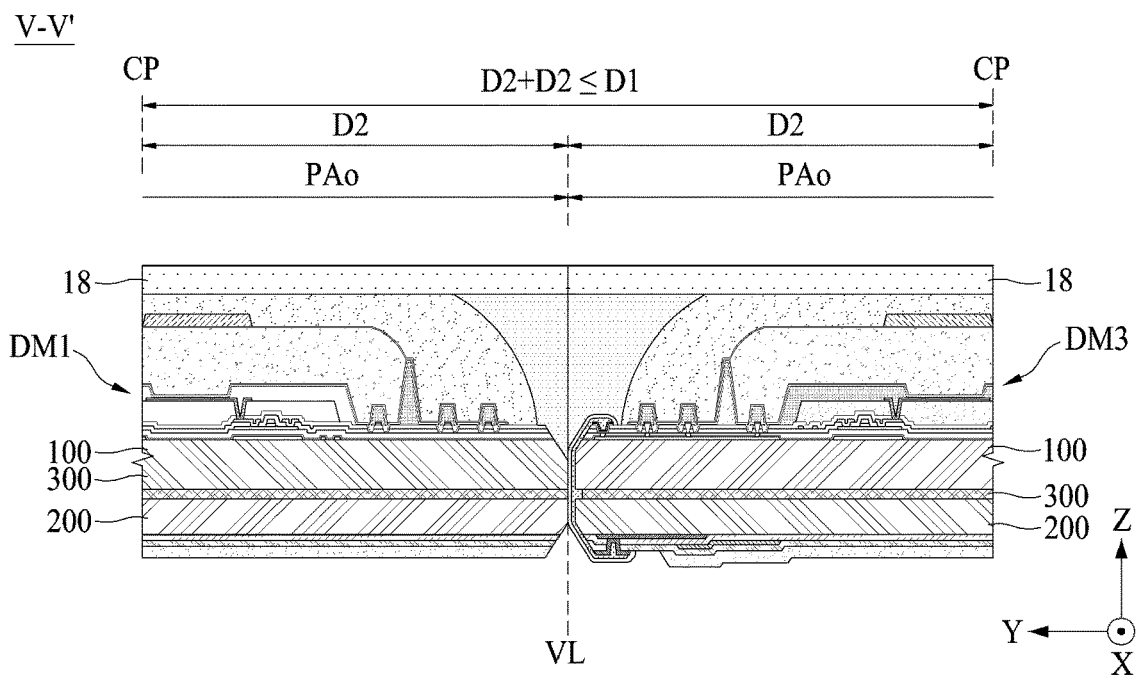
FIG. 21 is a cross-sectional view taken along line V-V' illustrated in FIG. 20.

FIG. 20 is a diagram illustrating a multi-screen display apparatus according to an embodiment of the present disclosure, and FIG. 21 is a cross-sectional view taken along line V-V' illustrated in FIG. 20. FIGS. 20 and 21 illustrate a multi-screen display apparatus implemented by tiling the display apparatus according to another embodiment of the present disclosure illustrated in FIGS. 10 and 19.

Referring to FIGS. 20 and 21, the multi-screen display apparatus according to an embodiment of the present disclosure can include a plurality of display modules DM1 to DM4.

The plurality of display modules DM1 to DM4 can each display an individual image or can divisionally display one image. Each of the plurality of display modules DM1 to DM4 can include the display apparatus according to another embodiment of the present disclosure illustrated in FIGS. 10 and 19, and thus, its repetitive description is omitted or may be brief.

The plurality of display modules DM1 to DM4 can be tiled on a separate tiling frame to contact each other at a side surface thereof. For example, the plurality of display modules DM1 to DM4 can be tiled to have an N×M form (where N is a positive integer of 2 or more and M is a positive integer of 2 or more), thereby implementing a multi-screen display apparatus having a large screen.

Each of the plurality of display modules DM1 to DM4 may not include a bezel area (or a non-display area) surrounding all of a display area AA where an image is displayed, and can have an air-bezel structure where the display area AA is surrounded by air. For example, in each of the plurality of display modules DM1 to DM4, all of a first surface of a first substrate 100 can be implemented as the display area AA.

According to the present embodiment, in each of the plurality of display modules DM1 to DM4, a second interval D2 between a center portion CP of an outermost pixel Po and an outermost outer surface VL of the first substrate 100 can be implemented to be half or less of a first interval D1 between adjacent pixels. Accordingly, in two adjacent display modules connected to (or contacting) each other at side surfaces thereof in the first direction X and the second direction Y on the basis of a lateral coupling manner, an interval "D2+D2" between adjacent outermost pixel areas PAo can be equal to or less than the first interval D1 between two adjacent pixels.

Referring to FIG. 21, in first and third display modules DM1 and DM3 connected to (or contacting) each other at side surfaces thereof in the second direction Y, the interval "D2+D2" between a center portion CP of an outermost pixel Po of the first display module DM1 and a center portion CP of an outermost pixel Po of the third display module DM3 can be equal to or less than the first interval D1 between two adjacent pixels disposed in each of the first and third display modules DM1 and DM3.

Therefore, the interval "D2+D2" between center portions CP of outermost pixels Po of two adjacent display modules connected to (or contacting) each other at side surfaces thereof in the first direction X and the second direction Y can be equal to or less than the first interval D1 between two adjacent pixels disposed in each of the display modules DM1 to DM4, and thus, there can be no seam or boundary portion between two adjacent display modules, whereby there can be no dark area caused by a boundary portion provided between the display modules DM1 to DM4. As a result, in a case where the display area AA of each of the plurality of display modules DM1 to DM4 is one screen and displays one image, a multi-screen display apparatus according to the present disclosure can display an image which is not disconnected and is continuous at a boundary portion between the plurality of display modules DM1 to DM4.

In FIGS. 20 and 21, it is illustrated that the plurality of display modules DM1 to DM4 are tiled in a 2×2 form, but the present disclosure is not limited thereto and the plurality of display modules DM1 to DM4 can be tiled in an x×1 form, a 1×y form, or an x×y form. Here, x can be a natural number which is 2 or more, and y can be a natural number which is 2 or more.

As described above, in a case where the display area AA of each of the plurality of display modules DM1 to DM4 is one screen and displays one image, a multi-screen display apparatus according to the present disclosure can display an image which is not disconnected and is continuous at a boundary portion between the plurality of display modules DM1 to DM4, and thus, the immersion of a viewer watching an image displayed by the multi-screen display apparatus can be enhanced.

A light emitting display apparatus and a multi-screen display apparatus including the same according to the present disclosure will be described below.

A light emitting display apparatus according to some embodiments of the present disclosure can include a substrate including a display portion, a plurality of pixels disposed in the display portion, a common electrode disposed in the display portion and electrically connected to each of the plurality of pixels, a pixel common voltage line disposed in the display portion and electrically connected to the common electrode, a pad part disposed at one edge portion of the substrate, the pad part including a pixel common voltage pad connected to the pixel common voltage line, and at least one closed loop line disposed at an edge portion of the substrate to surround the display portion, wherein the at least one closed loop line can be electrically connected to the pixel common voltage pad.

According to some embodiments of the present disclosure, the pad part can further include a pad connection line electrically connected between the pixel common voltage pad and the pixel common voltage line, and the at least one closed loop line can be disposed to intersect with the pad connection line at the pad part and can be electrically connected to the pad connection line.

According to some embodiments of the present disclosure, the light emitting display apparatus can further include a conductive metal line disposed under the at least one closed loop line and electrically connected to the pad connection line, wherein the at least one closed loop line can be electrically connected to the pad connection line through the conductive metal line.

According to some embodiments of the present disclosure, the light emitting display apparatus can further include a middle insulation layer disposed between the at least one closed loop line and the pad connection line, wherein the middle insulation layer can include a via hole disposed at an intersection portion between the at least one closed loop line and the pad connection line, and the at least one closed loop line can be electrically connected to the pad connection line through the via hole.

According to some embodiments of the present disclosure, the light emitting display apparatus can further include a conductive metal line electrically connected between the at least one closed loop line and the pad connection line within the via hole.

According to some embodiments of the present disclosure, the middle insulation layer can include a buffer layer disposed on the pad connection line and a passivation layer disposed on the buffer layer, the via hole can include a first via hole passing through the buffer layer disposed on the pad connection line and a second via hole passing through the passivation layer disposed on the first via hole, the conductive metal line can be disposed in the first via hole and electrically connected to the pad connection line, and the at least one closed loop line can be electrically connected to the conductive metal line through the second via hole.

According to some embodiments of the present disclosure, one side of the pixel common voltage line can be electrically connected to the pixel common voltage pad, the other side of the pixel common voltage line can be disposed at the one edge portion, which is parallel to the other edge portion, of the substrate with the display portion therebetween, and the at least one closed loop line can be electrically connected to the other side of the pixel common voltage line at the other edge portion of the substrate.

According to some embodiments of the present disclosure, the light emitting display apparatus can further includes a dam pattern disposed at the edge portion of the substrate to surround the display portion and at least one cliff pattern portion disposed near the dam pattern, wherein the at least one closed loop line can be disposed in the at least one cliff pattern portion.

According to some embodiments of the present disclosure, the light emitting display apparatus can further include a light emitting device layer including a self-light emitting device, disposed on the display portion and the dam pattern, and the common electrode disposed on the self-light emitting device, wherein each of the self-light emitting device and the common electrode can be isolated by the at least one cliff pattern portion.

According to some embodiments of the present disclosure, the at least one cliff pattern portion can include a tapered structure implemented by patterning a passivation layer disposed near the dam pattern and an eaves structure covering the at least one closed loop line disposed on the tapered structure, wherein the at least one closed loop line can pass through the tapered structure and can be electrically connected to the pad connection line.

According to some embodiments of the present disclosure, the light emitting display apparatus can further includes a bank defining an opening portion of each of the plurality of pixels and covering the at least one closed loop line disposed on the tapered structure of the at least one cliff pattern portion, wherein the eaves structure can include the same material as a material of the bank.

According to some embodiments of the present disclosure, the at least one cliff pattern portion can include an undercut structure disposed between the tapered structure and the bank, and the at least one closed loop line can pass through the tapered structure and can be electrically connected to the pad connection line.

According to some embodiments of the present disclosure, the light emitting display apparatus can further include a buffer layer disposed between the tapered structure and the pad connection line and a via hole passing through the buffer layer and the passivation layer of the tapered structure, wherein the at least one closed loop line can be electrically connected to the pad connection line through the via hole.

According to some embodiments of the present disclosure, the light emitting display apparatus can further includes a conductive metal line disposed between the at least one closed loop line and the pad connection line within the via hole.

According to some embodiments of the present disclosure, the via hole can include a first via hole passing through the buffer layer disposed on the pad connection line and a second via hole passing through the passivation layer disposed on the first via hole, the conductive metal line can be disposed in the first via hole and can be electrically connected to the pad connection line, and the at least one closed loop line can be electrically connected to the conductive metal line through the second via hole.

According to some embodiments of the present disclosure, the conductive metal line can have one of a dot shape corresponding to an intersection portion between the at least one closed loop line and the pad connection line, a dotted-line shape intersecting with the pad connection line, and a closed loop shape which is the same as the at least one closed loop line.

According to some embodiments of the present disclosure, the light emitting display apparatus can further include a rear substrate coupled to the substrate and a routing portion including a routing line disposed on an outer surface of the substrate and an outer surface of the rear substrate and electrically connected to the pad part.

According to some embodiments of the present disclosure, the light emitting display apparatus can further include a driving circuit unit disposed on the rear substrate, wherein the pad part disposed on the substrate can be a first pad part, and the rear substrate can include a second pad part electrically connected to the routing line of the routing portion to overlap the first pad part and a third pad part electrically connected to the second pad part and connected to the driving circuit unit.

According to some embodiments of the present disclosure, a side surface of the display portion can be aligned on an outer surface of the substrate, or a size of the display portion can be the same as a size of the substrate.

According to some embodiments of the present disclosure, an outermost pixel of the plurality of pixels can include the at least one closed loop line and the pad part, or the plurality of pixels can be arranged on the substrate to have a pixel pitch in a first direction and a second direction transverse to the first direction, and an interval between a center portion of the outermost pixel and the outer surface of the substrate can be equal to or less than half of the pixel pitch.

A multi-screen display apparatus according to some embodiments of the present disclosure can include a plurality of display modules arranged in at least one direction of a first direction and a second direction transverse to the first direction, wherein each of the plurality of display modules can include a substrate including a display portion, a plurality of pixels disposed in the display portion, a common electrode disposed in the display portion and electrically connected to each of the plurality of pixels, a pixel common voltage line disposed in the display portion and electrically connected to the common electrode, a pad part disposed at one edge portion of the substrate, the pad part including a pixel common voltage pad connected to the pixel common voltage line, and at least one closed loop line disposed at an edge portion of the substrate to surround the display portion, wherein the at least one closed loop line can be electrically connected to the pixel common voltage pad.

According to some embodiments of the present disclosure, a side surface of each display portion can be aligned on an outer surface of the substrate, or a size of each display portion can be the same as a size of the substrate.

According to some embodiments of the present disclosure, an outermost pixel of the plurality of pixels of each display portion can include the at least one closed loop line and the pad part, or the plurality of pixels of each display portion can be arranged on the substrate to have a pixel pitch in a first direction and a second direction transverse to the first direction, and an interval between a center portion of the outermost pixel of the plurality of pixels of each display portion and the outer surface of the substrate can be equal to or less than half of the pixel pitch.

The light emitting display apparatus according to the present disclosure can be applied to all electronic devices including a light emitting display panel. For example, the light emitting display apparatus according to the present disclosure can be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation devices, automotive navigation devices, automotive display devices, TVs, wall paper display devices, signage devices, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
   a substrate including a display portion;
   a plurality of pixels disposed in the display portion;
   a common electrode disposed in the display portion and electrically connected to each of the plurality of pixels;
   a pixel common voltage line disposed in the display portion and electrically connected to the common electrode;
   a pad part disposed at one edge portion of the substrate, the pad part including a pixel common voltage pad connected to the pixel common voltage line;
   at least one cliff pattern portion disposed at an edge portion of the substrate to surround the display portion;
   a dam pattern disposed near the at least one cliff pattern portion;
   at least one closed loop line disposed within the at least one cliff pattern portion; and
   a light emitting device layer including a self-light emitting device commonly disposed over the display portion and the at least one cliff pattern portion,
   wherein the common electrode is disposed on the self-light emitting device,
   wherein the at least one closed loop line is disposed to intersect with the pixel common voltage pad at the pad part and is electrically connected to the pixel common voltage pad,
   wherein the at least one cliff pattern portion includes an undercut structure, and
   wherein each of the self-light emitting device and the common electrode disposed at an edge portion of the substrate is isolated by the undercut structure of the at least one cliff pattern portion.

2. The light emitting display apparatus of claim 1, wherein:
   one side of the pixel common voltage line is electrically connected to the pixel common voltage pad,
   the other side of the pixel common voltage line is disposed at the other edge portion, which is parallel to the one edge portion, of the substrate with the display portion therebetween, and
   the at least one closed loop line is electrically connected to the other side of the pixel common voltage line at the other edge portion of the substrate.

3. The light emitting display apparatus of claim 1,
   wherein the pad part further comprises a pad connection line electrically connected between the pixel common voltage pad and the pixel common voltage line, and
   wherein the at least one closed loop line is disposed to intersect with the pad connection line at the pad part and is electrically connected to the pad connection line.

4. The light emitting display apparatus of claim 3, further comprising a conductive metal line disposed under the at least one closed loop line and electrically connected to the pad connection line,
   wherein the at least one closed loop line is electrically connected to the pad connection line through the conductive metal line.

5. The light emitting display apparatus of claim 3, further comprising a middle insulation layer disposed between the at least one closed loop line and the pad connection line,
   wherein the middle insulation layer comprises a via hole disposed at an intersection portion between the at least one closed loop line and the pad connection line, and
   wherein the at least one closed loop line is electrically connected to the pad connection line through the via hole.

6. The light emitting display apparatus of claim 5, further comprising a conductive metal line electrically connected between the at least one closed loop line and the pad connection line, within the via hole.

7. The light emitting display apparatus of claim 6, wherein:
the middle insulation layer comprises a buffer layer disposed on the pad connection line and a passivation layer disposed on the buffer layer,
the via hole comprises a first via hole passing through the buffer layer disposed on the pad connection line and a second via hole passing through the passivation layer disposed on the first via hole,
the conductive metal line is disposed in the first via hole and electrically connected to the pad connection line, and
the at least one closed loop line is electrically connected to the conductive metal line through the second via hole.

8. The light emitting display apparatus of claim 3, wherein the dam pattern is disposed at the edge portion of the substrate to surround the display portion, and
wherein the at least one cliff pattern portion is disposed near the dam pattern.

9. The light emitting display apparatus of claim 8, wherein:
the self-light emitting device is further disposed over the dam pattern;
the common electrode is disposed on the self-light emitting device,
each of the self-light emitting device and the common electrode disposed at the edge portion of the substrate is isolated by the undercut structure of the at least one cliff pattern portion.

10. The light emitting display apparatus of claim 9, wherein the at least one cliff pattern portion comprises:
a tapered structure implemented by patterning a passivation layer disposed near the dam pattern; and
an eaves structure covering the at least one closed loop line disposed on the tapered structure,
wherein the at least one closed loop line passes through the tapered structure and is electrically connected to the pad connection line.

11. The light emitting display apparatus of claim 10, further comprising a bank defining an opening portion of each of the plurality of pixels,
wherein the eaves structure comprises a same material as a material of the bank.

12. The light emitting display apparatus of claim 11, wherein the undercut structure is disposed between the tapered structure and the eaves structure, and
wherein the at least one closed loop line passes through the tapered structure and is electrically connected to the pad connection line.

13. The light emitting display apparatus of claim 12, further comprising:
a buffer layer disposed between the tapered structure and the pad connection line; and
a via hole passing through the buffer layer and the passivation layer of the tapered structure,
wherein the at least one closed loop line is electrically connected to the pad connection line through the via hole.

14. The light emitting display apparatus of claim 13, further comprising a conductive metal line disposed between the at least one closed loop line and the pad connection line, within the via hole.

15. The light emitting display apparatus of claim 14, wherein:
the via hole comprises a first via hole passing through the buffer layer disposed on the pad connection line and a second via hole passing through the passivation layer disposed on the first via hole,
the conductive metal line is disposed in the first via hole and is electrically connected to the pad connection line, and
the at least one closed loop line is electrically connected to the conductive metal line through the second via hole.

16. The light emitting display apparatus of claim 14, wherein the conductive metal line has one of:
a dot shape corresponding to an intersection portion between the at least one closed loop line and the pad connection line,
a dotted-line shape intersecting with the pad connection line, and
a closed loop shape which is a same as the at least one closed loop line.

17. The light emitting display apparatus of claim 1, further comprising:
a rear substrate coupled to the substrate; and
a routing portion including a routing line disposed on an outer surface of the substrate and an outer surface of the rear substrate and electrically connected to the pad part.

18. The light emitting display apparatus of claim 17, further comprising a driving circuit unit disposed on the rear substrate,
wherein the pad part disposed on the substrate is a first pad part, and
wherein the rear substrate comprises:
a second pad part electrically connected to the routing line of the routing portion to overlap the first pad part; and
a third pad part electrically connected to the second pad part and connected to the driving circuit unit.

19. The light emitting display apparatus of claim 1, wherein a side surface of the display portion is aligned on an outer surface of the substrate, or
wherein a size of the display portion is a same as a size of the substrate.

20. The light emitting display apparatus of claim 1, wherein an outermost pixel of the plurality of pixels comprises the at least one closed loop line and the pad part, or
wherein the plurality of pixels are arranged on the substrate to have a pixel pitch in a first direction and a second direction transverse to the first direction, and an interval between a center portion of the outermost pixel and the outer surface of the substrate is equal to or less than half of the pixel pitch.

21. A multi-screen display apparatus comprising:
a plurality of display modules arranged in at least one direction of a first direction and a second direction transverse to the first direction,
wherein each of the plurality of display modules comprises the light emitting display apparatus of claim 1.

22. The multi-screen display apparatus of claim 21, wherein a side surface of the display portion is aligned on an outer surface of the substrate, or a size of the display portion is a same as a size of the substrate.

23. The multi-screen display apparatus of claim 22, wherein an outermost pixel of the plurality of pixels comprises the at least one closed loop line and the pad part, or
the plurality of pixels are arranged on the substrate to have a pixel pitch in a first direction and a second direction intersecting with the first direction, and an interval between a center portion of the outermost pixel and the outer surface of the substrate is equal to or less than half of the pixel pitch.

\* \* \* \* \*